US011756611B2

(12) United States Patent
Hara et al.

(10) Patent No.: US 11,756,611 B2
(45) Date of Patent: Sep. 12, 2023

(54) MEMORY SYSTEM

(71) Applicant: Kioxia Corporation, Tokyo (JP)

(72) Inventors: Tokumasa Hara, Kawasaki (JP); Noboru Shibata, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/582,330

(22) Filed: Jan. 24, 2022

(65) Prior Publication Data

US 2022/0148651 A1 May 12, 2022

Related U.S. Application Data

(63) Continuation of application No. 17/014,293, filed on Sep. 8, 2020, now Pat. No. 11,264,090.

(30) Foreign Application Priority Data

Sep. 12, 2019 (JP) ................................ 2019-166519
Jun. 17, 2020 (JP) ................................ 2020-104833

(51) Int. Cl.
*G11C 11/00* (2006.01)
*G11C 11/56* (2006.01)
(Continued)

(52) U.S. Cl.
CPC ............ *G11C 11/56* (2013.01); *G06F 3/0604* (2013.01); *G06F 3/0655* (2013.01);
(Continued)

(58) Field of Classification Search
CPC ......... G11C 11/56; G11C 16/04; G11C 16/34; G11C 16/10; G11C 16/14; G11C 16/26;
(Continued)

(56) References Cited

U.S. PATENT DOCUMENTS 7,813,170 B2 10/2010 Shibata
8,077,514 B2 12/2011 Shibata
(Continued)

FOREIGN PATENT DOCUMENTS

JP 2007-157315 A 6/2007
JP 4679490 B2 4/2011
(Continued)

*Primary Examiner* — Thong Q Le
(74) *Attorney, Agent, or Firm* — Oblon, McClelland, Maier & Neustadt, L.L.P.

(57) ABSTRACT

A memory system has a nonvolatile memory which comprises memory cells capable of storing 4-bit data of first to fourth bits by sixteen threshold regions including a first threshold region corresponding to an erased state and second to sixteenth threshold regions having higher voltage levels than a voltage level of the first threshold region corresponding to a written state; and a controller which causes the nonvolatile memory to execute a first program for writing data of the first bit and the second bit and then causes the nonvolatile memory to execute a second program for writing data of the third bit and the fourth bit. The controller controls such that the threshold region is any threshold region of a seventeenth threshold region corresponding to an erased state and eighteenth to twentieth threshold regions having higher voltage levels than that of the seventeenth threshold region corresponding to a written state.

14 Claims, 138 Drawing Sheets

(51) Int. Cl.

| | |
|---|---|
| ***G06F 3/06*** | (2006.01) |
| ***G11C 16/10*** | (2006.01) |
| ***G11C 16/14*** | (2006.01) |
| ***G11C 16/26*** | (2006.01) |
| *G11C 16/04* | (2006.01) |
| *H10B 69/00* | (2023.01) |

(52) U.S. Cl.
CPC ............ *G06F 3/0679* (2013.01); *G11C 16/10* (2013.01); *G11C 16/14* (2013.01); *G11C 16/26* (2013.01); *G11C 16/0483* (2013.01); *H10B 69/00* (2023.02)

(58) Field of Classification Search
CPC ......... G11C 16/08; G11C 16/32; G11C 29/00; G11C 7/10; G11C 7/22; G11C 16/0483; G11C 11/5628; G11C 11/5642; G11C 11/5635; G11C 2211/5621; G11C 16/3404; G06F 11/10; G06F 3/06; G06F 13/16; G06F 13/42; G06F 3/0679; G06F 11/1068; G06F 3/0619; G06F 3/0659; G06F 3/0604; G06F 3/0655; G06F 13/1673; G06F 3/0656; H03M 13/29
See application file for complete search history.

(56) References Cited

U.S. PATENT DOCUMENTS

| | | | | |
|---|---|---|---|---|
| 9,830,983 | B1 | 11/2017 | Hara et al. | |
| 10,255,971 | B2 | 4/2019 | Hara et al. | |
| 10,360,974 | B2 * | 7/2019 | Kondo ............... | G11C 16/0483 |
| 2010/0322011 | A1 | 12/2010 | Edahiro | |
| 2018/0075902 | A1 | 3/2018 | Shirakawa et al. | |
| 2019/0227751 | A1 | 7/2019 | Khakifirooz et al. | |

FOREIGN PATENT DOCUMENTS

| | | | |
|---|---|---|---|
| JP | 2015-195071 | A | 11/2015 |
| JP | 2018-5959 | A | 1/2018 |
| JP | 6262063 | B2 | 1/2018 |
| JP | 2018-45754 | A | 3/2018 |
| JP | 6293964 | B1 | 3/2018 |

* cited by examiner

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 0 | 0 | 1 | 1 | 1 | 1 | 1 | 0 | 0 | 0 | 1 | 1 | 0 |
| Upper | 1 | 1 | 1 | 0 | 0 | 0 | 0 | 1 | 1 | 0 | 0 | 1 | 1 | 1 | 0 | 0 |
| Middle | 1 | 1 | 0 | 0 | 1 | 1 | 0 | 0 | 0 | 0 | 0 | 0 | 1 | 1 | 1 | 1 |
| Lower | 1 | 1 | 1 | 1 | 1 | 1 | 1 | 1 | 0 | 0 | 0 | 0 | 0 | 0 | 0 | 0 |

FIG. 6

1-4-5-5 CODING, TWO STAGES, PAGE BY PAGE

| WL NUMBER | String0 | | String1 | | String2 | | String3 | |
|---|---|---|---|---|---|---|---|---|
| | 1st | 2nd | 1st | 2nd | 1st | 2nd | 1st | 2nd |
| 0 | $ST_2 1$ | $ST_2 6$ | $ST_2 2$ | $ST_2 8$ | $ST_2 3$ | $ST_2 10$ | $ST_2 4$ | $ST_2 12$ |
| 1 | $ST_2 5$ | $ST_2 14$ | $ST_2 7$ | $ST_2 16$ | $ST_2 9$ | $ST_2 18$ | $ST_2 11$ | $ST_2 20$ |
| 2 | $ST_2 13$ | $ST_2 22$ | $ST_2 15$ | $ST_2 24$ | $ST_2 17$ | $ST_2 26$ | $ST_2 19$ | $ST_2 28$ |
| 3 | $ST_2 21$ | $ST_2 30$ | $ST_2 23$ | $ST_2 32$ | $ST_2 25$ | $ST_2 34$ | $ST_2 27$ | $ST_2 36$ |
| 4 | | | | | | | | |

FIG. 8B

| Read | Data | | | | | | | | | | | | |
|---|---|---|---|---|---|---|---|---|---|---|---|---|---|
| 1st | ○ | ○ | ○ | ○ | × | ○ | ○ | ~ | ○ | ○ | × | ○ | ○ |
| 2nd | ○ | × | ○ | ○ | ○ | × | ○ | ~ | ○ | × | ○ | ○ | ○ |
| 3rd | ○ | ○ | ○ | ○ | ○ | × | ○ | ~ | ○ | ○ | ○ | × | ○ |
| Majority Decision | ○ | ○ | ○ | ○ | ○ | × | ○ | ~ | ○ | ○ | ○ | ○ | ○ |

FIG.12

1-4-5-5 CODING, TWO STAGES, PAGE BY PAGE 3-2-5-5 CODING, TWO STAGES, PAGE BY PAGE

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 1 | 1 | 1 | 1 | 0 | 0 | 0 | 0 | 1 | 1 | 1 | 0 | 0 |
| Upper | 1 | 1 | 0 | 0 | 0 | 1 | 1 | 1 | 1 | 0 | 0 | 0 | 0 | 1 | 1 | 0 |
| Middle | 1 | 1 | 1 | 1 | 0 | 0 | 0 | 0 | 0 | 0 | 0 | 0 | 1 | 1 | 1 | 1 |
| Lower | 1 | 1 | 1 | 1 | 1 | 1 | 0 | 0 | 1 | 1 | 0 | 0 | 0 | 0 | 0 | 0 |

FIG. 19C 3-4-4-4 CODING, TWO STAGES, PAGE BY PAGE

| | | | | | | | | | | | | | | | | | |
|---|---|---|---|---|---|---|---|---|---|---|---|---|---|---|---|---|---|
| SECOND STAGE | T | 1 | 1 | 0 | 0 | 0 | 1 | 1 | 0 | 0 | 0 | 0 | 0 | 1 | 1 | 1 | 1 |
| | U | 1 | 0 | 0 | 1 | 1 | 1 | 1 | 1 | 1 | 0 | 0 | 0 | 0 | 0 | 0 | 1 |
| FIRST STAGE | M | 1 | 1 | 1 | 1 | 0 | 0 | 0 | 0 | 1 | 1 | 0 | 0 | 0 | 0 | 1 | 1 |
| | L | 1 | 1 | 1 | 1 | 1 | 1 | 0 | 0 | 0 | 0 | 0 | 1 | 1 | 0 | 0 | 0 |

FIG.20B 3-4-4-4 CODING, TWO STAGES, PAGE BY PAGE

| | | | | | | | | | | | | | | | | | |
|---|---|---|---|---|---|---|---|---|---|---|---|---|---|---|---|---|---|
| SECOND STAGE | T | 1 | 0 | 0 | 0 | 0 | 1 | 1 | 1 | 1 | 1 | 1 | 0 | 0 | 0 | 0 | 1 |
| | U | 1 | 1 | 1 | 0 | 0 | 0 | 0 | 0 | 0 | 1 | 1 | 1 | 0 | 0 | 1 | 1 |
| FIRST STAGE | M | 1 | 1 | 0 | 0 | 1 | 1 | 1 | 0 | 0 | 0 | 0 | 0 | 0 | 1 | 1 | 1 |
| | L | 1 | 1 | 1 | 1 | 1 | 1 | 0 | 0 | 1 | 1 | 0 | 0 | 0 | 0 | 0 | 0 |

FIG.21B 3-4-4-4 CODING, TWO STAGES, PAGE BY PAGE

| | | | | | | | | | | | | | | | | | |
|---|---|---|---|---|---|---|---|---|---|---|---|---|---|---|---|---|---|
| SECOND STAGE | T | 1 | 1 | 1 | 1 | 1 | 0 | 0 | 0 | 0 | 1 | 1 | 0 | 0 | 0 | 0 | 1 |
| | U | 1 | 1 | 1 | 0 | 0 | 0 | 1 | 1 | 0 | 0 | 0 | 0 | 0 | 1 | 1 | 1 |
| FIRST STAGE | M | 1 | 0 | 0 | 0 | 0 | 0 | 0 | 1 | 1 | 1 | 1 | 1 | 0 | 0 | 1 | 1 |
| | L | 1 | 1 | 0 | 0 | 1 | 1 | 1 | 1 | 1 | 1 | 0 | 0 | 0 | 0 | 0 | 0 |

FIG.22B 3-4-4-4 CODING, TWO STAGES, PAGE BY PAGE

| | | | | | | | | | | | | | | | | | |
|---|---|---|---|---|---|---|---|---|---|---|---|---|---|---|---|---|---|
| SECOND STAGE | T | 1 | 1 | 1 | 1 | 1 | 0 | 0 | 0 | 0 | 0 | 1 | 1 | 0 | 0 | 0 | 1 |
| | U | 1 | 1 | 1 | 0 | 0 | 0 | 0 | 1 | 1 | 0 | 0 | 0 | 0 | 1 | 1 | 1 |
| FIRST STAGE | M | 1 | 0 | 0 | 0 | 1 | 1 | 0 | 0 | 0 | 0 | 0 | 1 | 1 | 1 | 1 | 1 |
| | L | 1 | 1 | 0 | 0 | 0 | 0 | 0 | 0 | 1 | 1 | 1 | 1 | 1 | 1 | 0 | 0 |

FIG.23B 3-4-4-4 CODING, TWO STAGES, PAGE BY PAGE

| | | | | | | | | | | | | | | | | | |
|---|---|---|---|---|---|---|---|---|---|---|---|---|---|---|---|---|---|
| SECOND STAGE | T | 1 | 1 | 1 | 1 | 0 | 0 | 1 | 1 | 0 | 0 | 0 | 0 | 0 | 0 | 1 | 1 |
| | U | 1 | 1 | 1 | 0 | 0 | 0 | 0 | 0 | 0 | 1 | 1 | 1 | 1 | 0 | 0 | 1 |
| FIRST STAGE | M | 1 | 0 | 0 | 0 | 0 | 0 | 0 | 1 | 1 | 1 | 0 | 0 | 1 | 1 | 1 | 1 |
| | L | 1 | 1 | 0 | 0 | 0 | 1 | 1 | 1 | 1 | 1 | 1 | 0 | 0 | 0 | 0 | 0 |

FIG.24B 3-4-4-4 CODING, TWO STAGES, PAGE BY PAGE

| | | | | | | | | | | | | | | | | | |
|---|---|---|---|---|---|---|---|---|---|---|---|---|---|---|---|---|---|
| SECOND STAGE | T | 1 | 1 | 1 | 1 | 0 | 0 | 0 | 0 | 0 | 0 | 1 | 1 | 1 | 0 | 0 | 1 |
| | U | 1 | 1 | 1 | 0 | 0 | 1 | 1 | 1 | 0 | 0 | 0 | 0 | 0 | 0 | 1 | 1 |
| FIRST STAGE | M | 1 | 0 | 0 | 0 | 0 | 0 | 0 | 1 | 1 | 0 | 0 | 1 | 1 | 1 | 1 | 1 |
| | L | 1 | 1 | 0 | 0 | 0 | 0 | 1 | 1 | 1 | 1 | 1 | 1 | 0 | 0 | 0 | 0 |

FIG.25B 3-4-4-4 CODING, TWO STAGES, PAGE BY PAGE

| | | | | | | | | | | | | | | | | | |
|---|---|---|---|---|---|---|---|---|---|---|---|---|---|---|---|---|---|
| SECOND STAGE | T | 1 | 1 | 1 | 1 | 0 | 0 | 0 | 0 | 0 | 0 | 1 | 1 | 0 | 0 | 1 | 1 |
| | U | 1 | 1 | 1 | 0 | 0 | 1 | 1 | 1 | 1 | 0 | 0 | 0 | 0 | 0 | 0 | 1 |
| FIRST STAGE | M | 1 | 0 | 0 | 0 | 0 | 0 | 1 | 1 | 0 | 0 | 0 | 1 | 1 | 1 | 1 | 1 |
| | L | 1 | 1 | 0 | 0 | 0 | 0 | 0 | 1 | 1 | 1 | 1 | 1 | 1 | 0 | 0 | 0 |

FIG.26B 3-4-4-4 CODING, TWO STAGES, PAGE BY PAGE

| | | | | | | | | | | | | | | | | | |
|---|---|---|---|---|---|---|---|---|---|---|---|---|---|---|---|---|---|
| SECOND STAGE | T | 1 | 1 | 1 | 1 | 1 | 0 | 0 | 0 | 1 | 1 | 0 | 0 | 0 | 0 | 0 | 1 |
| | U | 1 | 1 | 0 | 0 | 1 | 1 | 0 | 0 | 0 | 0 | 0 | 0 | 1 | 1 | 1 | 1 |
| FIRST STAGE | M | 1 | 0 | 0 | 0 | 0 | 0 | 0 | 1 | 1 | 1 | 1 | 0 | 0 | 1 | 1 | 1 |
| | L | 1 | 1 | 1 | 0 | 0 | 0 | 0 | 0 | 0 | 1 | 1 | 1 | 1 | 1 | 0 | 0 |

FIG.27B 3-4-4-4 CODING, TWO STAGES, PAGE BY PAGE

| | | | | | | | | | | | | | | | | | |
|---|---|---|---|---|---|---|---|---|---|---|---|---|---|---|---|---|---|
| SECOND STAGE | T | 1 | 1 | 1 | 1 | 0 | 0 | 0 | 0 | 0 | 1 | 1 | 0 | 0 | 0 | 1 | 1 |
| | U | 1 | 0 | 0 | 0 | 0 | 0 | 0 | 1 | 1 | 1 | 1 | 1 | 1 | 0 | 0 | 1 |
| FIRST STAGE | M | 1 | 1 | 0 | 0 | 0 | 0 | 1 | 1 | 0 | 0 | 0 | 0 | 1 | 1 | 1 | 1 |
| | L | 1 | 1 | 1 | 0 | 0 | 1 | 1 | 1 | 1 | 1 | 0 | 0 | 0 | 0 | 0 | 0 |

FIG.28B 3-4-4-4 CODING, TWO STAGES, PAGE BY PAGE

| | | | | | | | | | | | | | | | | | |
|---|---|---|---|---|---|---|---|---|---|---|---|---|---|---|---|---|---|
| SECOND STAGE | T | 1 | 1 | 1 | 1 | 1 | 0 | 0 | 0 | 0 | 0 | 0 | 1 | 1 | 0 | 0 | 1 |
| | U | 1 | 0 | 0 | 1 | 1 | 1 | 1 | 1 | 0 | 0 | 0 | 0 | 0 | 0 | 1 | 1 |
| FIRST STAGE | M | 1 | 1 | 0 | 0 | 0 | 0 | 0 | 1 | 1 | 0 | 0 | 0 | 1 | 1 | 1 | 1 |
| | L | 1 | 1 | 1 | 1 | 0 | 0 | 1 | 1 | 1 | 1 | 0 | 0 | 0 | 0 | 0 | 0 |

FIG.29B 3-4-4-4 CODING, TWO STAGES, PAGE BY PAGE

| | | | | | | | | | | | | | | | | | |
|---|---|---|---|---|---|---|---|---|---|---|---|---|---|---|---|---|---|
| SECOND STAGE | T | 1 | 1 | 1 | 1 | 0 | 0 | 0 | 0 | 1 | 1 | 0 | 0 | 0 | 0 | 1 | 1 |
| | U | 1 | 1 | 0 | 0 | 0 | 1 | 1 | 0 | 0 | 0 | 0 | 0 | 1 | 1 | 1 | 1 |
| FIRST STAGE | M | 1 | 0 | 0 | 1 | 1 | 1 | 1 | 1 | 1 | 0 | 0 | 0 | 0 | 0 | 0 | 1 |
| | L | 1 | 1 | 1 | 1 | 1 | 1 | 0 | 0 | 0 | 0 | 0 | 1 | 1 | 0 | 0 | 0 |

FIG.30B 3-4-4-4 CODING, TWO STAGES, PAGE BY PAGE

| | | | | | | | | | | | | | | | | | |
|---|---|---|---|---|---|---|---|---|---|---|---|---|---|---|---|---|---|
| SECOND STAGE | T | 1 | 1 | 1 | 0 | 0 | 1 | 1 | 0 | 0 | 0 | 0 | 0 | 0 | 1 | 1 | 1 |
| | U | 1 | 1 | 0 | 0 | 0 | 0 | 0 | 0 | 1 | 1 | 1 | 1 | 0 | 0 | 1 | 1 |
| FIRST STAGE | M | 1 | 0 | 0 | 0 | 1 | 1 | 1 | 1 | 1 | 1 | 0 | 0 | 0 | 0 | 0 | 1 |
| | L | 1 | 1 | 1 | 1 | 1 | 1 | 0 | 0 | 0 | 1 | 1 | 0 | 0 | 0 | 0 | 0 |

FIG.31B 3-4-4-4 CODING, TWO STAGES, PAGE BY PAGE

| | | | | | | | | | | | | | | | | | |
|---|---|---|---|---|---|---|---|---|---|---|---|---|---|---|---|---|---|
| SECOND STAGE | T | 1 | 1 | 1 | 0 | 0 | 0 | 0 | 0 | 0 | 1 | 1 | 0 | 0 | 1 | 1 | 1 |
| | U | 1 | 1 | 0 | 0 | 1 | 1 | 1 | 1 | 0 | 0 | 0 | 0 | 0 | 0 | 1 | 1 |
| FIRST STAGE | M | 1 | 0 | 0 | 0 | 0 | 0 | 1 | 1 | 1 | 1 | 1 | 1 | 0 | 0 | 0 | 1 |
| | L | 1 | 1 | 1 | 1 | 1 | 0 | 0 | 1 | 1 | 1 | 0 | 0 | 0 | 0 | 0 | 0 |

FIG.32B 3-4-4-4 CODING, TWO STAGES, PAGE BY PAGE

| | | | | | | | | | | | | | | | | | |
|---|---|---|---|---|---|---|---|---|---|---|---|---|---|---|---|---|---|
| SECOND STAGE | T | 1 | 1 | 1 | 0 | 0 | 0 | 0 | 0 | 1 | 1 | 0 | 0 | 0 | 1 | 1 | 1 |
| | U | 1 | 0 | 0 | 0 | 0 | 1 | 1 | 0 | 0 | 0 | 0 | 1 | 1 | 1 | 1 | 1 |
| FIRST STAGE | M | 1 | 1 | 0 | 0 | 1 | 1 | 1 | 1 | 1 | 0 | 0 | 0 | 0 | 0 | 0 | 1 |
| | L | 1 | 1 | 1 | 1 | 1 | 1 | 0 | 0 | 0 | 0 | 0 | 0 | 1 | 1 | 0 | 0 |

FIG.33B 3-4-4-4 CODING, TWO STAGES, PAGE BY PAGE

| | | | | | | | | | | | | | | | | | |
|---|---|---|---|---|---|---|---|---|---|---|---|---|---|---|---|---|---|
| SECOND STAGE | T | 1 | 1 | 1 | 0 | 0 | 0 | 0 | 0 | 0 | 1 | 1 | 1 | 0 | 0 | 1 | 1 |
| | U | 1 | 1 | 0 | 0 | 1 | 1 | 1 | 0 | 0 | 0 | 0 | 0 | 0 | 1 | 1 | 1 |
| FIRST STAGE | M | 1 | 0 | 0 | 0 | 0 | 1 | 1 | 1 | 1 | 1 | 1 | 0 | 0 | 0 | 0 | 1 |
| | L | 1 | 1 | 1 | 1 | 1 | 1 | 0 | 0 | 1 | 1 | 0 | 0 | 0 | 0 | 0 | 0 |

FIG.34B 3-4-4-4 CODING, TWO STAGES, PAGE BY PAGE

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 0 | 0 | 0 | 0 | 0 | 0 | 1 | 1 | 1 | 1 |
| | U | 1 | 1 | 0 | 0 | 0 | 0 | 0 | 0 | 1 | 1 | 1 | 0 | 0 | 1 | 1 | 1 |
| FIRST STAGE | M | 1 | 1 | 1 | 1 | 1 | 0 | 0 | 1 | 1 | 0 | 0 | 0 | 0 | 0 | 0 | 1 |
| | L | 1 | 1 | 1 | 1 | 0 | 0 | 0 | 0 | 0 | 0 | 1 | 1 | 1 | 1 | 0 | 0 |

FIG.35B 3-4-4-4 CODING, TWO STAGES, PAGE BY PAGE

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 1 | 0 | 0 | 0 | 0 | 0 | 0 | 1 | 1 | 1 |
| | U | 1 | 1 | 0 | 0 | 0 | 0 | 0 | 0 | 1 | 1 | 0 | 0 | 1 | 1 | 1 | 1 |
| FIRST STAGE | M | 1 | 1 | 1 | 1 | 0 | 0 | 1 | 1 | 1 | 0 | 0 | 0 | 0 | 0 | 0 | 1 |
| | L | 1 | 1 | 1 | 1 | 1 | 0 | 0 | 0 | 0 | 0 | 0 | 1 | 1 | 1 | 0 | 0 |

FIG.36B 3-4-4-4 CODING, TWO STAGES, PAGE BY PAGE

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 0 | 0 | 0 | 0 | 0 | 0 | 1 | 1 | 1 | 1 | 1 |
| | U | 1 | 1 | 0 | 0 | 0 | 0 | 0 | 0 | 1 | 1 | 1 | 1 | 1 | 0 | 0 | 1 |
| FIRST STAGE | M | 1 | 1 | 1 | 1 | 0 | 0 | 0 | 1 | 1 | 0 | 0 | 0 | 0 | 0 | 1 | 1 |
| | L | 1 | 1 | 1 | 1 | 1 | 1 | 0 | 0 | 0 | 0 | 1 | 1 | 0 | 0 | 0 | 0 |

FIG.37B

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 1 | 1 | 0 | 0 | 0 | 0 | 0 | 0 | 1 | 1 |
| | U | 1 | 1 | 1 | 1 | 1 | 0 | 0 | 0 | 0 | 0 | 0 | 1 | 1 | 0 | 0 | 1 |
| FIRST STAGE | M | 1 | 1 | 1 | 1 | 0 | 0 | 1 | 1 | 1 | 1 | 0 | 0 | 0 | 0 | 0 | 0 |
| | L | 1 | 1 | 0 | 0 | 0 | 0 | 0 | 1 | 1 | 0 | 0 | 0 | 1 | 1 | 1 | 1 |

FIG.38B 1-4-5-5 CODING

| | | | | | | | | | | | | | | | | | |
|---|---|---|---|---|---|---|---|---|---|---|---|---|---|---|---|---|---|
| SECOND STAGE | T | 1 | 1 | 1 | 0 | 0 | 0 | 0 | 1 | 1 | 1 | 0 | 0 | 0 | 1 | 1 | 0 |
| | U | 1 | 0 | 0 | 0 | 0 | 1 | 1 | 1 | 1 | 0 | 0 | 1 | 1 | 1 | 0 | 0 |
| FIRST STAGE | M | 1 | 1 | 0 | 0 | 1 | 1 | 0 | 0 | 0 | 0 | 0 | 0 | 1 | 1 | 1 | 1 |
| | L | 1 | 1 | 1 | 1 | 1 | 1 | 1 | 1 | 0 | 0 | 0 | 0 | 0 | 0 | 0 | 0 |

FIG.39

1-4-5-5 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 0 | 0 | 0 | 0 | 0 | 1 | 1 | 1 | 1 | 0 |
| | U | 1 | 1 | 0 | 0 | 0 | 1 | 1 | 0 | 0 | 1 | 1 | 1 | 1 | 0 | 0 | 0 |
| FIRST STAGE | M | 1 | 1 | 1 | 1 | 0 | 0 | 0 | 0 | 0 | 0 | 1 | 1 | 0 | 0 | 1 | 1 |
| | L | 1 | 1 | 1 | 1 | 1 | 1 | 1 | 1 | 0 | 0 | 0 | 0 | 0 | 0 | 0 | 0 |

FIG.40

3-2-5-5 CODING

| | | | | | | | | | | | | | | | | | |
|---|---|---|---|---|---|---|---|---|---|---|---|---|---|---|---|---|---|
| SECOND STAGE | T | 1 | 1 | 0 | 0 | 0 | 0 | 0 | 1 | 1 | 1 | 1 | 0 | 0 | 1 | 1 | 0 |
| | U | 1 | 0 | 0 | 1 | 1 | 0 | 0 | 0 | 0 | 1 | 1 | 1 | 1 | 1 | 0 | 0 |
| FIRST STAGE | M | 1 | 1 | 1 | 1 | 0 | 0 | 0 | 0 | 0 | 0 | 0 | 0 | 1 | 1 | 1 | 1 |
| | L | 1 | 1 | 1 | 1 | 1 | 1 | 0 | 0 | 1 | 1 | 0 | 0 | 0 | 0 | 0 | 0 |

FIG.41

3-5-3-4 CODING

| | | | | | | | | | | | | | | | | | |
|---|---|---|---|---|---|---|---|---|---|---|---|---|---|---|---|---|---|
| SECOND STAGE | T | 1 | 0 | 0 | 0 | 1 | 1 | 1 | 1 | 1 | 1 | 0 | 0 | 0 | 0 | 0 | 1 |
| | U | 1 | 1 | 0 | 0 | 0 | 0 | 0 | 1 | 1 | 1 | 1 | 1 | 1 | 0 | 0 | 0 |
| FIRST STAGE | M | 1 | 1 | 1 | 0 | 0 | 1 | 1 | 1 | 0 | 0 | 0 | 0 | 1 | 1 | 0 | 0 |
| | L | 1 | 1 | 1 | 1 | 1 | 1 | 0 | 0 | 0 | 1 | 1 | 0 | 0 | 0 | 0 | 0 |

FIG.42

3-5-3-4 CODING

| | | | | | | | | | | | | | | | | | |
|---|---|---|---|---|---|---|---|---|---|---|---|---|---|---|---|---|---|
| SECOND STAGE | T | 1 | 0 | 0 | 0 | 0 | 0 | 1 | 1 | 1 | 1 | 1 | 1 | 0 | 0 | 0 | 1 |
| | U | 1 | 1 | 1 | 0 | 0 | 0 | 0 | 0 | 0 | 1 | 1 | 1 | 1 | 1 | 0 | 0 |
| FIRST STAGE | M | 1 | 1 | 0 | 0 | 1 | 1 | 1 | 1 | 0 | 0 | 0 | 1 | 1 | 0 | 0 | 0 |
| | L | 1 | 1 | 1 | 1 | 1 | 0 | 0 | 1 | 1 | 1 | 0 | 0 | 0 | 0 | 0 | 0 |

FIG.43

1-2-6-6 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 0 | 0 | 0 | 1 | 1 | 0 | 0 | 0 | 1 | 1 |
| | U | 1 | 1 | 0 | 0 | 0 | 1 | 1 | 0 | 0 | 0 | 1 | 1 | 1 | 0 | 0 | 1 |
| FIRST STAGE | M | 1 | 1 | 1 | 1 | 0 | 0 | 0 | 0 | 0 | 0 | 0 | 0 | 1 | 1 | 1 | 1 |
| | L | 1 | 1 | 1 | 1 | 1 | 1 | 1 | 1 | 0 | 0 | 0 | 0 | 0 | 0 | 0 | 0 |

FIG.44

1-2-6-6 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 0 | 0 | 1 | 1 | 1 | 0 | 0 | 0 | 0 | 1 | 1 |
| | U | 1 | 1 | 0 | 0 | 0 | 0 | 1 | 1 | 1 | 0 | 0 | 1 | 1 | 0 | 0 | 1 |
| FIRST STAGE | M | 1 | 1 | 1 | 1 | 0 | 0 | 0 | 0 | 0 | 0 | 0 | 0 | 1 | 1 | 1 | 1 |
| | L | 1 | 1 | 1 | 1 | 1 | 1 | 1 | 1 | 0 | 0 | 0 | 0 | 0 | 0 | 0 | 0 |

FIG.45

1-2-6-6 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 0 | 0 | 0 | 0 | 1 | 1 | 1 | 0 | 0 | 1 |
| | U | 1 | 1 | 0 | 0 | 0 | 1 | 1 | 0 | 0 | 1 | 1 | 0 | 0 | 0 | 1 | 1 |
| FIRST STAGE | M | 1 | 1 | 1 | 1 | 0 | 0 | 0 | 0 | 0 | 0 | 0 | 0 | 1 | 1 | 1 | 1 |
| | L | 1 | 1 | 1 | 1 | 1 | 1 | 1 | 1 | 0 | 0 | 0 | 0 | 0 | 0 | 0 | 0 |

FIG.46

1-2-4-8 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 0 | 0 | 1 | 1 | 0 | 0 | 1 | 1 | 0 | 0 | 1 |
| | U | 1 | 1 | 0 | 0 | 0 | 0 | 1 | 1 | 1 | 1 | 0 | 0 | 0 | 0 | 1 | 1 |
| FIRST STAGE | M | 1 | 1 | 1 | 1 | 0 | 0 | 0 | 0 | 0 | 0 | 0 | 0 | 1 | 1 | 1 | 1 |
| | L | 1 | 1 | 1 | 1 | 1 | 1 | 1 | 1 | 0 | 0 | 0 | 0 | 0 | 0 | 0 | 0 |

FIG.47

1-2-5-7 CODING

| | | | | | | | | | | | | | | | | | |
|---|---|---|---|---|---|---|---|---|---|---|---|---|---|---|---|---|---|
| SECOND STAGE | T | 1 | 1 | 0 | 0 | 0 | 1 | 1 | 0 | 0 | 1 | 1 | 0 | 0 | 1 | 1 | 0 |
| | U | 1 | 0 | 0 | 1 | 1 | 1 | 0 | 0 | 0 | 0 | 1 | 1 | 1 | 1 | 0 | 0 |
| FIRST STAGE | M | 1 | 1 | 1 | 1 | 0 | 0 | 0 | 0 | 0 | 0 | 0 | 0 | 1 | 1 | 1 | 1 |
| | L | 1 | 1 | 1 | 1 | 1 | 1 | 1 | 1 | 0 | 0 | 0 | 0 | 0 | 0 | 0 | 0 |

FIG.48

1-2-7-5 CODING

| | | | | | | | | | | | | | | | | | |
|---|---|---|---|---|---|---|---|---|---|---|---|---|---|---|---|---|---|
| SECOND STAGE | T | 1 | 1 | 0 | 0 | 0 | 0 | 1 | 1 | 1 | 1 | 0 | 0 | 0 | 1 | 1 | 0 |
| | U | 1 | 0 | 0 | 1 | 1 | 0 | 0 | 1 | 1 | 0 | 0 | 1 | 1 | 1 | 0 | 0 |
| FIRST STAGE | M | 1 | 1 | 1 | 1 | 0 | 0 | 0 | 0 | 0 | 0 | 0 | 0 | 1 | 1 | 1 | 1 |
| | L | 1 | 1 | 1 | 1 | 1 | 1 | 1 | 1 | 0 | 0 | 0 | 0 | 0 | 0 | 0 | 0 |

FIG.49

1-2-5-7 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 0 | 0 | 1 | 1 | 1 | 0 | 0 | 0 | 1 | 1 | 0 |
| | U | 1 | 1 | 0 | 0 | 0 | 0 | 1 | 1 | 1 | 0 | 0 | 1 | 1 | 1 | 0 | 0 |
| FIRST STAGE | M | 1 | 1 | 1 | 1 | 0 | 0 | 0 | 0 | 0 | 0 | 0 | 0 | 1 | 1 | 1 | 1 |
| | L | 1 | 1 | 1 | 1 | 1 | 1 | 1 | 1 | 0 | 0 | 0 | 0 | 0 | 0 | 0 | 0 |

FIG.50

1-2-5-7 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 0 | 0 | 0 | 1 | 1 | 0 | 0 | 1 | 1 | 0 |
| | U | 1 | 1 | 0 | 0 | 0 | 1 | 1 | 0 | 0 | 0 | 1 | 1 | 1 | 1 | 0 | 0 |
| FIRST STAGE | M | 1 | 1 | 1 | 1 | 0 | 0 | 0 | 0 | 0 | 0 | 0 | 0 | 1 | 1 | 1 | 1 |
| | L | 1 | 1 | 1 | 1 | 1 | 1 | 1 | 1 | 0 | 0 | 0 | 0 | 0 | 0 | 0 | 0 |

FIG.51

1-4-5-5 CODING, TWO STAGES, PAGE BY PAGE 1-4-5-5

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 1 | 1 | 1 | 0 | 0 | 0 | 1 | 1 | 1 | 1 | 0 | 0 | 0 |
| Upper | 1 | 1 | 0 | 0 | 0 | 1 | 1 | 0 | 0 | 0 | 0 | 1 | 1 | 1 | 1 | 0 |
| Middle | 1 | 1 | 1 | 1 | 0 | 0 | 0 | 0 | 0 | 0 | 1 | 1 | 0 | 0 | 1 | 1 |
| Lower | 1 | 1 | 1 | 1 | 1 | 1 | 1 | 1 | 0 | 0 | 0 | 0 | 0 | 0 | 0 | 0 |

FIG.55A 1-4-5-5

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 1 | 0 | 0 | 1 | 1 | 0 | 0 | 0 | 1 | 1 | 1 | 1 | 0 | 0 | 0 |
| Upper | 1 | 0 | 0 | 0 | 0 | 1 | 1 | 1 | 1 | 1 | 0 | 0 | 1 | 1 | 0 | 0 |
| Middle | 1 | 1 | 1 | 0 | 0 | 0 | 0 | 1 | 1 | 1 | 1 | 0 | 0 | 0 | 0 | 1 |
| Lower | 1 | 1 | 1 | 1 | 1 | 1 | 1 | 1 | 0 | 0 | 0 | 0 | 0 | 0 | 0 | 0 |

FIG.55B 1-4-5-5

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 0 | 0 | 1 | 1 | 1 | 1 | 1 | 0 | 0 | 0 | 1 | 1 | 0 |
| Upper | 1 | 1 | 1 | 0 | 0 | 0 | 0 | 1 | 1 | 0 | 0 | 1 | 1 | 1 | 0 | 0 |
| Middle | 1 | 1 | 0 | 0 | 1 | 1 | 0 | 0 | 0 | 0 | 0 | 0 | 1 | 1 | 1 | 1 |
| Lower | 1 | 1 | 1 | 1 | 1 | 1 | 1 | 1 | 0 | 0 | 0 | 0 | 0 | 0 | 0 | 0 |

FIG.55C 1-6-4-4 CODING, TWO STAGES, PAGE BY PAGE 1-2-6-6 CODING, TWO STAGES, PAGE BY PAGE 1-4-5-5 CODING, TWO STAGES, PAGE BY PAGE

1-4-5-5 CODING

| | | | | | | | | | | | | | | | | | |
|---|---|---|---|---|---|---|---|---|---|---|---|---|---|---|---|---|---|
| SECOND STAGE | T | 1 | 0 | 0 | 0 | 0 | 1 | 1 | 1 | 1 | 1 | 0 | 0 | 1 | 1 | 0 | 0 |
| | U | 1 | 1 | 0 | 0 | 1 | 1 | 0 | 0 | 0 | 0 | 0 | 1 | 1 | 1 | 1 | 0 |
| | M | 1 | 1 | 1 | 0 | 0 | 0 | 0 | 1 | 1 | 0 | 0 | 0 | 0 | 1 | 1 | 1 |
| FIRST STAGE | L | 1 | 1 | 1 | 1 | 1 | 1 | 1 | 1 | 0 | 0 | 0 | 0 | 0 | 0 | 0 | 0 |

FIG.64

1-5-5-4 CODING

| | | | | | | | | | | | | | | | | | |
|---|---|---|---|---|---|---|---|---|---|---|---|---|---|---|---|---|---|
| SECOND STAGE | T | 1 | 0 | 0 | 0 | 0 | 1 | 1 | 1 | 1 | 1 | 0 | 0 | 1 | 1 | 0 | 0 |
| | U | 1 | 1 | 0 | 0 | 1 | 1 | 0 | 0 | 0 | 0 | 0 | 1 | 1 | 1 | 1 | 0 |
| | M | 1 | 1 | 1 | 0 | 0 | 0 | 0 | 1 | 1 | 0 | 0 | 0 | 0 | 1 | 1 | 1 |
| FIRST STAGE | L | 1 | 1 | 1 | 1 | 1 | 1 | 1 | 1 | 0 | 0 | 0 | 0 | 0 | 0 | 0 | 0 |

FIG.65

1-5-5-4 CODING

| | | | | | | | | | | | | | | | | | |
|---|---|---|---|---|---|---|---|---|---|---|---|---|---|---|---|---|---|
| SECOND STAGE | T | 1 | 0 | 0 | 0 | 0 | 1 | 1 | 1 | 1 | 1 | 1 | 0 | 0 | 0 | 0 | 1 |
| | U | 1 | 1 | 0 | 0 | 1 | 1 | 0 | 0 | 0 | 1 | 1 | 1 | 1 | 0 | 0 | 0 |
| | M | 1 | 1 | 1 | 0 | 0 | 0 | 0 | 1 | 1 | 1 | 0 | 0 | 1 | 1 | 0 | 0 |
| FIRST STAGE | L | 1 | 1 | 1 | 1 | 1 | 1 | 1 | 1 | 0 | 0 | 0 | 0 | 0 | 0 | 0 | 0 |

FIG.66

1-5-5-4 CODING

| | | | | | | | | | | | | | | | | | |
|---|---|---|---|---|---|---|---|---|---|---|---|---|---|---|---|---|---|
| SECOND STAGE | T | 1 | 0 | 0 | 0 | 0 | 1 | 1 | 1 | 1 | 0 | 0 | 0 | 0 | 1 | 1 | 1 |
| | U | 1 | 1 | 0 | 0 | 1 | 1 | 0 | 0 | 0 | 0 | 0 | 1 | 1 | 1 | 1 | 0 |
| | M | 1 | 1 | 1 | 0 | 0 | 0 | 0 | 1 | 1 | 1 | 0 | 0 | 1 | 1 | 0 | 0 |
| FIRST STAGE | L | 1 | 1 | 1 | 1 | 1 | 1 | 1 | 1 | 0 | 0 | 0 | 0 | 0 | 0 | 0 | 0 |

FIG.67

1-4-5-5 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 0 | 0 | 1 | 1 | 1 | 1 | 1 | 0 | 0 | 0 | 0 |
| | U | 1 | 1 | 0 | 0 | 0 | 0 | 1 | 1 | 1 | 0 | 0 | 1 | 1 | 1 | 0 | 0 |
| | M | 1 | 1 | 1 | 1 | 0 | 0 | 0 | 0 | 0 | 0 | 1 | 1 | 1 | 0 | 0 | 1 |
| FIRST STAGE | L | 1 | 1 | 1 | 1 | 1 | 1 | 1 | 1 | 0 | 0 | 0 | 0 | 0 | 0 | 0 | 0 |

FIG.68

1-4-5-5 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 0 | 0 | 1 | 1 | 1 | 1 | 1 | 0 | 0 | 0 | 0 |
| | U | 1 | 1 | 0 | 0 | 0 | 0 | 1 | 1 | 1 | 1 | 0 | 0 | 0 | 1 | 1 | 0 |
| | M | 1 | 1 | 1 | 1 | 0 | 0 | 0 | 0 | 0 | 1 | 1 | 0 | 0 | 0 | 1 | 1 |
| FIRST STAGE | L | 1 | 1 | 1 | 1 | 1 | 1 | 1 | 1 | 0 | 0 | 0 | 0 | 0 | 0 | 0 | 0 |

FIG.69

1-5-4-5 CODING

| | | | | | | | | | | | | | | | | | |
|---|---|---|---|---|---|---|---|---|---|---|---|---|---|---|---|---|---|
| SECOND STAGE | T | 1 | 0 | 0 | 0 | 0 | 1 | 1 | 1 | 1 | 0 | 0 | 1 | 1 | 1 | 0 | 0 |
| | U | 1 | 1 | 0 | 0 | 1 | 1 | 0 | 0 | 0 | 0 | 0 | 0 | 1 | 1 | 1 | 1 |
| | M | 1 | 1 | 1 | 0 | 0 | 0 | 0 | 1 | 1 | 1 | 0 | 0 | 0 | 1 | 1 | 0 |
| FIRST STAGE | L | 1 | 1 | 1 | 1 | 1 | 1 | 1 | 1 | 0 | 0 | 0 | 0 | 0 | 0 | 0 | 0 |

FIG.70

1-4-5-5 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 0 | 0 | 0 | 1 | 1 | 1 | 1 | 0 | 0 | 0 |
| | U | 1 | 1 | 0 | 0 | 0 | 1 | 1 | 0 | 0 | 0 | 0 | 1 | 1 | 1 | 1 | 0 |
| | M | 1 | 1 | 1 | 1 | 0 | 0 | 0 | 0 | 0 | 0 | 1 | 1 | 0 | 0 | 1 | 1 |
| FIRST STAGE | L | 1 | 1 | 1 | 1 | 1 | 1 | 1 | 1 | 0 | 0 | 0 | 0 | 0 | 0 | 0 | 0 |

FIG. 71

1-4-5-5 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 0 | 0 | 0 | 0 | 0 | 1 | 1 | 1 | 1 | 0 |
| | U | 1 | 1 | 0 | 0 | 0 | 1 | 1 | 0 | 0 | 1 | 1 | 1 | 1 | 0 | 0 | 0 |
| | M | 1 | 1 | 1 | 1 | 0 | 0 | 0 | 0 | 0 | 0 | 1 | 1 | 0 | 0 | 1 | 1 |
| FIRST STAGE | L | 1 | 1 | 1 | 1 | 1 | 1 | 1 | 1 | 0 | 0 | 0 | 0 | 0 | 0 | 0 | 0 |

FIG. 72

1-5-4-5 CODING

| | | | | | | | | | | | | | | | | | |
|---|---|---|---|---|---|---|---|---|---|---|---|---|---|---|---|---|---|
| SECOND STAGE | T | 1 | 0 | 0 | 0 | 0 | 1 | 1 | 1 | 1 | 1 | 0 | 0 | 0 | 1 | 1 | 0 |
| | U | 1 | 1 | 0 | 0 | 1 | 1 | 0 | 0 | 0 | 0 | 0 | 0 | 1 | 1 | 1 | 1 |
| | M | 1 | 1 | 1 | 0 | 0 | 0 | 0 | 1 | 1 | 0 | 0 | 1 | 1 | 1 | 0 | 0 |
| FIRST STAGE | L | 1 | 1 | 1 | 1 | 1 | 1 | 1 | 1 | 0 | 0 | 0 | 0 | 0 | 0 | 0 | 0 |

FIG. 73

1-5-4-5 CODING

| Stage | Row | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 0 | 0 | 0 | 0 | 1 | 1 | 1 | 1 | 0 | 0 |
| | U | 1 | 1 | 0 | 0 | 0 | 1 | 1 | 0 | 0 | 0 | 0 | 0 | 1 | 1 | 1 | 1 |
| | M | 1 | 1 | 1 | 1 | 0 | 0 | 0 | 0 | 0 | 1 | 1 | 0 | 0 | 1 | 1 | 0 |
| FIRST STAGE | L | 1 | 1 | 1 | 1 | 1 | 1 | 1 | 1 | 0 | 0 | 0 | 0 | 0 | 0 | 0 | 0 |

FIG. 74

1-5-4-5 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 0 | 0 | 1 | 1 | 1 | 1 | 1 | 0 | 0 | 0 | 0 |
| | U | 1 | 1 | 0 | 0 | 0 | 0 | 1 | 1 | 1 | 1 | 0 | 0 | 0 | 0 | 1 | 1 |
| | M | 1 | 1 | 1 | 1 | 0 | 0 | 0 | 0 | 0 | 1 | 1 | 0 | 0 | 1 | 1 | 0 |
| FIRST STAGE | L | 1 | 1 | 1 | 1 | 1 | 1 | 1 | 1 | 0 | 0 | 0 | 0 | 0 | 0 | 0 | 0 |

FIG. 75

1-4-6-4 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 0 | 0 | 0 | 0 | 0 | 0 | 1 | 1 | 1 | 1 |
| | U | 1 | 1 | 0 | 0 | 0 | 1 | 1 | 0 | 0 | 0 | 1 | 1 | 1 | 0 | 0 | 1 |
| | M | 1 | 1 | 1 | 1 | 0 | 0 | 0 | 0 | 0 | 1 | 1 | 0 | 0 | 0 | 1 | 1 |
| FIRST STAGE | L | 1 | 1 | 1 | 1 | 1 | 1 | 1 | 1 | 0 | 0 | 0 | 0 | 0 | 0 | 0 | 0 |

FIG.76

1-4-6-4 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 0 | 0 | 0 | 0 | 1 | 1 | 1 | 0 | 0 | 1 |
| | U | 1 | 1 | 0 | 0 | 0 | 1 | 1 | 0 | 0 | 0 | 0 | 0 | 1 | 1 | 1 | 1 |
| | M | 1 | 1 | 1 | 1 | 0 | 0 | 0 | 0 | 0 | 1 | 1 | 0 | 0 | 0 | 1 | 1 |
| FIRST STAGE | L | 1 | 1 | 1 | 1 | 1 | 1 | 1 | 1 | 0 | 0 | 0 | 0 | 0 | 0 | 0 | 0 |

FIG.77

1-4-6-4 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 0 | 0 | 0 | 0 | 0 | 0 | 1 | 1 | 1 | 1 |
| | U | 1 | 1 | 0 | 0 | 0 | 1 | 1 | 0 | 0 | 1 | 1 | 0 | 0 | 0 | 1 | 1 |
| | M | 1 | 1 | 1 | 1 | 0 | 0 | 0 | 0 | 0 | 0 | 1 | 1 | 1 | 0 | 0 | 1 |
| FIRST STAGE | L | 1 | 1 | 1 | 1 | 1 | 1 | 1 | 1 | 0 | 0 | 0 | 0 | 0 | 0 | 0 | 0 |

FIG.78

1-4-6-4 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 0 | 0 | 0 | 1 | 1 | 0 | 0 | 0 | 1 | 1 |
| | U | 1 | 1 | 0 | 0 | 0 | 1 | 1 | 0 | 0 | 0 | 0 | 0 | 1 | 1 | 1 | 1 |
| | M | 1 | 1 | 1 | 1 | 0 | 0 | 0 | 0 | 0 | 0 | 1 | 1 | 1 | 0 | 0 | 1 |
| FIRST STAGE | L | 1 | 1 | 1 | 1 | 1 | 1 | 1 | 1 | 0 | 0 | 0 | 0 | 0 | 0 | 0 | 0 |

FIG. 79

1-4-6-4 CODING

| | | | | | | | | | | | | | | | | | |
|---|---|---|---|---|---|---|---|---|---|---|---|---|---|---|---|---|---|
| SECOND STAGE | T | 1 | 0 | 0 | 0 | 0 | 1 | 1 | 1 | 1 | 0 | 0 | 0 | 0 | 1 | 1 | 1 |
| | U | 1 | 1 | 0 | 0 | 1 | 1 | 0 | 0 | 0 | 0 | 1 | 1 | 0 | 0 | 1 | 1 |
| | M | 1 | 1 | 1 | 0 | 0 | 0 | 0 | 1 | 1 | 1 | 1 | 0 | 0 | 0 | 0 | 1 |
| FIRST STAGE | L | 1 | 1 | 1 | 1 | 1 | 1 | 1 | 1 | 0 | 0 | 0 | 0 | 0 | 0 | 0 | 0 |

FIG.80

1-6-4-4 CODING

| | | | | | | | | | | | | | | | | | |
|---|---|---|---|---|---|---|---|---|---|---|---|---|---|---|---|---|---|
| SECOND STAGE | T | 1 | 0 | 0 | 0 | 0 | 1 | 1 | 1 | 1 | 1 | 0 | 0 | 0 | 0 | 1 | 1 |
| | U | 1 | 1 | 0 | 0 | 1 | 1 | 0 | 0 | 0 | 0 | 0 | 0 | 1 | 1 | 1 | 1 |
| | M | 1 | 1 | 1 | 0 | 0 | 0 | 0 | 1 | 1 | 0 | 0 | 1 | 1 | 0 | 0 | 1 |
| FIRST STAGE | L | 1 | 1 | 1 | 1 | 1 | 1 | 1 | 1 | 0 | 0 | 0 | 0 | 0 | 0 | 0 | 0 |

FIG.81

1-4-4-6 CODING

| | | | | | | | | | | | | | | | | | |
|---|---|---|---|---|---|---|---|---|---|---|---|---|---|---|---|---|---|
| SECOND STAGE | T | 1 | 0 | 0 | 0 | 0 | 1 | 1 | 1 | 1 | 0 | 0 | 1 | 1 | 0 | 0 | 1 |
| | U | 1 | 1 | 0 | 0 | 1 | 1 | 0 | 0 | 0 | 0 | 0 | 0 | 1 | 1 | 1 | 1 |
| | M | 1 | 1 | 1 | 0 | 0 | 0 | 0 | 1 | 1 | 1 | 0 | 0 | 0 | 0 | 1 | 1 |
| FIRST STAGE | L | 1 | 1 | 1 | 1 | 1 | 1 | 1 | 1 | 0 | 0 | 0 | 0 | 0 | 0 | 0 | 0 |

FIG.82

1-4-4-6 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 0 | 0 | 1 | 1 | 1 | 1 | 0 | 0 | 0 | 0 | 1 |
| | U | 1 | 1 | 0 | 0 | 0 | 0 | 1 | 1 | 1 | 0 | 0 | 0 | 0 | 1 | 1 | 1 |
| | M | 1 | 1 | 1 | 1 | 0 | 0 | 0 | 0 | 0 | 0 | 1 | 1 | 0 | 0 | 1 | 1 |
| FIRST STAGE | L | 1 | 1 | 1 | 1 | 1 | 1 | 1 | 1 | 0 | 0 | 0 | 0 | 0 | 0 | 0 | 0 |

FIG.83

1-4-4-6 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 0 | 0 | 1 | 1 | 1 | 1 | 0 | 0 | 0 | 0 | 1 |
| | U | 1 | 1 | 0 | 0 | 0 | 0 | 1 | 1 | 1 | 1 | 0 | 0 | 1 | 1 | 0 | 0 |
| | M | 1 | 1 | 1 | 1 | 0 | 0 | 0 | 0 | 0 | 1 | 1 | 1 | 1 | 0 | 0 | 0 |
| FIRST STAGE | L | 1 | 1 | 1 | 1 | 1 | 1 | 1 | 1 | 0 | 0 | 0 | 0 | 0 | 0 | 0 | 0 |

FIG.84

1-5-6-3 CODING

| | | | | | | | | | | | | | | | | | |
|---|---|---|---|---|---|---|---|---|---|---|---|---|---|---|---|---|---|
| SECOND STAGE | T | 1 | 0 | 0 | 0 | 0 | 1 | 1 | 1 | 1 | 1 | 1 | 1 | 0 | 0 | 0 | 0 |
| | U | 1 | 1 | 0 | 0 | 1 | 1 | 0 | 0 | 0 | 0 | 1 | 1 | 1 | 0 | 0 | 1 |
| | M | 1 | 1 | 1 | 0 | 0 | 0 | 0 | 1 | 1 | 0 | 0 | 1 | 1 | 1 | 0 | 0 |
| FIRST STAGE | L | 1 | 1 | 1 | 1 | 1 | 1 | 1 | 1 | 0 | 0 | 0 | 0 | 0 | 0 | 0 | 0 |

FIG.85

1-5-6-3 CODING

| | | | | | | | | | | | | | | | | | |
|---|---|---|---|---|---|---|---|---|---|---|---|---|---|---|---|---|---|
| SECOND STAGE | T | 1 | 0 | 0 | 0 | 0 | 1 | 1 | 1 | 1 | 1 | 1 | 1 | 0 | 0 | 0 | 0 |
| | U | 1 | 1 | 0 | 0 | 1 | 1 | 0 | 0 | 0 | 1 | 1 | 0 | 0 | 0 | 1 | 1 |
| | M | 1 | 1 | 1 | 0 | 0 | 0 | 0 | 1 | 1 | 1 | 0 | 0 | 0 | 1 | 1 | 0 |
| FIRST STAGE | L | 1 | 1 | 1 | 1 | 1 | 1 | 1 | 1 | 0 | 0 | 0 | 0 | 0 | 0 | 0 | 0 |

FIG.86

1-3-6-5 CODING

| | | | | | | | | | | | | | | | | | |
|---|---|---|---|---|---|---|---|---|---|---|---|---|---|---|---|---|---|
| SECOND STAGE | T | 1 | 0 | 0 | 0 | 0 | 1 | 1 | 1 | 1 | 1 | 0 | 0 | 0 | 1 | 1 | 0 |
| | U | 1 | 1 | 0 | 0 | 1 | 1 | 0 | 0 | 0 | 1 | 1 | 0 | 0 | 0 | 1 | 1 |
| | M | 1 | 1 | 1 | 0 | 0 | 0 | 0 | 1 | 1 | 1 | 1 | 1 | 0 | 0 | 0 | 0 |
| FIRST STAGE | L | 1 | 1 | 1 | 1 | 1 | 1 | 1 | 1 | 0 | 0 | 0 | 0 | 0 | 0 | 0 | 0 |

FIG.87

1-3-6-5 CODING

| | | | | | | | | | | | | | | | | | |
|---|---|---|---|---|---|---|---|---|---|---|---|---|---|---|---|---|---|
| SECOND STAGE | T | 1 | 0 | 0 | 0 | 0 | 1 | 1 | 1 | 1 | 0 | 0 | 1 | 1 | 1 | 0 | 0 |
| | U | 1 | 1 | 0 | 0 | 1 | 1 | 0 | 0 | 0 | 0 | 1 | 1 | 1 | 0 | 0 | 1 |
| | M | 1 | 1 | 1 | 0 | 0 | 0 | 0 | 1 | 1 | 1 | 1 | 1 | 0 | 0 | 0 | 0 |
| FIRST STAGE | L | 1 | 1 | 1 | 1 | 1 | 1 | 1 | 1 | 0 | 0 | 0 | 0 | 0 | 0 | 0 | 0 |

FIG.88

1-3-6-5 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 0 | 0 | 0 | 0 | 0 | 1 | 1 | 1 | 1 | 0 |
| | U | 1 | 1 | 0 | 0 | 0 | 1 | 1 | 0 | 0 | 0 | 1 | 1 | 0 | 0 | 1 | 1 |
| | M | 1 | 1 | 1 | 1 | 0 | 0 | 0 | 0 | 0 | 1 | 1 | 1 | 1 | 0 | 0 | 0 |
| FIRST STAGE | L | 1 | 1 | 1 | 1 | 1 | 1 | 1 | 1 | 0 | 0 | 0 | 0 | 0 | 0 | 0 | 0 |

FIG.89

1-3-5-6 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 0 | 0 | 0 | 0 | 1 | 1 | 0 | 0 | 1 | 1 |
| | U | 1 | 1 | 0 | 0 | 0 | 1 | 1 | 0 | 0 | 0 | 0 | 1 | 1 | 1 | 1 | 0 |
| | M | 1 | 1 | 1 | 1 | 0 | 0 | 0 | 0 | 0 | 1 | 1 | 1 | 1 | 0 | 0 | 0 |
| FIRST STAGE | L | 1 | 1 | 1 | 1 | 1 | 1 | 1 | 1 | 0 | 0 | 0 | 0 | 0 | 0 | 0 | 0 |

FIG.90

1-3-5-6 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 0 | 0 | 0 | 0 | 1 | 1 | 0 | 0 | 1 | 1 |
| | U | 1 | 1 | 0 | 0 | 0 | 1 | 1 | 0 | 0 | 1 | 1 | 1 | 1 | 0 | 0 | 0 |
| FIRST STAGE | M | 1 | 1 | 1 | 1 | 0 | 0 | 0 | 0 | 0 | 0 | 0 | 1 | 1 | 1 | 1 | 0 |
| | L | 1 | 1 | 1 | 1 | 1 | 1 | 1 | 1 | 0 | 0 | 0 | 0 | 0 | 0 | 0 | 0 |

FIG.91

1-3-6-5 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 0 | 0 | 0 | 1 | 1 | 1 | 1 | 0 | 0 | 0 |
| | U | 1 | 1 | 0 | 0 | 0 | 1 | 1 | 0 | 0 | 0 | 1 | 1 | 0 | 0 | 1 | 1 |
| | M | 1 | 1 | 1 | 1 | 0 | 0 | 0 | 0 | 0 | 0 | 0 | 1 | 1 | 1 | 1 | 0 |
| FIRST STAGE | L | 1 | 1 | 1 | 1 | 1 | 1 | 1 | 1 | 0 | 0 | 0 | 0 | 0 | 0 | 0 | 0 |

FIG.92

1-6-5-3 CODING

| | | | | | | | | | | | | | | | | | |
|---|---|---|---|---|---|---|---|---|---|---|---|---|---|---|---|---|---|
| SECOND STAGE | T | 1 | 0 | 0 | 0 | 0 | 1 | 1 | 1 | 1 | 1 | 1 | 1 | 0 | 0 | 0 | 0 |
| | U | 1 | 1 | 0 | 0 | 1 | 1 | 0 | 0 | 0 | 0 | 1 | 1 | 1 | 1 | 0 | 0 |
| | M | 1 | 1 | 1 | 0 | 0 | 0 | 0 | 1 | 1 | 0 | 0 | 1 | 1 | 0 | 0 | 1 |
| FIRST STAGE | L | 1 | 1 | 1 | 1 | 1 | 1 | 1 | 1 | 0 | 0 | 0 | 0 | 0 | 0 | 0 | 0 |

FIG.93

1-3-5-6 CODING

| | | | | | | | | | | | | | | | | | |
|---|---|---|---|---|---|---|---|---|---|---|---|---|---|---|---|---|---|
| SECOND STAGE | T | 1 | 0 | 0 | 0 | 0 | 1 | 1 | 1 | 1 | 0 | 0 | 1 | 1 | 0 | 0 | 1 |
| | U | 1 | 1 | 0 | 0 | 1 | 1 | 0 | 0 | 0 | 0 | 1 | 1 | 1 | 1 | 0 | 0 |
| | M | 1 | 1 | 1 | 0 | 0 | 0 | 0 | 1 | 1 | 1 | 1 | 1 | 0 | 0 | 0 | 0 |
| FIRST STAGE | L | 1 | 1 | 1 | 1 | 1 | 1 | 1 | 1 | 0 | 0 | 0 | 0 | 0 | 0 | 0 | 0 |

FIG.94

1-3-5-6 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 0 | 0 | 1 | 1 | 1 | 1 | 0 | 0 | 0 | 0 | 1 |
| | U | 1 | 1 | 0 | 0 | 0 | 0 | 1 | 1 | 1 | 1 | 0 | 0 | 1 | 1 | 0 | 0 |
| | M | 1 | 1 | 1 | 1 | 0 | 0 | 0 | 0 | 0 | 1 | 1 | 1 | 1 | 0 | 0 | 0 |
| FIRST STAGE | L | 1 | 1 | 1 | 1 | 1 | 1 | 1 | 1 | 0 | 0 | 0 | 0 | 0 | 0 | 0 | 0 |

FIG.95

1-5-3-6 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 0 | 0 | 1 | 1 | 1 | 0 | 0 | 0 | 0 | 1 | 1 |
| | U | 1 | 1 | 0 | 0 | 0 | 0 | 1 | 1 | 1 | 1 | 1 | 1 | 0 | 0 | 0 | 0 |
| | M | 1 | 1 | 1 | 1 | 0 | 0 | 0 | 0 | 0 | 1 | 1 | 0 | 0 | 1 | 1 | 0 |
| FIRST STAGE | L | 1 | 1 | 1 | 1 | 1 | 1 | 1 | 1 | 0 | 0 | 0 | 0 | 0 | 0 | 0 | 0 |

FIG.96

1-3-6-5 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 0 | 0 | 1 | 1 | 1 | 1 | 1 | 0 | 0 | 0 | 0 |
| | U | 1 | 1 | 0 | 0 | 0 | 0 | 1 | 1 | 1 | 0 | 0 | 1 | 1 | 0 | 0 | 1 |
| | M | 1 | 1 | 1 | 1 | 0 | 0 | 0 | 0 | 0 | 0 | 1 | 1 | 1 | 1 | 0 | 0 |
| FIRST STAGE | L | 1 | 1 | 1 | 1 | 1 | 1 | 1 | 1 | 0 | 0 | 0 | 0 | 0 | 0 | 0 | 0 |

FIG.97

1-3-5-6 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 0 | 0 | 1 | 1 | 0 | 0 | 0 | 0 | 1 | 1 | 1 |
| | U | 1 | 1 | 0 | 0 | 0 | 0 | 1 | 1 | 1 | 1 | 0 | 0 | 1 | 1 | 0 | 0 |
| | M | 1 | 1 | 1 | 1 | 0 | 0 | 0 | 0 | 0 | 0 | 0 | 1 | 1 | 1 | 1 | 0 |
| FIRST STAGE | L | 1 | 1 | 1 | 1 | 1 | 1 | 1 | 1 | 0 | 0 | 0 | 0 | 0 | 0 | 0 | 0 |

FIG.98

1-2-6-6 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 1 | 0 | 0 | 0 | 1 | 1 | 0 | 0 | 0 | 1 | 1 |
| | U | 1 | 1 | 0 | 0 | 0 | 1 | 1 | 0 | 0 | 0 | 1 | 1 | 1 | 0 | 0 | 1 |
| | M | 1 | 1 | 1 | 1 | 0 | 0 | 0 | 0 | 0 | 0 | 0 | 0 | 1 | 1 | 1 | 1 |
| FIRST STAGE | L | 1 | 1 | 1 | 1 | 1 | 1 | 1 | 1 | 0 | 0 | 0 | 0 | 0 | 0 | 0 | 0 |

FIG.99

1-2-6-6 CODING

| Stage | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 0 | 0 | 1 | 1 | 1 | 0 | 0 | 0 | 0 | 1 | 1 |
| | U | 1 | 1 | 0 | 0 | 0 | 0 | 1 | 1 | 1 | 0 | 0 | 1 | 1 | 0 | 0 | 1 |
| | M | 1 | 1 | 1 | 1 | 0 | 0 | 0 | 0 | 0 | 0 | 0 | 0 | 1 | 1 | 1 | 1 |
| FIRST STAGE | L | 1 | 1 | 1 | 1 | 1 | 1 | 1 | 1 | 0 | 0 | 0 | 0 | 0 | 0 | 0 | 0 |

FIG. 100

2-3-6-8 CODING, TWO STAGES, PAGE BY PAGE 2-3-6-8 CODING, TWO STAGES, PAGE BY PAGE 1-2-4-8 CODING

| | | | | | | | | | | | | | | | | | |
|---|---|---|---|---|---|---|---|---|---|---|---|---|---|---|---|---|---|
| SECOND STAGE | T | 1 | 0 | 0 | 1 | 1 | 0 | 0 | 1 | 1 | 0 | 0 | 1 | 1 | 0 | 0 | 1 |
| FIRST STAGE | U | 1 | 1 | 0 | 0 | 0 | 0 | 1 | 1 | 1 | 1 | 0 | 0 | 0 | 0 | 1 | 1 |
| | M | 1 | 1 | 1 | 1 | 0 | 0 | 0 | 0 | 0 | 0 | 0 | 0 | 1 | 1 | 1 | 1 |
| | L | 1 | 1 | 1 | 1 | 1 | 1 | 1 | 1 | 0 | 0 | 0 | 0 | 0 | 0 | 0 | 0 |

FIG. 103

MEMORY SYSTEM

CROSS REFERENCE TO RELATED APPLICATIONS

This application is a continuation of U.S. application Ser. No. 17/014,293 filed Sep. 8, 2020, and is based upon and claims the benefit of priority from the prior Japanese Patent Applications No. 2019-166519 filed on Sep. 12, 2019 and No. 2020-104833 filed on Jun. 17, 2020, the entire contents of each of which are incorporated herein by reference.

FIELD

Embodiments described herein relate generally to a memory system.

BACKGROUND

In a NAND flash memory, mufti-level data configured of multiple bits is generally written into memory cells, and a triple level cell (TLC) technology for writing multi-level data configured of three bits into memory cells has been put into practical use. In the future, a quadruple level cell (QLC) technology for writing multi-level data configured of four bits will be the mainstream.

In the QLC, in order to avoid inter-cell interference, a method has been studied in which 4-bit data is written simultaneously to the first memory cell, 4-bit data also is written simultaneously to the adjacent cells similarly, and then 4-bit data is rewritten simultaneously to the first memory cell. However, in this method, in order to rewrite the 4-bit data, it is necessary to hold the 4-bit data in the write buffer in the memory controller until the rewriting is completed.

In recent years, the NAND memory has been made three-dimensional, and there is a problem that the memory capacity of the required write buffer increases, and the cost of the memory controller incorporating the write buffer increases. For this reason, even in a three-dimensional nonvolatile memory, a measure for reducing the write buffer amount of the memory controller is necessary.

As the measure for reducing the write buffer amount of the memory controller while avoiding the inter-cell interference, a method is known in which when each bit of data is written to the memory cell, it is not necessary to rewrite all bit data by writing the data in two stages in a dividing manner.

However, this method has a problem that the bit error rate is largely biased when each bit data is written in the memory cell.

To improve the reliability of the QLC technology, it is necessary to avoid the inter-cell interference, reduce the capacity of the write buffer in the memory controller, and suppress the bias of the bit error rate at the time of writing each bit data.

BRIEF DESCRIPTION OF THE DRAWINGS

FIG. 6 is a diagram illustrating an example of data coding according to the first embodiment;

FIG. 8B is a diagram illustrating a second example of the program order according to the first embodiment;

FIG. 12 is a diagram for explaining a process of a majority processing of a plurality of read results;

FIG. 19C is a diagram showing an example of data coding suitable for the page read process according to one modification;

FIG. 20B is a diagram illustrating 4-bit data in each threshold region in FIG. 20A;

FIG. 21B is a diagram illustrating 4-bit data in each threshold region in FIG. 20A;

FIG. 22B is a diagram illustrating 4-bit data in each threshold region in FIG. 22A;

FIG. 23B is a diagram illustrating 4-bit data in each threshold region in FIG. 23A;

FIG. 24B is a diagram illustrating 4-bit data in each threshold region in FIG. 24A;

FIG. 25B is a diagram illustrating 4-bit data in each threshold region in FIG. 25A;

FIG. 26B is a diagram illustrating 4-bit data in each threshold region in FIG. 26A;

FIG. 27B is a diagram illustrating 4-bit data in each threshold region in FIG. 27A;

FIG. 28B is a diagram illustrating 4-bit data in each threshold region in FIG. 28A;

FIG. 29B is a diagram illustrating 4-bit data in each threshold region in FIG. 29A;

FIG. 30B is a diagram illustrating 4-bit data in each threshold region in FIG. 30A;

FIG. 31B is a diagram illustrating 4-bit data in each threshold region in FIG. 31A;

FIG. 32B is a diagram illustrating 4-bit data in each threshold region in FIG. 32A;

FIG. 33B is a diagram illustrating 4-bit data in each threshold region in FIG. 33A;

FIG. 34B is a diagram illustrating 4-bit data in each threshold region in FIG. 34A;

FIG. 35B is a diagram illustrating 4-bit data in each threshold region in FIG. 34A;

FIG. 36B is a diagram illustrating 4-bit data in each threshold region in FIG. 36A;

FIG. 37B is a diagram illustrating 4-bit data in each threshold region in FIG. 37A;

FIG. 38B is a diagram illustrating 4-bit data in each threshold region in FIG. 38A;

FIG. 39 is a diagram illustrating another modification of 1-4-5-5 data coding;

FIG. 40 is a diagram illustrating another modification of 1-4-5-5 data coding;

FIG. 41 is a diagram illustrating another modification of 3-2-5-5 data coding;

FIG. 42 is a diagram illustrating another modification of 3-5-3-4 data coding;

FIG. 43 is a diagram illustrating another modification of 3-5-3-4 data coding;

FIG. 44 is a diagram illustrating another modification of 1-2-6-6 data coding;

FIG. 45 is a diagram illustrating another modification of 1-2-6-6 data coding;

FIG. 46 is a diagram illustrating another modification of 1-2-6-6 data coding;

FIG. 47 is a diagram illustrating another modification of 1-2-4-8 data coding;

FIG. 48 is a diagram illustrating another modification of 1-2-5-7 data coding;

FIG. 49 is a diagram illustrating another modification of 1-2-7-5 data coding;

FIG. 50 is a diagram illustrating another modification of 1-2-5-7 data coding;

FIG. 51 is a diagram illustrating another modification of 1-2-5-7 data coding;

FIG. 55A is a diagram illustrating 4-bit data in each of the threshold regions S0 to S15 in FIG. 56;

FIG. 55B is a diagram illustrating another example of 4-bit data in each of the threshold regions S0 to S15 in FIG. 56;

FIG. 55C is a diagram illustrating another example of 4-bit data in each of the threshold regions S0 to S15 in FIG. 56;

FIG. 64 is a diagram illustrating another modification of 1-4-5-5 data coding;

FIG. 65 is a diagram illustrating another modification of 1-5-5-4 data coding;

FIG. 66 is a diagram illustrating another modification of 1-5-5-4 data coding;

FIG. 67 is a diagram illustrating another modification of 1-5-5-4 data coding;

FIG. 68 is a diagram illustrating another modification of 1-4-5-5 data coding;

FIG. 69 is a diagram illustrating another modification of 1-4-5-5 data coding;

FIG. 70 is a diagram illustrating another modification of 1-5-4-5 data coding;

FIG. 71 is a diagram illustrating another modification of 1-4-5-5 data coding;

FIG. 72 is a diagram illustrating another modification of 1-4-5-5 data coding;

FIG. 73 is a diagram illustrating another modification of 1-5-4-5 data coding;

FIG. 74 is a diagram illustrating another modification of 1-5-4-5 data coding;

FIG. 75 is a diagram illustrating another modification of 1-5-4-5 data coding;

FIG. 76 is a diagram illustrating another modification of 1-4-6-4 data coding;

FIG. 77 is a diagram illustrating another modification of 1-4-6-4 data coding;

FIG. 78 is a diagram illustrating another modification of 1-4-6-4 data coding;

FIG. 79 is a diagram illustrating another modification of 1-4-6-4 data coding;

FIG. 80 is a diagram illustrating another modification of 1-4-6-4 data coding;

FIG. 81 is a diagram illustrating another modification of 1-6-4-4 data coding;

FIG. 82 is a diagram illustrating another modification of 1-4-4-6 data coding;

FIG. 83 is a diagram illustrating another modification of 1-4-4-6 data coding;

FIG. 84 is a diagram illustrating another modification of 1-4-4-6 data coding;

FIG. 85 is a diagram illustrating another modification of 1-5-6-3 data coding;

FIG. 86 is a diagram illustrating another modification of 1-5-6-3 data coding;

FIG. 87 is a diagram illustrating another modification of 1-3-6-5 data coding;

FIG. 88 is a diagram illustrating another modification of 1-3-6-5 data coding;

FIG. 89 is a diagram illustrating another modification of 1-3-6-5 data coding;

FIG. 90 is a diagram illustrating another modification of 1-3-5-6 data coding;

FIG. 91 is a diagram illustrating another modification of 1-3-5-6 data coding;

FIG. 92 is a diagram illustrating another modification of 1-3-6-5 data coding;

FIG. 93 is a diagram illustrating another modification of 1-6-5-3 data coding;

FIG. 94 is a diagram illustrating another modification of 1-3-5-6 data coding;

FIG. 95 is a diagram illustrating another modification of 1-3-5-6 data coding;

FIG. 96 is a diagram illustrating another modification of 1-5-3-6 data coding;

FIG. 97 is a diagram illustrating another modification of 1-3-6-5 data coding;

FIG. 98 is a diagram illustrating another modification of 1-3-5-6 data coding;

Figure 101A:
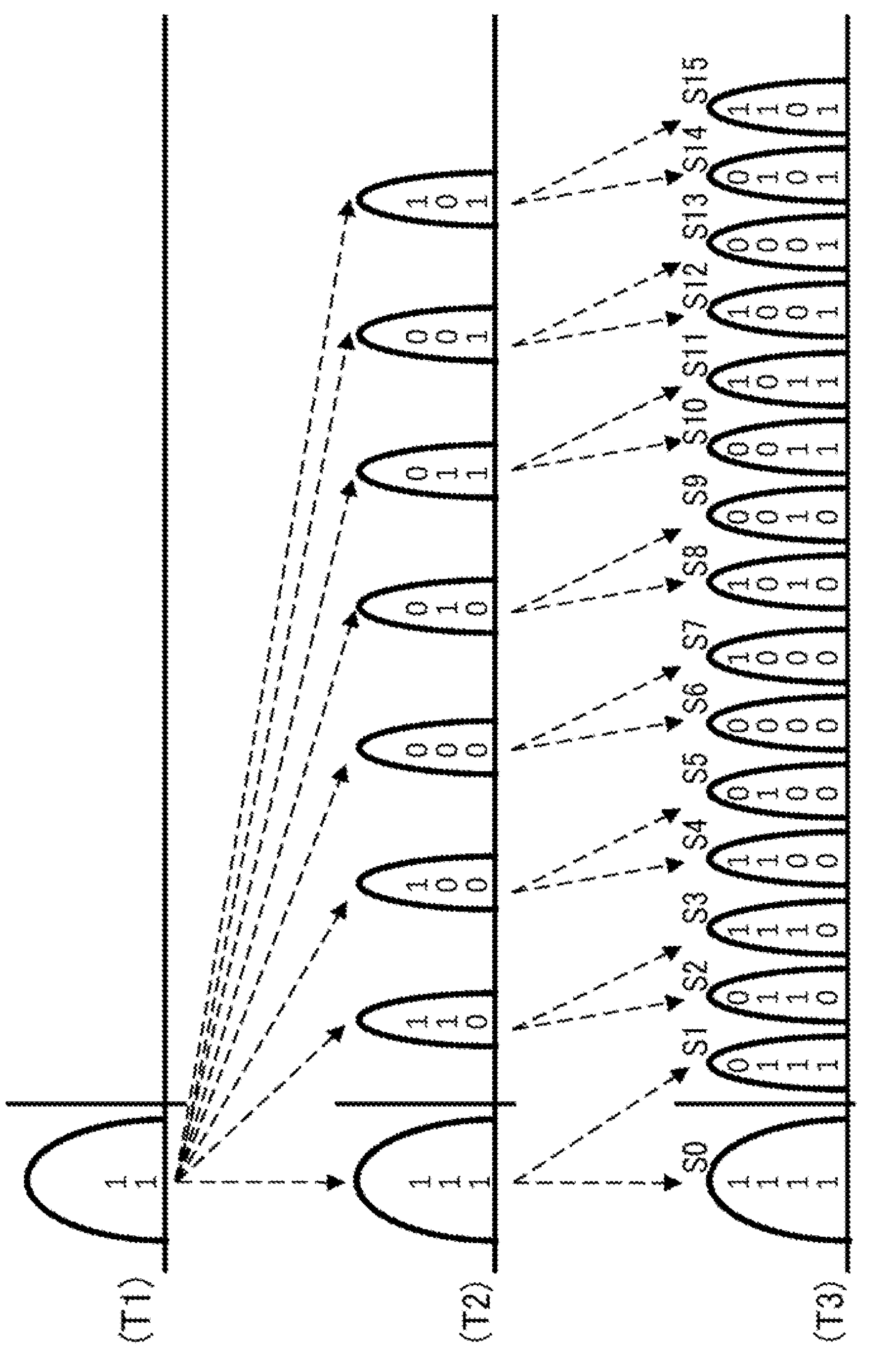
Figure 102A:
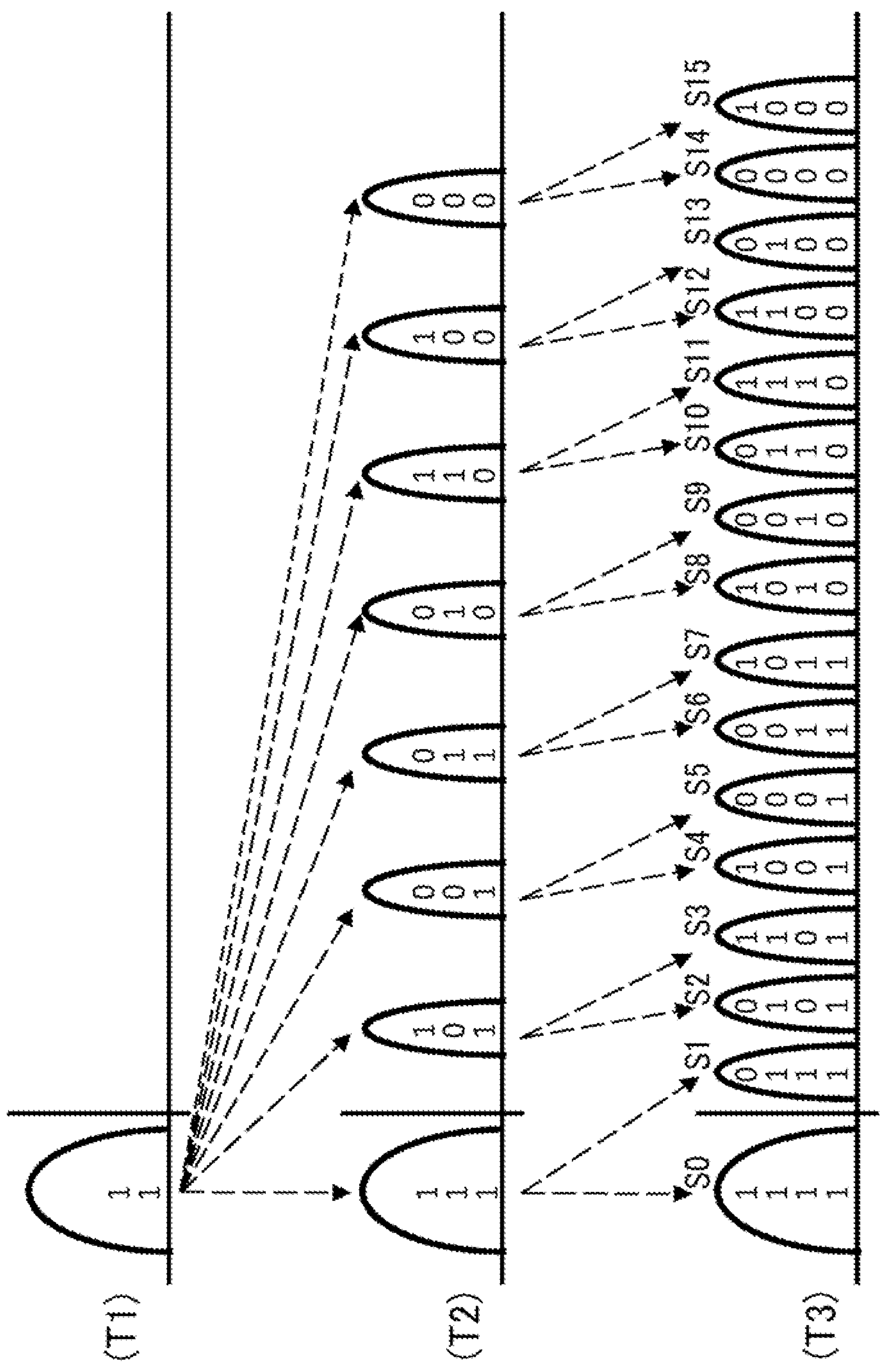

FIG. 99 is a diagram illustrating another modification of 1-2-6-6 data coding;

FIG. 100 is a diagram illustrating another modification of 1-2-6-6 data coding;

FIG. 101A is a diagram illustrating each threshold region after programming in the fourth embodiment;

FIG. 1016 is a diagram illustrating 4-bit data assigned to each threshold region in FIG. 103A;

FIG. 102A is a diagram illustrating a threshold region according to a modification of the fourth embodiment;

FIG. 1026 is a diagram illustrating each threshold region after the program assigned to each threshold region in FIG. 101A; and FIG. 103 is a diagram illustrating a modification of 1-2-4-8 data coding.

DETAILED DESCRIPTION

According to one embodiment, a memory system has a nonvolatile memory which comprises a plurality of memory cells capable of storing 4-bit data of first to fourth bits by sixteen threshold regions including a first threshold region indicating an erased state for erasing data and second to sixteenth threshold regions having higher voltage levels than a voltage level of the first threshold region and indicating a written state for writing data, and a controller configured to cause the nonvolatile memory to execute a first program for writing data of the first bit and the second bit and then cause the nonvolatile memory to execute a second program for writing data of the third bit and the fourth bit. Among fifteen boundaries existing between adjacent threshold regions among the first to sixteenth threshold regions, the number of first boundaries used for determining a value of the data of the first bit, the number of second boundaries used for determining a value of the data of the second bit, the number of third boundaries used for determining a value of the data of the third bit, and the number of fourth boundaries used for determining a value of the data of the fourth bit are 1, 4, 5, 5 or 4, 1, 5, 5 in order, the controller is configured to cause the nonvolatile memory to execute the first program such that the threshold region in the memory cell is any threshold region of a seventeenth threshold region indicating an erased state for erasing data and eighteenth to twentieth threshold regions having higher voltage levels than a voltage level of the seventeenth threshold region and indicating a written state for writing data according to the data of the first bit and the second bit, the n-th threshold region has a higher voltage level than the (n−1)-th threshold region (n is a natural number of two or more and sixteen or less), the k-th threshold region has a higher voltage level than the (k−1)-th threshold region (k is a natural number of eighteen or more and twenty or less), the controller is configured to cause the nonvolatile memory to execute the second program such that the threshold region in the memory cell is any threshold region of four threshold regions among the first to sixteenth threshold regions from any threshold region of the seventeenth to twentieth threshold regions according to the data of the third bit and the fourth bit, and the number of threshold regions between a threshold region having a lowest voltage level and a threshold region having a highest voltage level among the four threshold regions is four or less.

Hereinafter, an embodiment of a memory system will be described with reference to the drawings. In the following, the main components of the memory system will be mainly described. However, the memory system may include components and functions that are not illustrated or described.

First Embodiment

Figure 1:
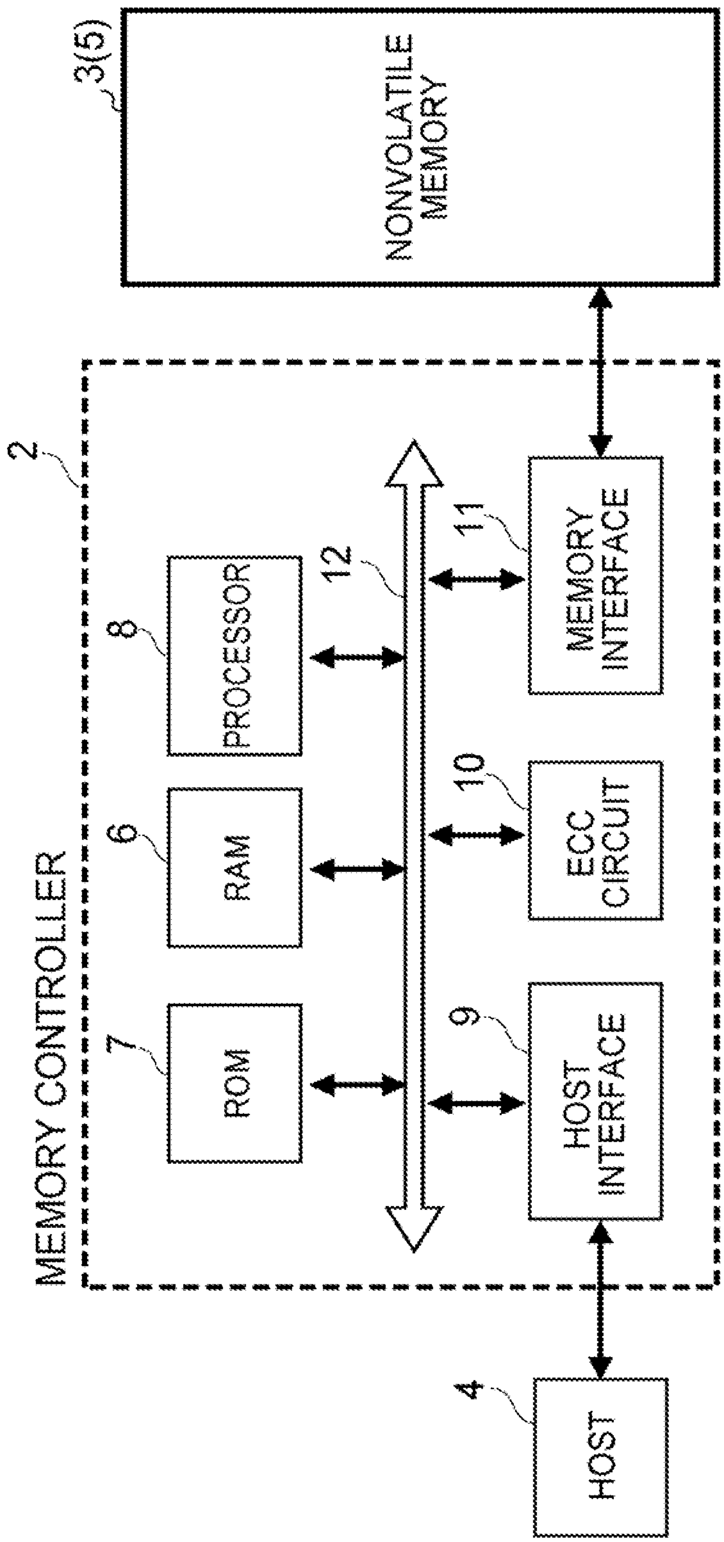
FIG. 1 is a block diagram illustrating a schematic configuration of a memory system according to a first embodiment.

FIG. 1 is a block diagram illustrating a schematic configuration of a memory system 1 according to a first embodiment. The memory system 1 in FIG. 1 includes a memory controller 2 and a nonvolatile memory 3. The memory system 1 in FIG. 1 can be connected to a host processor (hereinafter simply referred to as a host) 4. The host 4 is an electronic device such as a personal computer or a mobile terminal.

The nonvolatile memory 3 is a memory that stores data in a nonvolatile manner, and includes, for example, a NAND flash memory (hereinafter also referred to as a NAND memory) 5. In this embodiment, an example will be described in which the nonvolatile memory 3 is a 4-bit/Cell (QLC: Quad Level Cell) NAND memory 5 having memory cells capable of storing 4-bit data per memory cell. The nonvolatile memory 3 according to this embodiment has a three-dimensional structure in which memory cells are stacked three-dimensionally. The nonvolatile memory 3 includes a plurality of memory cells capable of storing the first to fourth bit data by a threshold region indicating an erased state in which data is erased, and fifteen threshold regions which have higher voltage levels than a voltage level of the threshold region indicating the erased state and indicate a written state in which data is written.

The memory controller 2 controls the writing of data to the nonvolatile memory 3 in accordance with a write command from the host 4. The memory controller 2 controls the reading of data from the nonvolatile memory 3 in accordance with a read command from the host 4. The memory controller 2 includes a random access memory (RAM) 6, a read only memory (ROM) 7, a processor 8, a host interface 9, an error check and correct (ECC) circuit 10, and a memory interface 11. The RAM 6, the processor 8, the host interface 9, the ECC circuit 10, and the memory interface 11 are connected by a common internal bus 12.

The host interface 9 outputs the command, the user data (write data), and the like received from the host 4 to the internal bus 12. In addition, the host interface 9 transmits the user data read from the nonvolatile memory 3, the response from the processor 8, and the like to the host 4.

The memory interface 11 controls processing of writing user data and the like to the nonvolatile memory 3 and processing of reading from the nonvolatile memory 3 based on instructions from the processor 8.

The processor 8 controls the memory controller 2 in an integrated manner. The processor 8 is, for example, a central processing unit (CPU), a micro processing unit (MPU), or the like. When receiving a command from the host 4 via the host interface 9, the processor 8 performs control according to the command. For example, the processor 8 instructs the memory interface 11 to write user data and parity to the nonvolatile memory 3 in accordance with the command from the host 4. Further, the processor 8 instructs the memory interface 11 to read the user data and the parity from the nonvolatile memory 3 in accordance with a command from the host 4.

The user data is stored in the RAM 6 via the internal bus 12. The processor 8 determines a storage region (memory region) on the nonvolatile memory 3 for the user data stored in the RAM 6. The processor 8 determines a memory region on the nonvolatile memory 3 for page unit data (page data) that is a write unit. In this specification, the user data stored in one page of the nonvolatile memory 3 is defined as unit data. The unit data is generally encoded and stored as a code word in the nonvolatile memory 3, but the encoding is not essential. The memory controller 2 may store the unit data in the nonvolatile memory 3 without encoding, but FIG. 1 illustrates a configuration for encoding as one configuration example. When the memory controller 2 does not perform encoding, the page data matches the unit data. One code word may be generated based on one unit data, or one code word may be generated based on divided data obtained by dividing unit data. One code word may be generated using a plurality of unit data.

The processor 8 determines the memory region of the nonvolatile memory 3 to be a writing destination for each unit data. A physical address is assigned to the memory region of the nonvolatile memory 3. The processor 8 manages the memory region to be a writing destination of unit data using the physical address. The processor 8 specifies the determined memory region (physical address) and instructs the memory interface 11 to write the user data to the nonvolatile memory 3. On the other hand, the host 4 manages data with a logical address. For this reason, the processor 8 manages the correspondence between the logical address and the physical address of the user data. When the processor 8 receives a read command including a logical address from the host 4, the processor 8 specifies a physical address corresponding to the logical address and specifies the physical address to instruct the memory interface 11 to read user data.

In this specification, a plurality of memory cells commonly connected to one word line are defined as a memory cell group MG. One memory cell group MG is a unit for writing (programming). In this embodiment, the nonvolatile memory 3 is a NAND memory 5 of 4 bits/cell, and one memory cell group MG has a data amount of 4 bits×the number of bits. Each bit written to each memory cell corresponds to a different page. In this embodiment, the four pages of one memory cell group MG are referred to as a Lower page (first page), a Middle page (second page), an Upper page (third page), and a Top page (fourth page).

The ECC circuit 10 encodes user data stored in the RAM 6 to generate a code word. Further, the ECC circuit 10 decodes the code word read from the nonvolatile memory 3. The ECC circuit 10 corrects a bit error included in the code word read from the nonvolatile memory 3 and then decodes the bit error into user data.

The RAM 6 temporarily stores the user data received from the host 4 until the user data is stored in the nonvolatile memory 3, and temporarily stores the data read from the nonvolatile memory 3 until the data is transmitted to the host 4. The RAM 6 is a general-purpose memory such as a static random access memory (SRAM) or a dynamic random access memory (DRAM).

FIG. 1 illustrates a configuration example in which the memory controller 2 includes the ECC circuit 10 and the memory interface 11. However, the ECC circuit 10 may be built in the memory interface 11. Further, the ECC circuit 10 may be built in the nonvolatile memory 3.

When a write request is received from the host 4, the memory system 1 operates as follows. The processor 8 temporarily stores the write data in the RAM 6. The processor 8 reads the data stored in the RAM 6 and inputs the data to the ECC circuit 10. The ECC circuit 10 encodes the input data and inputs the code word to the memory interface 11. The memory interface 11 writes the input code word into the nonvolatile memory 3.

When the read request is received from the host 4, the memory system 1 operates as follows. The memory interface 11 inputs the code word read from the nonvolatile memory 3 to the ECC circuit 10. The ECC circuit 10 decodes the input code word and temporarily stores the decoded data in the RAM 6. The processor 8 transmits the data stored in the RAM 6 to the host 4 via the host interface 9. Note that the nonvolatile memory 3 may be configured of a plurality of chips, and the nonvolatile memory 3 and the memory interface 11 can be connected by a through via (TSV: Through Silicon Via).

Note that the configuration of the memory controller 2 illustrated in FIG. 1 is an example, and various other derivative forms may be made such that the internal bus 12 has a divided structure or a hierarchical structure or additional functional blocks are connected, for example.

Figure 2:
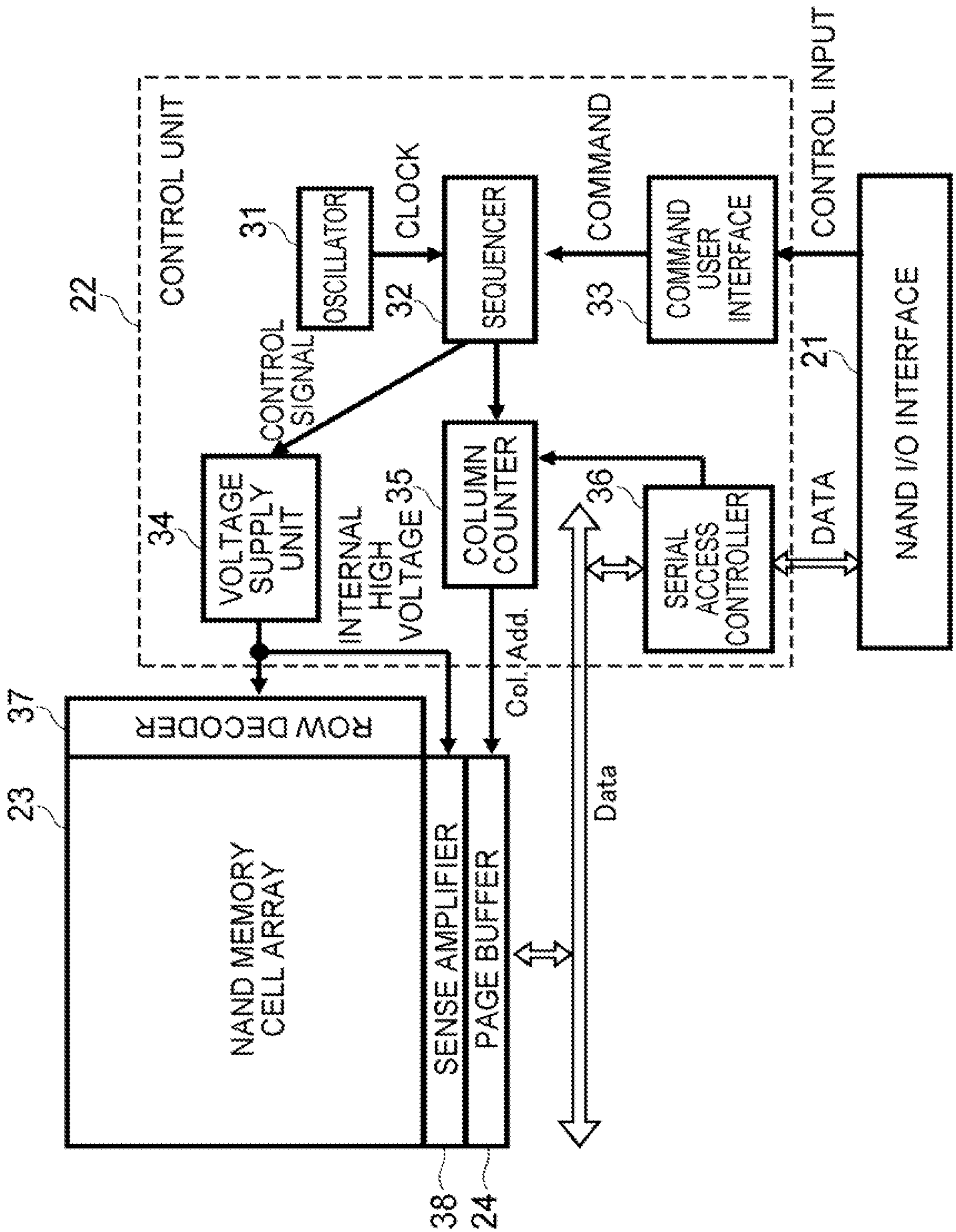
FIG. 2 is a block diagram illustrating an example of an internal configuration of a nonvolatile memory according to this embodiment.

FIG. 2 is a block diagram illustrating an example of the internal configuration of the nonvolatile memory 3 of this embodiment. The nonvolatile memory 3 includes a NAND I/O interface 21, a control unit 22, a NAND memory cell array (memory cell unit) 23, and a page buffer 24. The nonvolatile memory 3 is formed on a semiconductor substrate (for example, a silicon substrate), for example, and formed into a chip.

The control unit 22 controls the operation of the nonvolatile memory 3 based on the command from the memory controller 2 via the NAND I/O interface 21. Specifically, when a write request is input, the control unit 22 performs control to write the data requested to be written to a specified address on the NAND memory cell array 23. In addition, when a read request is input, the control unit 22 reads the data requested to be read from the NAND memory cell array 23 and outputs the data to the memory controller 2 via the NAND I/O interface 21. The page buffer 24 is a buffer that temporarily stores the data input from the memory controller 2 when writing to the NAND memory cell array 23 and temporarily stores the data read from the NAND memory cell array 23.

The control unit 22 includes an oscillator 31, a sequencer 32, a command user interface 33, a voltage supply unit 34, a column counter 35, and a serial access controller 36. The NAND memory cell array 23 includes a row decoder 37 and a sense amplifier 38.

The NAND I/O interface 21 is a circuit for transmitting and receiving IO signals and control signals to and from the memory controller 2. The command user interface 33 acquires the command and the address among the command, the address, and the data received from the memory controller 2 via the IO signal line based on the control signal. The command user interface 33 passes the acquired command and address to the sequencer 32.

The oscillator 31 is a circuit that generates a clock. The clock generated by the oscillator 31 is supplied to each component including the sequencer 32. The sequencer 32 is a state machine driven by the clock supplied from the oscillator 31. The sequencer 32 executes control such as access to the NAND memory cell array 23. For example, the sequencer 32 issues commands for controlling various internal voltages, operation timings, and the like in accordance with commands received from the command user interface 33. Further, the sequencer 32 supplies the block address and page address included in the address received from the command user interface 33 to the row decoder 37. Further, the sequencer 32 supplies the column counter 35 with the column address included in the address received from the command user interface 33.

The voltage supply unit 34 generates various internal voltages supplied to the word lines and various internal voltages supplied to the bit lines, and supplies the internal voltages to the row decoder 37 and the sense amplifier 38. The column counter 35 sequentially advances the column address according to the control signal supplied from the serial access controller 36 with the column address supplied from the sequencer 32 as the head during the program operation or the read operation.

The page buffer 24 sequentially stores the data received from the serial access controller 36 in the column address region designated by the column counter 35 during the program operation. Further, during the read operation, the page buffer 24 sequentially sends the data at the column address specified by the column address among the stored data to the serial access controller 36 during the read operation.

The serial access controller 36 stores the data received serially from the NAND I/O interface 21 for each bit width of the IO signal line in the page buffer 24 during the program operation. Further, the serial access controller 36 sends the data received serially from the page buffer 24 for each bit width of the IO signal line to the NAND I/O interface 21 during the read operation.

The row decoder 37 decodes a block address and a page address during the program operation and the read operation, and selects a word line corresponding to a page to be accessed included in the access destination block BLK. Each row decoder 37 applies an appropriate voltage to the selected word line and the unselected word line.

In the program operation, the sense amplifier 38 transfers the corresponding data stored in the page buffer 24 to the memory cell transistor. In the read operation, the sense amplifier 38 senses data read from the selected word line to the bit line and stores the obtained data in the page buffer 24. The data stored in the page buffer 24 is sent to the memory controller 2 via the serial access controller 36 and the NAND I/O interface 21.

Figure 3:
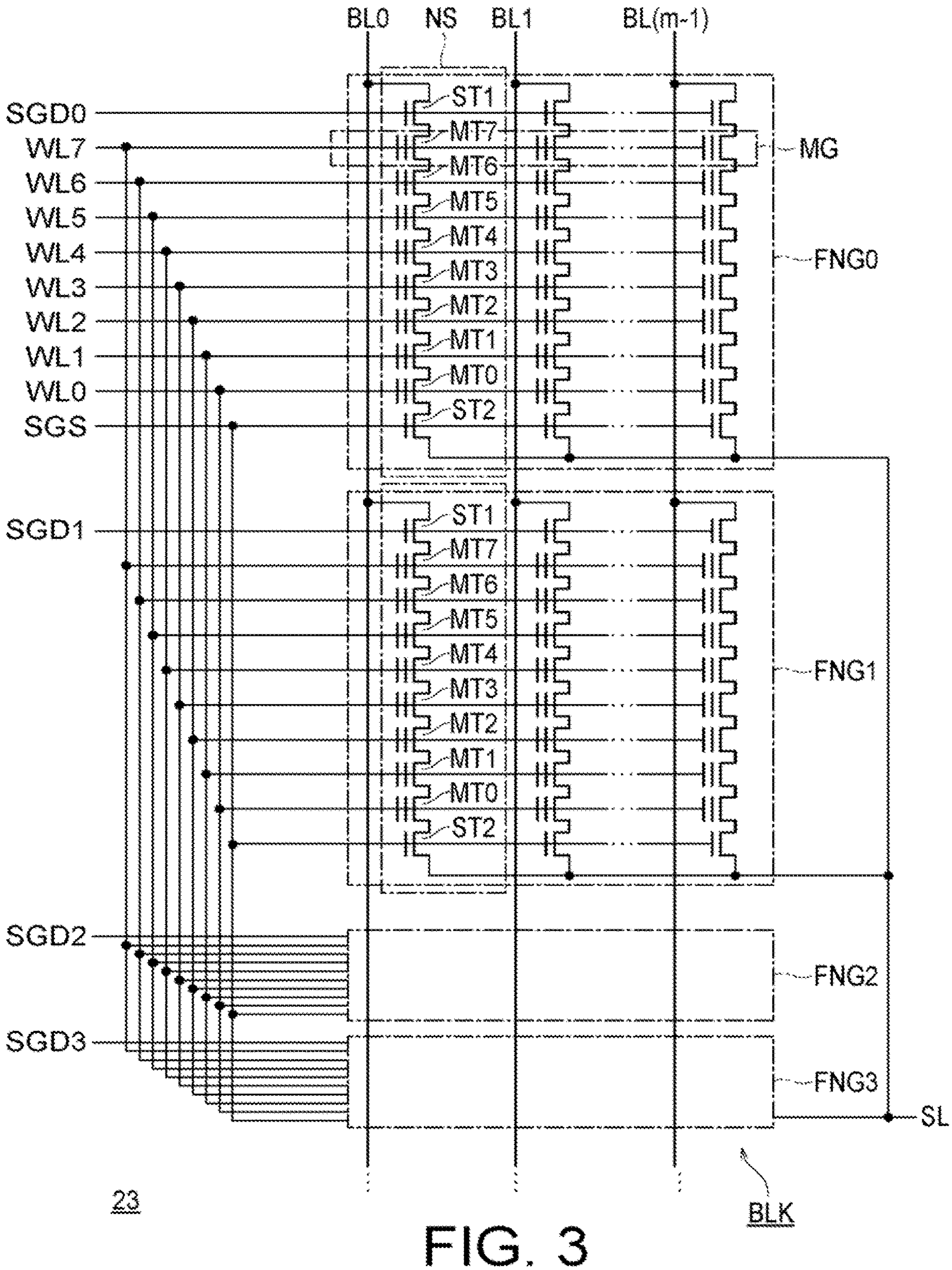
FIG. 3 is a circuit diagram illustrating an example of a memory cell array having a three-dimensional structure.

FIG. 3 is a circuit diagram illustrating an example of the NAND memory cell array 23 having a three-dimensional structure. FIG. 3 illustrates a circuit configuration of one block BLK among a plurality of blocks in the NAND memory cell array 23 having a three-dimensional structure. The other blocks of the NAND memory cell array 23 have the same circuit configuration as that of FIG. 3. This embodiment can also be applied to a memory cell having a two-dimensional structure.

As illustrated in FIG. 3, the block BLK has, for example, four fingers FNG (FNG0 to FNG3). Each finger FNG includes a plurality of NAND strings NS. Each of the NAND strings NS includes, for example, eight memory cell transistors MT (MT0 to MT7) connected in cascade and select transistors ST1 and ST2. In this specification, each finger FNG may be referred to as a string St.

Note that the number of memory cell transistors MT in the NAND string NS is not limited to eight. The memory cell transistor MT is arranged between the select transistors ST1 and ST2 such that the current path thereof is connected in series. The current path of the memory cell transistor MT7 on one end side of the series connection is connected to one end of the current path of the select transistor ST1, and the current path of the memory cell transistor MT0 on the other end side is connected to one end of the current path of the select transistor ST2.

The gates of the select transistors ST1 of the fingers FNG0 to FNG3 are commonly connected to select gate lines SGD0 to SGD3, respectively. On the other hand, the gates of the select transistors ST2 are commonly connected to the same select gate line SGS between the plurality of fingers FNG. The control gates of the memory cell transistors MT0 to MT7 in the same block BLK are commonly connected to the word lines WL0 to WL7, respectively. That is, the word lines WL0 to WL7 and the select gate line SGS are connected in common between a plurality of fingers FNG0 to FNG3 in the same block BLK, whereas the select gate line SGD is independent for each of the fingers FNG0 to FNG3 even in the same block BLK.

The word lines WL0 to WL7 are connected to the control gate electrodes of the memory cell transistors MT0 to MT7 configuring the NAND string NS, respectively, and the i-th memory cell transistor MTi (i=0 to n) in each NAND string NS in the same finger FNG is commonly connected by the same word line WLi (i=0 to n). That is, the control gate electrodes of the memory cell transistors MTi in the same row in the block BLK are connected to the same word line WLi.

Each NAND string NS is connected to the word line WLi and also to the bit line. Each memory cell in each NAND string NS can be identified by an address for identifying the word line WLi and select gate lines SGD0 to SGD3 and an address for identifying the bit line. As described above, the data in the memory cells (memory cell transistors MT) in the same block BLK are erased collectively. On the other hand, data reading and writing are performed in units of physical sectors MS. One physical sector MS includes a plurality of memory cells connected to one word line WLi and belonging to one finger FNG.

The memory controller 2 performs writing (programming) in units of all NAND strings NS connected to one word line in one finger. For this reason, the unit of the amount of data to be programmed by the memory controller 2 is 4 bits×the number of bit lines.

During the read operation and the program operation, one word line WLi and one select gate line SGD are selected according to the physical address, and the physical sector MS is selected. In this specification, writing data to a memory cell is called a program as necessary.

Figure 4:
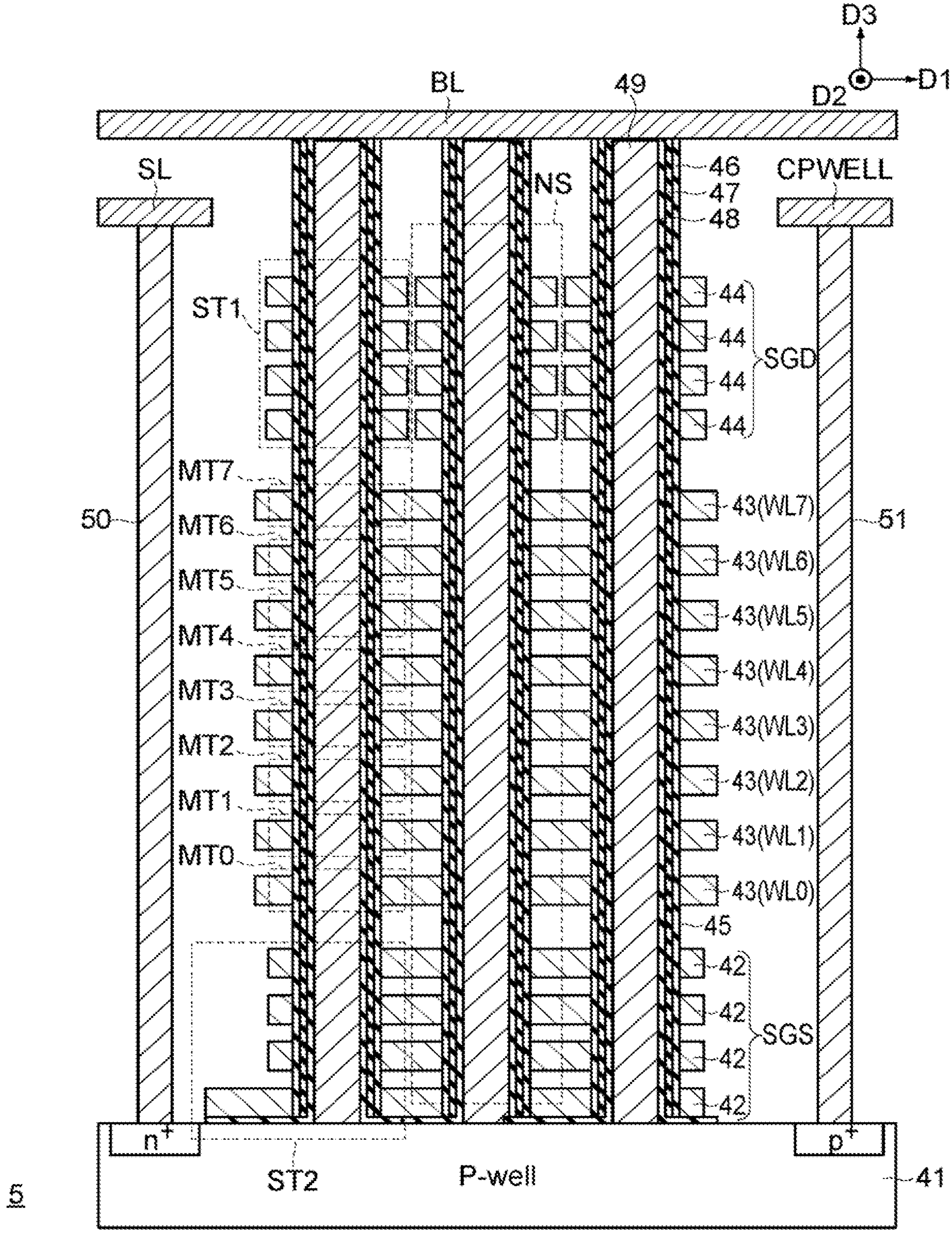
FIG. 4 is a cross-sectional view of a partial region of a memory cell array of a NAND memory having a three-dimensional structure.

FIG. 4 is a cross-sectional view of a partial region of the NAND memory cell array 23 of the NAND memory 5 having a three-dimensional structure. As illustrated in FIG. 4, a plurality of NAND strings NS are formed in a vertical direction on a p-type well region (P-well) 41 of a semiconductor substrate. That is, on the p-type well region 41, a plurality of wiring layers 42 that function as select gate lines SGS, a plurality of wiring layers 43 that function as word lines WLi, and a plurality of wiring layers 44 that function as select gate lines SGD are formed in the vertical direction.

A memory hole 45 that penetrates through the wiring layers 42, 43, and 44 and reaches the p-type well region 41 is formed. A block insulating film 46, a charge storage layer 47, and a gate insulating film 48 are sequentially formed on the side surface of the memory hole 45, and a conductive film 49 is embedded in the memory hole 45. The conductive film 49 functions as a current path of the NAND string NS, and is a region where a channel is formed during the operation of the memory cell transistor MT and the select transistors ST1 and ST2.

In each NAND string NS, the select transistor ST2, the plurality of memory cell transistors MT, and the select transistor ST1 are sequentially stacked on the p-type well region 41. On the upper end of the conductive film 49, a wiring layer functioning as the bit line BL is formed.

Furthermore, an n+-type impurity diffusion layer and a p+-type impurity diffusion layer are formed in the surface of the p-type well region 41. A contact plug 50 is formed on the n+-type impurity diffusion layer, and a wiring layer functioning as a source line SL is formed on the contact plug 50. A contact plug 51 is formed on the p+-type impurity diffusion layer, and a wiring layer functioning as a well wiring CPWELL is formed on the contact plug 51. The well wiring CPWELL is used for applying an erasing voltage.

A plurality of NAND memory cell arrays 23 illustrated in FIG. 4 are arranged in the depth direction of the paper surface of FIG. 4, and one finger FNG is formed by a set of the plurality of NAND strings NS arranged in a line in the depth direction. The other fingers FNG are formed in a left-right direction in FIG. 4, for example. FIG. 3 illustrates four fingers FNG0 to FNG3, but FIG. 4 illustrates an example in which three fingers are arranged between the contact plugs 50 and 51.

Figure 5:
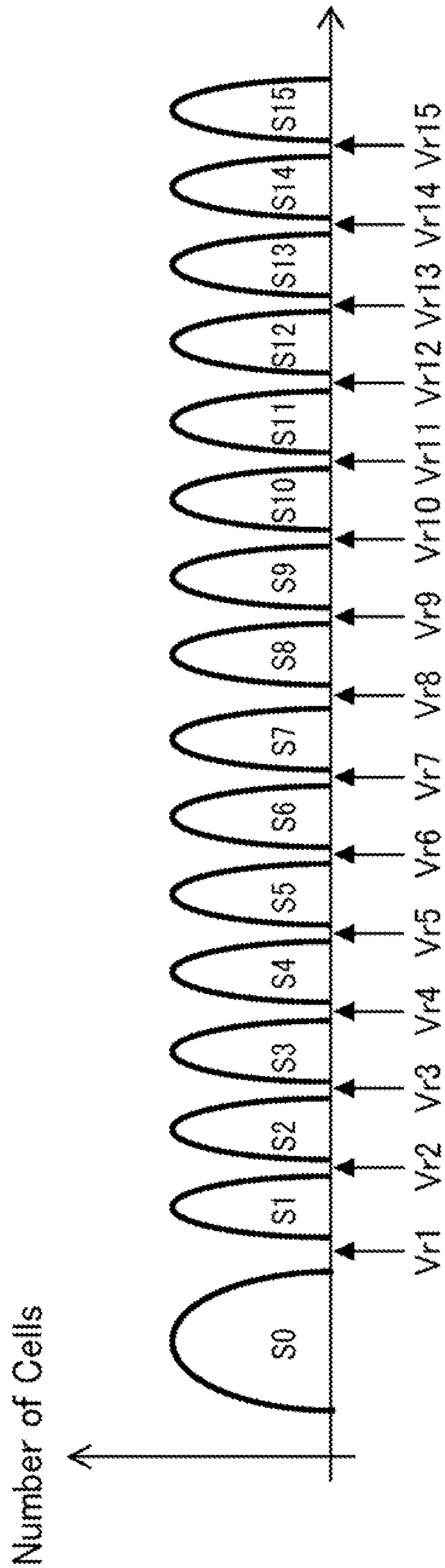
FIG. 5 is a diagram illustrating an example of a threshold region according to the first embodiment.

FIG. 5 is a diagram illustrating an example of a threshold region according to the first embodiment. FIG. 5 illustrates an example of the distribution of threshold regions of the nonvolatile memory 3 of 4 bits/cell. In the nonvolatile memory 3, information is stored by the charge amount of electrons stored in the charge storage layer 47 of the memory cell. Each memory cell has a threshold voltage corresponding to the charge amount of electrons. A plurality of data values stored in the memory cell are respectively associated with a plurality of regions (threshold regions) having different threshold voltages.

In FIG. 5, S0 to S15 indicate threshold distributions in sixteen threshold regions. The horizontal axis in FIG. 5 represents the threshold voltage, and the vertical axis represents the number of memory cells (number of cells). The threshold distribution is a range where the threshold varies. Thus, each memory cell has sixteen threshold regions partitioned by fifteen boundaries, and each threshold region has a unique threshold distribution.

In this embodiment, the region where the threshold voltage is less than or equal to Vr1 is called a region S0, the region where the threshold voltage is greater than Vr1 and less than or equal to Vr2 is called a region S1, the region where the threshold voltage is greater than Vr2 and less than or equal to Vr3 is called a region S2, and the region where the threshold voltage is greater than Vr3 and less than or equal to Vr4 is called a region S3. In this embodiment, the region where the threshold voltage is greater than Vr4 and less than or equal to Vr5 is referred to as a region S4, the region where the threshold voltage is greater than Vr5 and less than or equal to Vr6 is referred to as a region S5, the region where the threshold voltage is greater than Vr6 and less than or equal to Vr7 is referred to as a region S6, and the region where the threshold voltage is greater than Vr7 and less than or equal to Vr8 is referred to as a region S7. In this embodiment, the region where the threshold voltage is greater than Vr8 and less than or equal to Vr9 is referred to as a region S8, the region where the threshold voltage is greater than Vr9 and less than or equal to Vr10 is referred to as region S9, the region where the threshold voltage is greater than Vr10 and less than or equal to Vr11 is referred to as a region S10, and the region where the threshold voltage is greater than Vr11 and less than or equal to Vr12 is referred to as a region S11. In this embodiment, the region where the threshold voltage is greater than Vr12 and less than or equal to Vr13 is referred to as a region S12, the region where the threshold voltage is greater than Vr13 and less than or equal to Vr14 is referred to as a region S13, the region where the threshold voltage is greater than Vr14 and less than or equal to Vr15 is referred to as a region S14, and the region where the threshold voltage is greater than Vr15 is referred to as a region S15.

The threshold distributions corresponding to the regions S0 to S15 are referred to as first to sixteenth distributions. Vr1 to Vr15 are threshold voltages that serve as boundaries between the threshold regions.

In the nonvolatile memory 3, a plurality of data values are respectively associated with a plurality of threshold regions of the memory cell. This correspondence is called data coding. This data coding is determined in advance, and when data is written (programmed), charges are injected into the charge storage layer 47 in the memory cell so as to be within the threshold region corresponding to the data value stored in accordance with the data coding. At the time of reading, a read voltage is applied to the memory cell, and the data logic is determined depending on whether the threshold of the memory cell is lower or higher than the read voltage.

When data is read, the logic of the data is determined depending on whether the threshold is lower or higher than the read level at the boundary to be read. A case where the threshold is the lowest means the "erased" state, and all bits of data are defined as "1". When the threshold is higher than the "erase" state, it is in a "programmed" state, and the data is defined as "1" or "0" according to the coding.

FIG. 6 is a diagram illustrating an example of data coding according to the first embodiment. In this embodiment, the sixteen threshold regions illustrated in FIG. 5 correspond to sixteen data values of 4 bits, respectively. The relationship between the threshold voltage and the data values of the bits corresponding to the Top, Upper, Middle, and Lower pages is as follows.

A memory cell of which the threshold voltage is in the S0 region is in a state of storing "1111".

A memory cell of which the threshold voltage is in the S1 region is in a state of storing "0111".

A memory cell of which the threshold voltage is in the S2 region is in a state of storing "0101".

A memory cell of which the threshold voltage is in the S3 region is in a state of storing "0001".

A memory cell of which the threshold voltage is in the S4 region is in a state of storing "0011".

A memory cell of which the threshold voltage is in the S5 region is in a state of storing "1011".

A memory cell of which the threshold voltage is in the S6 region is in a state of storing "1001".

A memory cell of which the threshold voltage is in the S7 region is in a state of storing "1101".

A memory cell of which the threshold voltage is in the S8 region is in a state of storing "1100".

A memory cell of which the threshold voltage is in the S9 region is in a state of storing "1000".

A memory cell of which the threshold voltage is in the S10 region is in a state of storing "0000".

A memory cell of which the threshold voltage is in the S11 region is in a state of storing "0100".

A memory cell of which the threshold voltage is in the S12 region is in a state of storing "0110".

A memory cell of which the threshold voltage is in the S13 region is in a state of storing "1110".

A memory cell of which the threshold voltage is in the S14 region is in a state of storing "1010".

A memory cell of which the threshold voltage is in the S15 region is in a state of storing "0010".

Thus, the logic of 4-bit data in each memory cell can be expressed for each threshold voltage region. When the memory cell is in an unwritten state ("erased" state), the threshold voltage of the memory cell is in the S0 region. In the codes shown here, only one bit of data changes between any two adjacent states such that data "1111" is stored in the S0 (erase) state, and data "0111" is stored in the S1 state. As described above, the coding illustrated in FIG. 6 is a Gray code in which only one bit of data changes between any two adjacent regions.

In the coding of this embodiment illustrated in FIG. 6, the threshold voltage that serves as the boundary for determining the bit value of each page is as follows.

The threshold voltages that serve as boundaries for determining the bit value of the Top page are Vr1, Vr5, Vr10, Vr13, and Vr15.

The threshold voltages that serve as boundaries for determining the bit value of the Upper page are Vr3, Vr7, Vr9, Vr11, and Vr14.

The threshold voltages that serve as boundaries for determining the bit value of the Middle page are Vr2, Vr4, Vr6, and Vr12.

The threshold voltage that serves as a boundary for determining the bit value of the Lower page is Vr8.

In this way, the numbers (hereinafter referred to as a boundary number) of the threshold voltages for determining the bit value are 1, 4, 5, and 5 on the Lower page, Middle page, Upper page, and Top page, respectively. Hereinafter, such coding is referred to as 1-4-5-5 coding by using the respective boundary numbers of the Lower page, Middle page, Upper page, and Top page.

The first characteristic feature here is that the maximum number of boundaries at which the bit value of each page changes is five. When sixteen states are expressed by 4 bits, the minimum value of the maximum boundary number is four, and the coding in FIG. 6 is only one more than this, and the bias of the bit error is reduced.

The second characteristic feature is that the number of the boundaries of the Lower page is one, and the number of the boundaries of the Middle page is four. The program can be made in two stages of the first stage program that combines the Lower page and the Middle page and the second stage program that combines the Upper page and the Top page. In addition, the third characteristic feature is that the change width from the threshold region generated by the first stage program to the threshold region generated by the second stage program is small. That is, the change width of the threshold voltage is small. These features will be described in detail later.

The control unit 22 of the nonvolatile memory 3 controls the program to the NAND memory cell array 23 and the reading from the NAND memory cell array 23 based on the coding illustrated in FIG. 6.

In the three-dimensional memory cell, the miniaturization of the memory cell does not progress as much as the two-dimensional memory cell. For this reason, in the three-dimensional memory cell, the inter-cell interference is small if the generation is such that the interval between adjacent memory cells is wide. In this case, generally, a method is employed in which all bits of each memory cell are programmed simultaneously, for example, all pages are programmed simultaneously if all bits are allocated to different pages.

When all the bits of each memory cell are programmed simultaneously, combination of the data coding is not particularly limited. The positioned region among the sixteen threshold regions may be determined based on the data of all bits, and the region of S0 in the erased state may be programmed to become the determined threshold region. In this case, generally, data coding such as 4-4-3-4 coding in which the maximum number of boundaries becomes a minimum value is employed. In the 4-4-3-4 coding, when fifteen boundaries between sixteen threshold regions are distributed to four pages, four boundaries are distributed to the Lower page, four boundaries are distributed to the Middle page, three boundaries are distributed to the Upper page, and four boundaries are distributed to the Top page. In this coding, since the deviation in the number of boundaries between pages is small, as a result, the deviation in the bit error rate between pages is reduced. This is because most of the causes of bit errors are caused by the threshold shifting to the adjacent threshold region, and the number of bit errors increases as the number of boundaries in the page increases. This is also effective for suppressing deterioration in response performance of the memory system 1 in response to the write request from the host 4, cost, and power consumption since the ECC correction capability necessary to correct the page data error must be strengthened even if the error rate as a memory cell is the same. Also, the reading speed bias caused by the bias of the boundary number is reduced.

In addition, in the 4-bit/Cell NAND memory 5, the interval between adjacent threshold regions is narrowed, so the influence of inter-cell interference is greater than that of the 1-bit/Cell or 2-bit/Cell NAND memory 5. For this reason, in the NAND memory 5 of the generation that has advanced recently in miniaturization, generally, a program method (Foggy-Fine program) is employed which gradually injects charges into the charge storage layer 47 of the memory cell by using a plurality of program stages, for example, two program stages (hereinafter sometimes simply referred to as stages) in order to suppress inter-cell interference. In this Foggy-Fine program, the memory cell is written in the first stage (Foggy stage), and then the neighboring cell is written. Then, the second stage (Fine stage) is written after returning to the first memory cell. Each stage in this case is a program execution unit, and the program of the memory cell corresponding to one word line WLi is completed by executing two program stages.

In both the first stage program and the second stage program, the program is executed using sixteen threshold regions. The threshold distribution in the threshold region at the end of the first stage program has a wider width than the threshold distribution of the threshold region in the final data coding. That is, in the Foggy stage, Foggy (rough) writing is performed. The Foggy stage program requires all four pages of input data. Since the threshold distribution after programming of the Foggy stage is in the intermediate state in which adjacent distributions overlap each other, data cannot be read out. In the program of the Fine stage which is the second stage, the threshold region after the Foggy stage program is moved to the threshold region in the final data coding. In other words, Fine writing is performed in the Fine stage. The Fine stage program also requires all four pages of input data. Since the threshold distribution after programming the Fine stage is in the final state in which adjacent distributions are separated, data can be read after programming the Fine stage.

In the case of 4-4-3-4 coding, the deviation in the number of boundaries is small, but data input for the Foggy-Fine program requires data input for four pages at each stage. This increases the time required for data input and deteriorates the response performance of the memory system 1 in response to the write request from the host 4. In addition, in the memory system 1, the buffer amount (write buffer amount) of the write buffer for holding data for input to the NAND memory 5 is increased. The write buffer is generally assigned with a partial region of the RAM 6 in the memory system 1.

As a measure for these, in this embodiment, the memory system 1 employs 1-4-5-5 coding for the nonvolatile memory 3 having a three-dimensional structure, and further writes in page units (page by page) in two stages. Thereby, in this embodiment, even in the nonvolatile memory 3 having a three-dimensional structure, the write buffer amount of the memory controller 2 is reduced while suppressing the inter-cell interference between cells and the deviation of the bit error rate between pages.

Here, the interference between adjacent memory cells will be described. The charge stored in the charge storage layer 47 of one memory cell disturbs the electric field of the adjacent memory cell, and as a result, gives noise that fluctuates the threshold when reading the adjacent memory cell. When programming and verifying are performed under a certain electric field condition and the programming is completed, the adjacent memory cells are programmed to different charges, resulting in deterioration in reading accuracy. This interference between adjacent memory cells becomes more prominent as the memory device manufacturing technology becomes fine and the memory cell interval is reduced. The interference between adjacent memory cells is largely generated between adjacent memory cells connected to different bit lines on the same word line WLi.

The interference between adjacent memory cells can be mitigated by reducing the difference in the electric field condition between the memory cells during programming and verifying and during reading after the adjacent memory cells are programmed. As one method for reducing the interference between adjacent memory cells between adjacent memory cells connected to different bit lines on the same word line WLi, a method is provided which divides the program into a plurality of stages, and executes the program such that a large change in charge amount in the charge storage layer 47 does not occur between the stages.

In the program sequence in this embodiment, 4 bits on one word line WLi are programmed by two program stages, that is, a first stage and a second stage. Each program stage is a program execution unit, and the memory system 1 of this embodiment completes the writing of 4-bit data to the memory cell by executing the two program stages. In this embodiment, any one page of 4 bits is allocated to each of the two program stages. Specifically, Lower page data and Middle page data are allocated to the first stage program, and Upper page and Top page data are allocated to the second stage program.

Figure 7A:
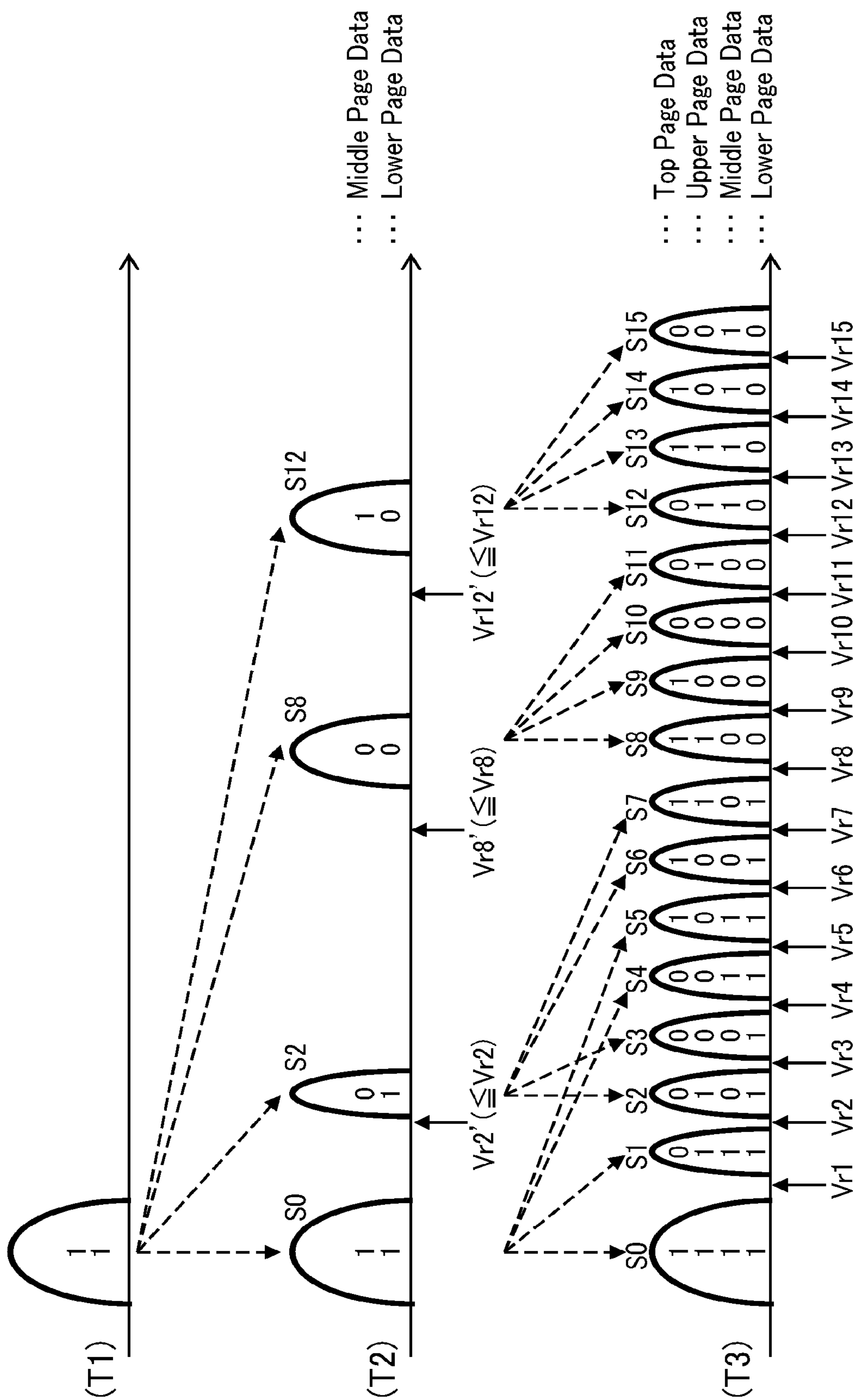
FIG. 7A is a diagram illustrating a threshold region after programming in the first embodiment.
Figure 7B:
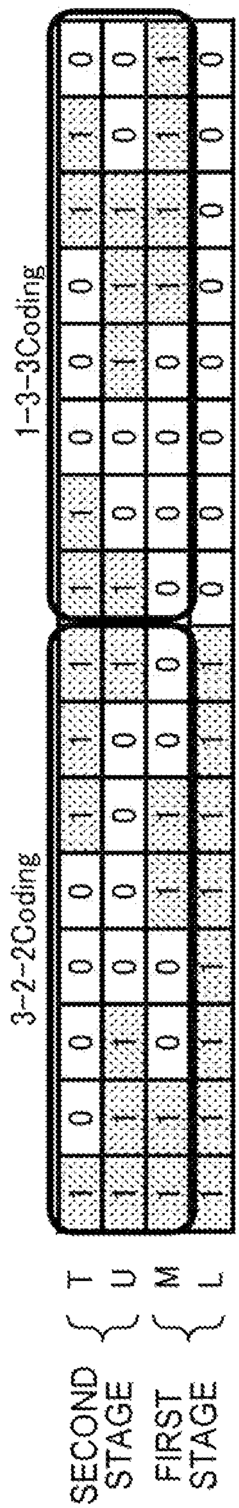
FIG. 7B is a diagram illustrating 4-bit data in each threshold region in FIG. 7A.

FIG. 7A is a diagram illustrating a threshold region after programming in the first embodiment, and FIG. 7B is a diagram illustrating 4-bit data in each threshold region in FIG. 7A. FIG. 7A illustrates the threshold region after the first stage and second stage programs are performed on the memory cell. (T1) in FIG. 7A illustrates the threshold region in the erased state, which is the initial state before programming. (T2) in FIG. 7A illustrates the threshold region after the first stage program (first program). (T3) in FIG. 7A illustrates the threshold region after the second stage program (second program).

As illustrated in (T1) of FIG. 7A, all the memory cells in the NAND memory cell array 23 have a threshold region S0 in an unwritten state ("erased" state). As illustrated in (T2) of FIG. 7A, in the first stage program, the control unit 22 of the nonvolatile memory 3 remains the threshold region S0 for each memory cell as it is according to the bit value written (stored) in the Lower page and the Middle page or moves the threshold region to a threshold region above the threshold region S0 by injecting a charge. Specifically, when both of the bit values to be written to the Lower page and the Middle page are "1", the control unit 22 does not inject charges, and when the bit value to be written to at least one of the Lower page and the Middle page is "0", the control unit 22 injects charges to move the threshold voltage higher. That is, the threshold region moves to the threshold region S2 when the bit value written to the Lower page and the Middle page is "01", the threshold region moves to the threshold region S8 when the bit value written to the Lower page and the Middle page is "00", and the threshold region moves to the threshold region S12 when the bit value written to the Lower page and the Middle page is "10".

Here, the threshold regions S8 and S12 may be coarsely programmed by increasing the width of the threshold region so that the threshold voltage is somewhat lowered. This is because the threshold region may be finally moved by the second stage program so that the interval between adjacent threshold regions becomes wide.

As a result, the memory cell is programmed to four values of levels by the data of the Lower page and the Middle page. It should be noted here that data writing in the first stage program (first program) is data writing of only the Lower page and Middle page data. The page data required for this execution may be only the Lower page and the Middle page. In addition, the threshold region after the first stage program is finally reprogrammed in the subsequent second stage program (second program), so there is no need to finely shape the threshold distribution, and high speed programming is possible. Since the data after the first stage program is seen as binary, the Lower page and Middle page data can be read out.

Further, as illustrated in (T3) of FIG. 7A, in the second stage program, two pages of the Upper page and the Top page are required for data writing. Then, the control unit 22 of the nonvolatile memory 3 performs programming so that the threshold region is finally separated into sixteen threshold regions after the second stage program. In this case, all page data can be read out.

In the second stage program, the greater the change width of the memory cell threshold from the end of the first stage program, the greater the interference between adjacent cells. Therefore, when the threshold region of the first stage changes to the threshold region of the second stage, it is preferable that the maximum value of the change width is minimized. In the example of FIG. 7A, the maximum change width of the threshold region is five threshold regions. The threshold region S0 may change to S5, and the threshold region S2 may change to S7.

Typically, writing (programming) to the memory cell is performed by applying one or more program voltage pulses to the corresponding word line. After applying each program voltage pulse, reading is performed to confirm whether or not the memory cell moves beyond the threshold boundary level. By repeating this application and reading, it is possible to move the threshold of the memory cell within a threshold region having a predetermined threshold distribution.

More specifically, when a plurality of pages are written as in the second stage, the threshold voltages of the corresponding memory cells are determined from the data of all pages to be written (in this case, the Middle page, Upper page, and Top page), and the voltage values of the plurality of program pulses are gradually increased so as to be the determined threshold voltages. The memory cells that have reached the target threshold voltages are excluded from the write targets. As described above, writing to the memory cell is not performed for each page, but is performed together for all pages to be written.

Note that the control unit 22 may continuously execute the first stage program and the second stage program for one word line WLi, but in order to reduce the influence of interference between adjacent memory cells, the program may be executed in a discontinuous order across a plurality of word lines WLi.

On the left side from the boundary position between 1 and 0 on the Lower page in FIG. 7B, the number of boundaries between 1 and 0 on the Middle page is three, the number of boundaries on the Upper page is two, the number of boundaries on the Top page is two, and 3-2-2 coding is performed. Also, 1-3-3 coding is performed on the Middle page, Upper page, and Top page on the right side from the boundary position of the Lower page. By adding these two codings, the coding becomes 1-4-5-5 data coding. In FIG. 7B and the like, the Lower page is denoted as L, the Middle page is denoted as M, the Upper page is denoted as U, and the Top page is denoted as T.

Figure 8A:
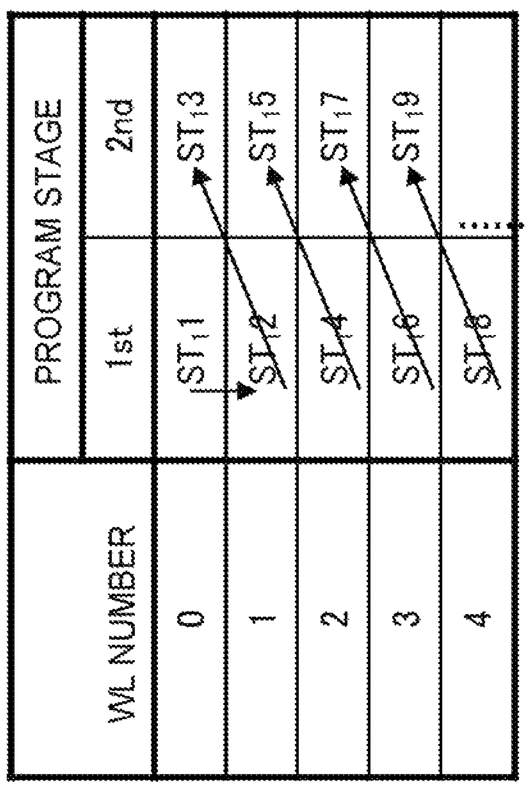
FIG. 8A is a diagram illustrating a first example of a program order according to the first embodiment.
Figure 8C:
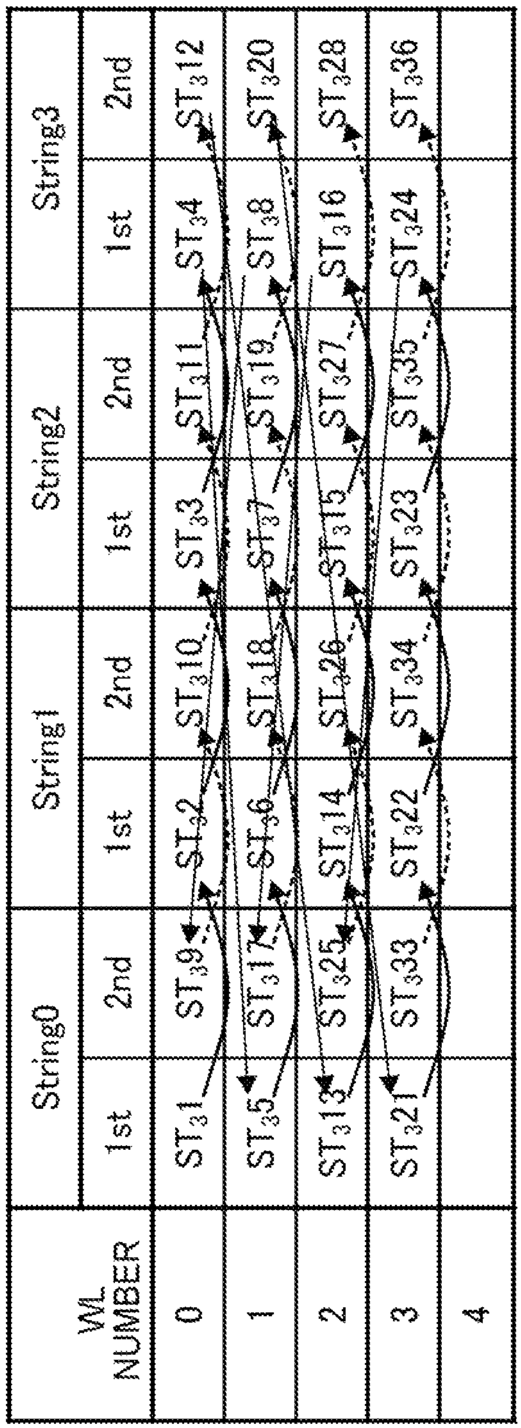
FIG. 8C is a diagram illustrating a third example of the program order according to the first embodiment.

FIG. 8A is a diagram illustrating a first example of a program order according to the first embodiment. FIG. 8B is a diagram illustrating a second example of the program order according to the first embodiment. FIG. 8C is a diagram illustrating a third example of the program order according to the first embodiment. In FIGS. 8A to 8C, programming is performed in two program stages in order to reduce the influence of interference between adjacent memory cells. FIG. 8A illustrates an example of a program order in the NAND memory 5 in which one string St is connected to each word line in each block. FIGS. 8B and 8C illustrate an example of a program order in the NAND memory 5 in which four strings St are connected to each word line in each block. In FIGS. 8B and 8C, the four strings St connected to each word line are denoted as String0 to String3.

When writing is started, the control unit 22 advances each program stage while straddling the word lines WLi in a predetermined discontinuous order. That is, the first stage and the second stage for the same word line are not continuously executed. The programming is performed in the first stage for a certain word line, and then the programming is performed in the second stage for a different word line.

When the programming is completed up to the second stage for a certain word line, and programming of the first stage and the second stage is continuously performed for the adjacent word lines, the amount of fluctuation in the threshold voltage increases. When the fluctuation amount of the threshold voltage of the adjacent word line is large, the interference between adjacent memory cells between the word lines becomes large. Therefore, in order to reduce the interference between adjacent memory cells between the word lines, it is effective to reduce the fluctuation amount of the threshold voltage of the adjacent word line after the word line is completely programmed to the second stage. In the sequence of FIG. 8A, the program stage of the adjacent word line after a certain word line is completely programmed to the second stage is only the second stage.

In a case where the programming is performed on the NAND memory 5 having the three-dimensional structure in the program order of FIG. 8A, when writing is started, the control unit 22 executes the program in the order shown in the following (1) to (9) based on the instruction from the processor 8. The control unit 22 performs the program to the NAND memory 5 based on the instruction from the processor 8, but the description based on the instruction from the processor 8 is omitted below.

(1) First, the control unit 22 executes a program ST11 of the first stage of the word line WL0.

(2) Next, the control unit 22 executes a program ST12 of the first stage of the word line WL1.

(3) Next, the control unit 22 executes a program ST13 of the second stage of the word line WL0.

(4) Next, the control unit 22 executes a program ST14 of the first stage of the word line WL2.

(5) Next, the control unit 22 executes a program ST15 of the second stage of the word line WL1.

(6) Next, the control unit 22 executes a program ST16 of the first stage of the word line WL3.

(7) Next, the control unit 22 executes a program ST17 of the second stage of the word line WL2.

(8) Next, the control unit 22 executes a program ST18 of the first stage of the word line WL4.

(9) Next, the control unit 22 executes a program ST19 of the second stage of the word line WL3.

Similarly, the control unit 22 proceeds the process obliquely upward from the lower left to the upper right in FIG. 8A. Thus, in FIG. 8A, a plurality of memory cells in the nonvolatile memory 3 include a plurality of first memory cells connected to the first word line and a plurality of second memory cells connected to the second word line adjacent to the first word line. The memory controller 2 performs the first program on the plurality of first memory cells, and then performs the first program on the plurality of second memory cells. Next, after the first program is performed on the plurality of second memory cells, the second program is performed on the plurality of first memory cells.

In a case where the programming is performed on the NAND memory 5 having the three-dimensional structure in the program order of FIG. 8B, when writing is started, the control unit 22 executes the program in the order shown in the following (11) to (24).

(11) First, the control unit 22 executes a program ST21 of a first stage of a string St0_word line WL0.

(12) Next, the control unit 22 executes a program ST22 of a first stage of a string St1_word line WL0.

(13) Next, the control unit 22 executes a program ST23 of a first stage of a string St2_word line WL0.

(14) Next, the control unit 22 executes a program ST24 of a first stage of a string St3_word line WL0.

(15) Next, the control unit 22 executes a program ST25 of a first stage of a string St0_word line WL1.

(16) Next, the control unit 22 executes a program ST26 of a second stage of the string St0_word line WL0.

(17) Next, the control unit 22 executes a program ST27 of a first stage of a string St1_word line WL1.

(18) Next, the control unit 22 executes a program ST28 of a second stage of the string St1_word line WL0.

(19) Next, the control unit 22 executes a program ST29 of a first stage of a string St2_word line WL1.

(20) Next, the control unit 22 executes a program ST210 of a second stage of the string St2_word line WL0.

(21) Next, the control unit 22 executes a program ST211 of a first stage of a string St3_word line WL1.

(22) Next, the control unit 22 executes a program ST212 of a second stage of the string St3_word line WL0.

(23) Next, the control unit 22 executes a program ST213 of a first stage of a string St0_word line WL2.

(24) Next, the control unit 22 executes a program ST214 of a second stage of the string St0_word line WL1.

Similarly, the control unit 22 proceeds the process obliquely upward from the lower left to the upper right in FIG. 8B. In FIG. 8B, the case where there are four strings St in the block has been described, but the number of strings St in the block may be three or less, or may be five or more.

In a case where the programming is performed on the NAND memory 5 having the three-dimensional structure in the program order of FIG. 8C, when writing is started, the control unit 22 executes the program in the order shown in the following (31) to (50).

(31) First, the control unit 22 executes a program ST31 of the first stage of the string St0_word line WL0.

(32) Next, the control unit 22 executes a program ST32 of the first stage of the string St1_word line WL0.

(33) Next, the control unit 22 executes a program ST33 of the first stage of the string St2_word line WL0.

(34) Next, the control unit 22 executes a program ST34 of the first stage of the string St3_word line WL0.

(35) First, the control unit 22 executes a program ST35 of the first stage of the string St0_word line WL1.

(36) Next, the control unit 22 executes a program ST36 of the first stage of the string St1_word line WL1.

(37) Next, the control unit 22 executes a program ST37 of the first stage of the string St2_word line WL1.

(38) Next, the control unit 22 executes a program ST38 of the first stage of the string St3_word line WL1.

(39) Next, the control unit 22 executes a program ST39 of the second stage of the string St0_word line WL0.

(40) Next, the control unit 22 executes a program ST310 of the second stage of the string St1_word line WL0.

(41) Next, the control unit 22 executes a program ST311 of the second stage of the string St2_word line WL0.

(42) Next, the control unit 22 executes a program ST312 of the second stage of the string St3_word line WL0.

(43) Next, the control unit 22 executes a program ST313 of the first stage of the string St0_word line WL2.

(44) Next, the control unit 22 executes a program ST314 of the first stage of the string St1_word line WL2.

(45) Next, the control unit 22 executes a program ST315 of the first stage of the string St2_word line WL2.

(46) Next, the control unit 22 executes a program ST316 of the first stage of the string St3_word line WL2.

(47) Next, the control unit 22 executes a program ST317 of the second stage of the string St0_word line WL1.

(48) Next, the control unit 22 executes a program ST318 of the second stage of the string St1_word line WL1.

(49) Next, the control unit 22 executes a program ST319 of the second stage of the string St2_word line WL1.

(50) Next, the control unit 22 executes a program ST320 of the second stage of the string St3_word line WL1.

In FIG. 8C, the case where there are four strings St in the block has been described, but the number of strings St in the block may be three or less, or may be five or more.

As described above, even when there are a plurality of strings St, the program order of each program stage of the word line WLi in one string St is the same as that in the case of one string St. In the case of the nonvolatile memory 3 having a three-dimensional structure in which a plurality of strings St exist in a block, in the program of the combination position of the word line WLi and the string St, generally, the same word line number in different strings St is programmed first, and then the procedure proceeds to the next word line number. When FIG. 8A is combined according to such an order by the number of strings St, for example, the order illustrated in FIG. 8B or FIG. 8C is obtained.

Figure 9:
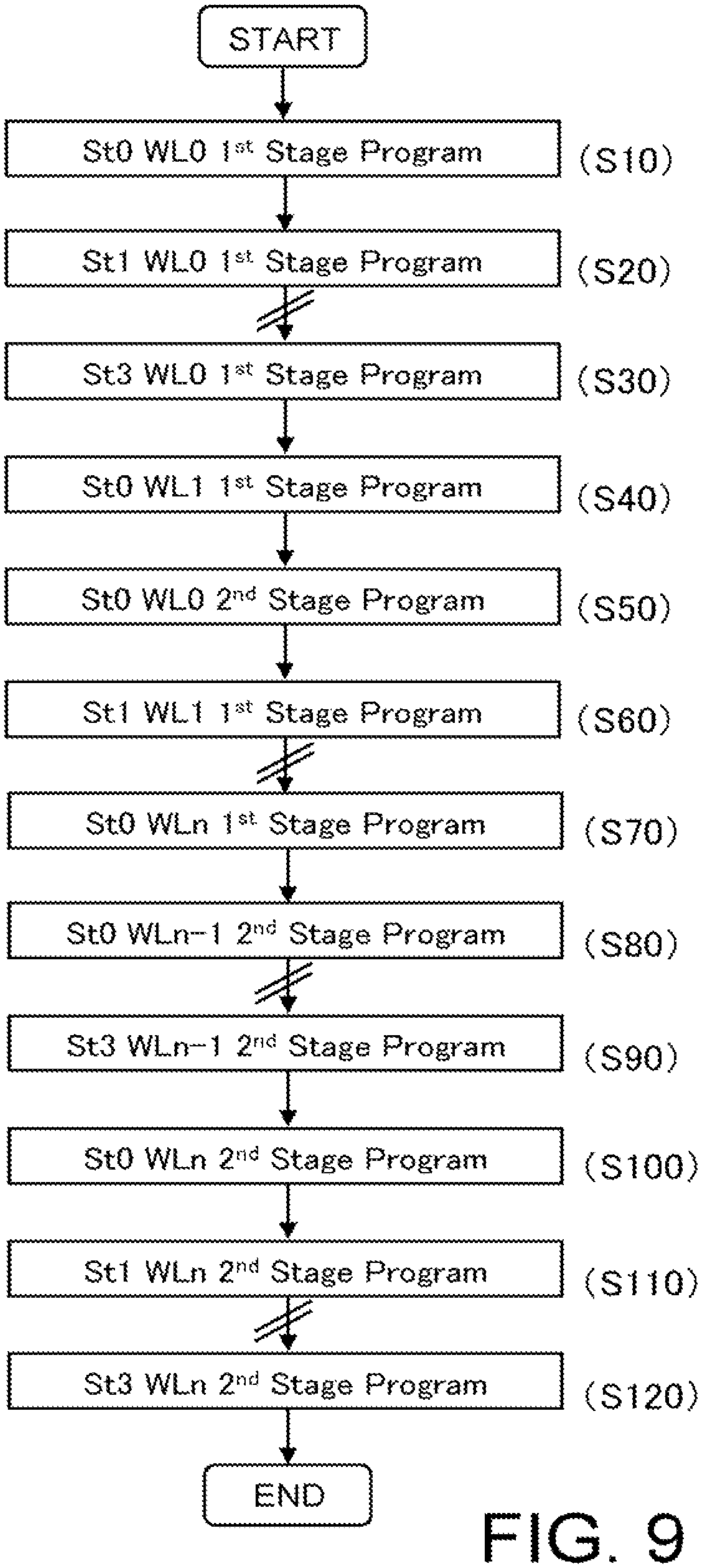
FIG. 9 is a flowchart illustrating a first example of a writing procedure for the entire one block according to the first embodiment.
Figure 10:
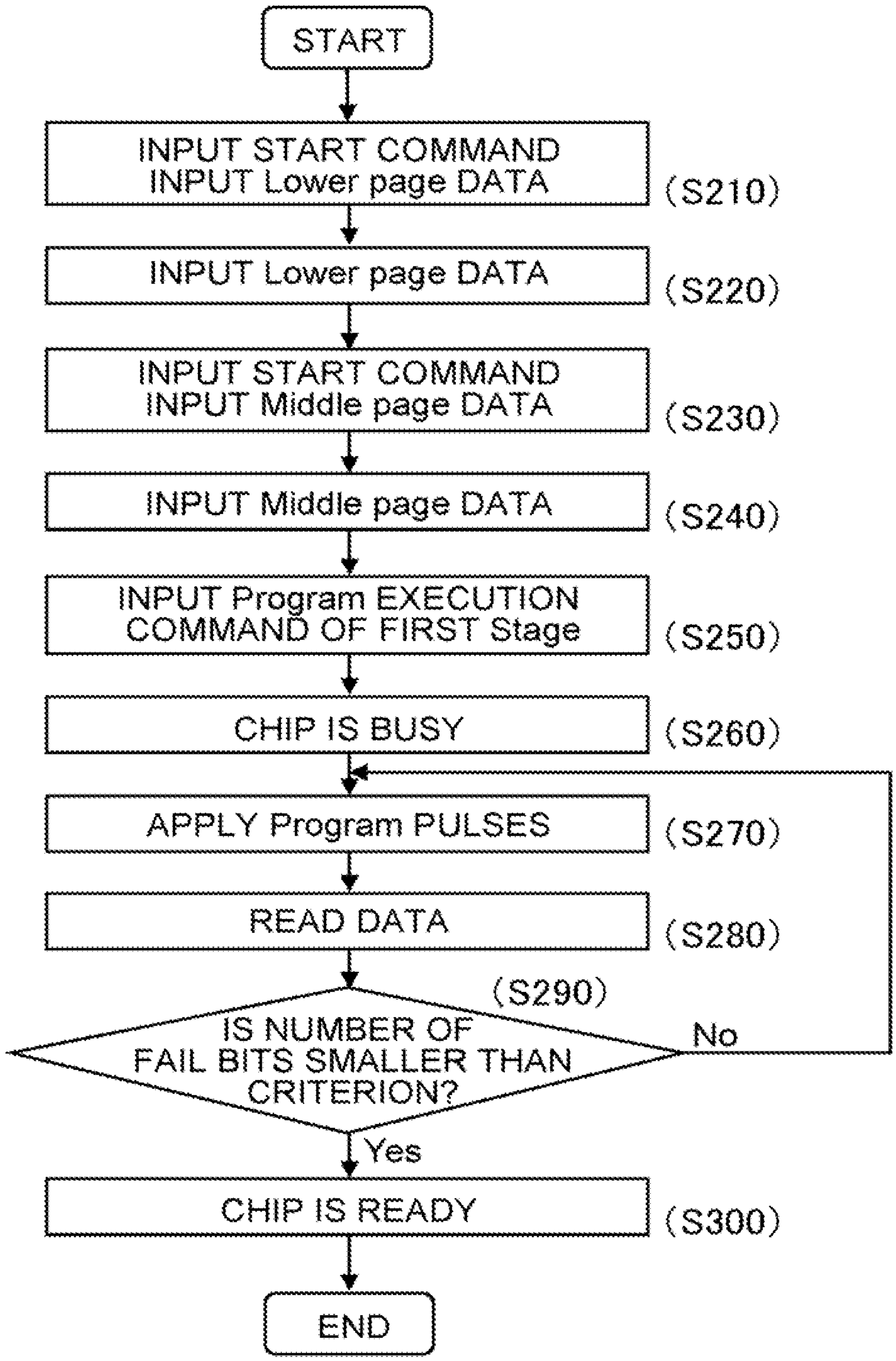
FIG. 10 is a flowchart illustrating a first example of a writing procedure in a first stage.
Figure 11:
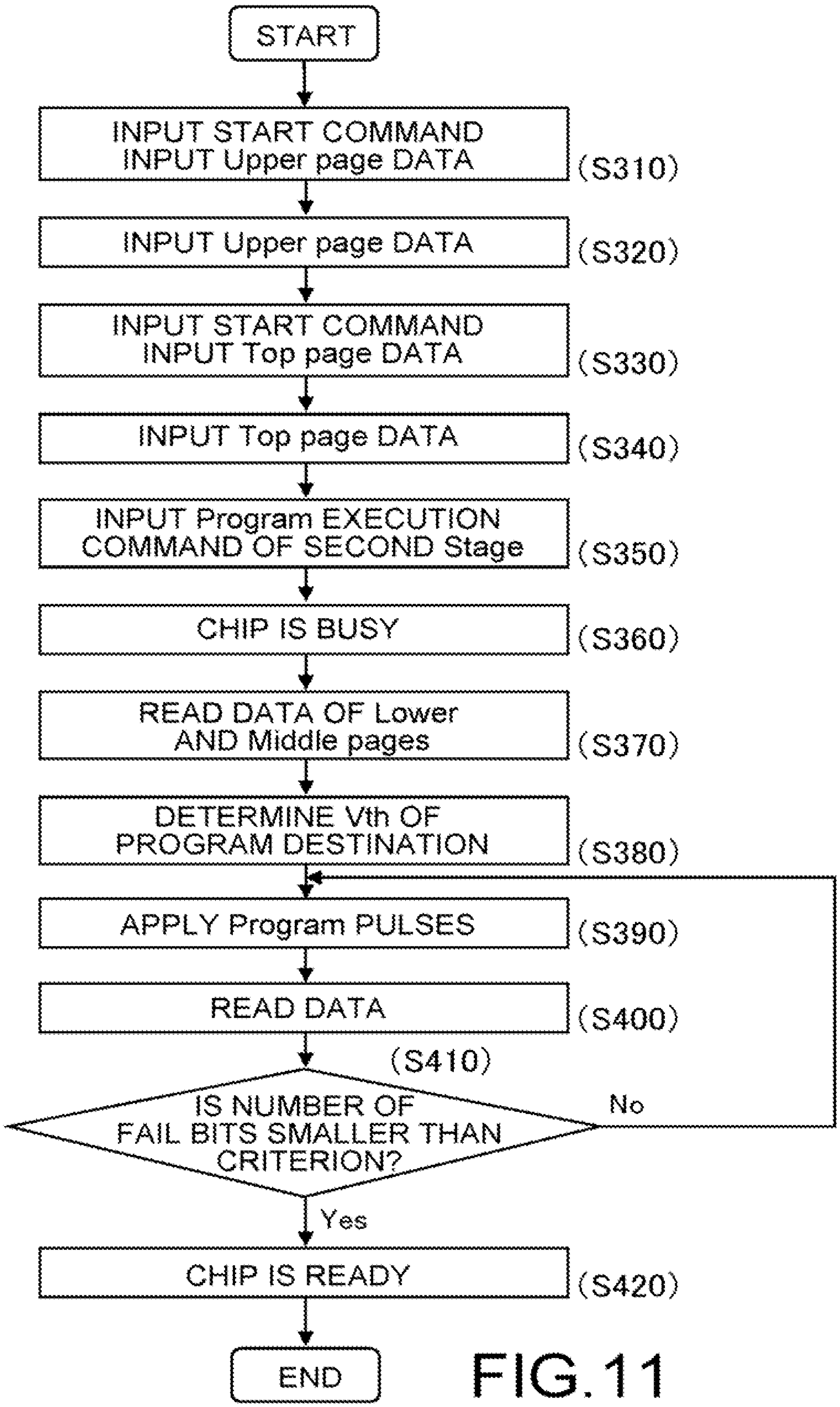
FIG. 11 is a flowchart illustrating a first example of a writing procedure in a second stage.

Here, an example of a writing procedure according to the program order according to the first embodiment will be described with reference to FIGS. 9 to 11. FIGS. 9 to 11 illustrate a writing procedure following the program order illustrated in FIG. 86 or FIG. 8C. As described above, the memory controller 2 advances the program stage while straddling the word lines WLi in a discontinuous order. Therefore, the program is executed by using a group (here, block) of certain word lines WLi as a group of program sequences.

FIG. 9 is a flowchart illustrating a first example of a writing procedure for the entire one block according to the first embodiment. Here, it is assumed that one block has n+1 word lines WLi of word lines WL0 to WLn (n is a natural number). FIG. 10 is a sub-flowchart illustrating a writing procedure in the first stage according to the first embodiment, and FIG. 11 is a sub-flowchart illustrating a writing procedure in the second stage according to the first embodiment.

As illustrated in FIG. 9, when writing is started, the control unit 22 executes the program of the first stage of the string St0_word line WL0 (step S10). Next, the control unit 22 executes the program of the first stage of the string St1_word line WL0 (step S20). Thereafter, the control unit 22 executes the same process as steps S10 and S20 on each string St. Then, the control unit 22 executes the program of the first stage of the string St3_word line WL0 (step S30).

Further, the control unit 22 executes the program of the first stage of the string St0_word line WL1 (step S40). Next, the control unit 22 executes the program of the second stage of the string St0_word line WL0 (step S50). Next, the control unit 22 executes the program of the first stage of the string St1_word line WL1 (step S60). Thereafter, the control unit 22 repeats the processes such as steps S40, S50, and S60 for each word line WLi of each string St.

Then, the control unit 22 executes the program of the first stage of the string St0_word line WLn (step S70). Next, the control unit 22 executes the program of the second stage of the string St0_word line WLn−1 (step S80). Thereafter, the control unit 22 repeats the processes such as steps S70 and S80 for each word line WLi of each string St.

Then, the control unit 22 executes the program of the second stage of the string St3_word line WLn−1 (step S90). Next, the control unit 22 executes the program of the second stage of the string St0_word line WLn (step S100). Next, the control unit 22 executes the program of the second stage of the string St1_word line WLn (step S110). Thereafter, the control unit 22 performs the same process as steps S100 and S110 on each string St. Then, the control unit 22 executes the program of the second stage of the string St3_word line WLn (step S120).

FIG. 10 is a flowchart illustrating a first example of the writing procedure of the first stage. In the first stage program, first, the input start command of the Lower page data is input from the memory controller 2 to the nonvolatile memory 3 (step S210). Then, the Lower page data is input from the memory controller 2 to the nonvolatile memory 3 (step S220). Next, the input start command of the Middle page data is input from the memory controller 2 to the nonvolatile memory 3 (step S230). Then, the Middle page data is input from the memory controller 2 to the nonvolatile memory 3 (step S240). Further, the program execution command of the first stage is input from the memory controller 2 to the nonvolatile memory 3 (step S250), and thereby the chip is busy (step S260).

At the time of data writing, one or more program voltage pulses are applied (step S270). Then, data reading is performed to confirm whether or not the memory cell moves beyond the threshold boundary level (step S280).

Furthermore, it is confirmed whether or not the number of data fail bits in the Lower page and the Middle page is smaller than the criterion (judgment criterion) (step S290). If the number of data fail bits is greater than or equal to the criterion (No in step S290), the processes of steps S250 to S270 are repeated. When the number of data fail bits becomes smaller than the criterion (Yes in step S290), the chip is ready (step S300). In this manner, by repeating the application, reading, and confirmation, it becomes possible to move the threshold of the memory cell within a predetermined threshold distribution range.

FIG. 11 is a flowchart illustrating a first example of a writing procedure in the second stage. In the second stage program, first, the input start command of the Upper page data is input from the memory controller 2 to the nonvolatile memory 3 (step S310). Then, the Upper page data is input from the memory controller 2 to the nonvolatile memory 3 (step S320).

Next, the input start command of the Top page data is input from the memory controller 2 to the nonvolatile memory 3 (step S330). Then, the Top page data is input from the memory controller 2 to the nonvolatile memory 3 (step S340). Next, the program execution command of the second stage is input from the memory controller 2 to the nonvolatile memory 3 (step S350), and thereby the chip is busy (step S360).

Thereafter, the control unit 22 reads the Lower page data and the Middle page data which are IDL (Internal Data Load) (step S370). The Vth (threshold voltage) of the program destination of the Upper page and the Top page is determined based on the data of the Lower page and the Middle page (step S380). Thereafter, the data writing to the Upper page and the Top page is performed using the determined Vth. As described above, in steps S370 and S380, the control unit 22 in the nonvolatile memory 3 reads the data programmed by the first program, and determines the threshold voltage in the second program based on the read data. Alternatively, the control unit 22 in the nonvolatile memory 3 reads the first bit data and the second bit data programmed by the first program in response to the execution request of the second program from the memory controller 2, and performs the second program based on the read data and the third bit and fourth bit data.

Furthermore, in order to increase the reliability of the IDL read data, the control unit 22 can perform reading a plurality of times and use the majority decision of the read results in the page buffer 24 in the chip as next write data. Of course, the control unit 22 can perform reading a plurality of times during a normal reading operation and use the majority decision of the read results in the chip as the read data to the outside.

FIG. 12 is a diagram for explaining the process of the majority processing of a plurality of read results. In FIG. 12, correct bits are indicated by circles, and incorrect bits are indicated by crosses (x). In addition, FIG. 12 illustrates the result of the majority decision when the reading is performed three times.

In each bit, it is determined that the majority result is "wrong" (a) when "wrong" is made three times and (b) when "wrong" is made twice. If p is the probability that each bit is wrong, when p=0.2, (a) the probability of three times of "wrong" is $p \times p \times p = 0.2 \times 0.2 \times 0.2$, and (b) the probability of two times of "wrong" is $(1-p) \times p \times p = (1-0.2) \times 0.2 \times 0.2$.

Therefore, it is determined that the result of the three-times majority decision is "wrong" with the probability of $(p \times p \times p) + 3 \times (1-p) \times p \times p = 0.104$. Thus, the control unit 22 can improve the reliability of read data by performing the process of the majority processing of the plurality of read results in the page buffer 24 in the chip.

At the time of data writing to the Upper page and the Top page, one or more program voltage pulses are applied (step S390). Then, in order to confirm whether or not the memory cell moves beyond the threshold boundary level, data reading of the Upper page and the Top page is performed (step S400).

Further, it is confirmed whether or not the number of data fail bits in the Upper page and the Top page is smaller than the criterion (step S410). When the number of data fail bits in the Upper page and the Top page is greater than or equal to the criterion (No in step S410), the processes of steps S390 to S410 are repeated. Then, when the number of data fail bits becomes smaller than the criterion (Yes in step S410), the chip is ready (step S420).

Figure 13A:
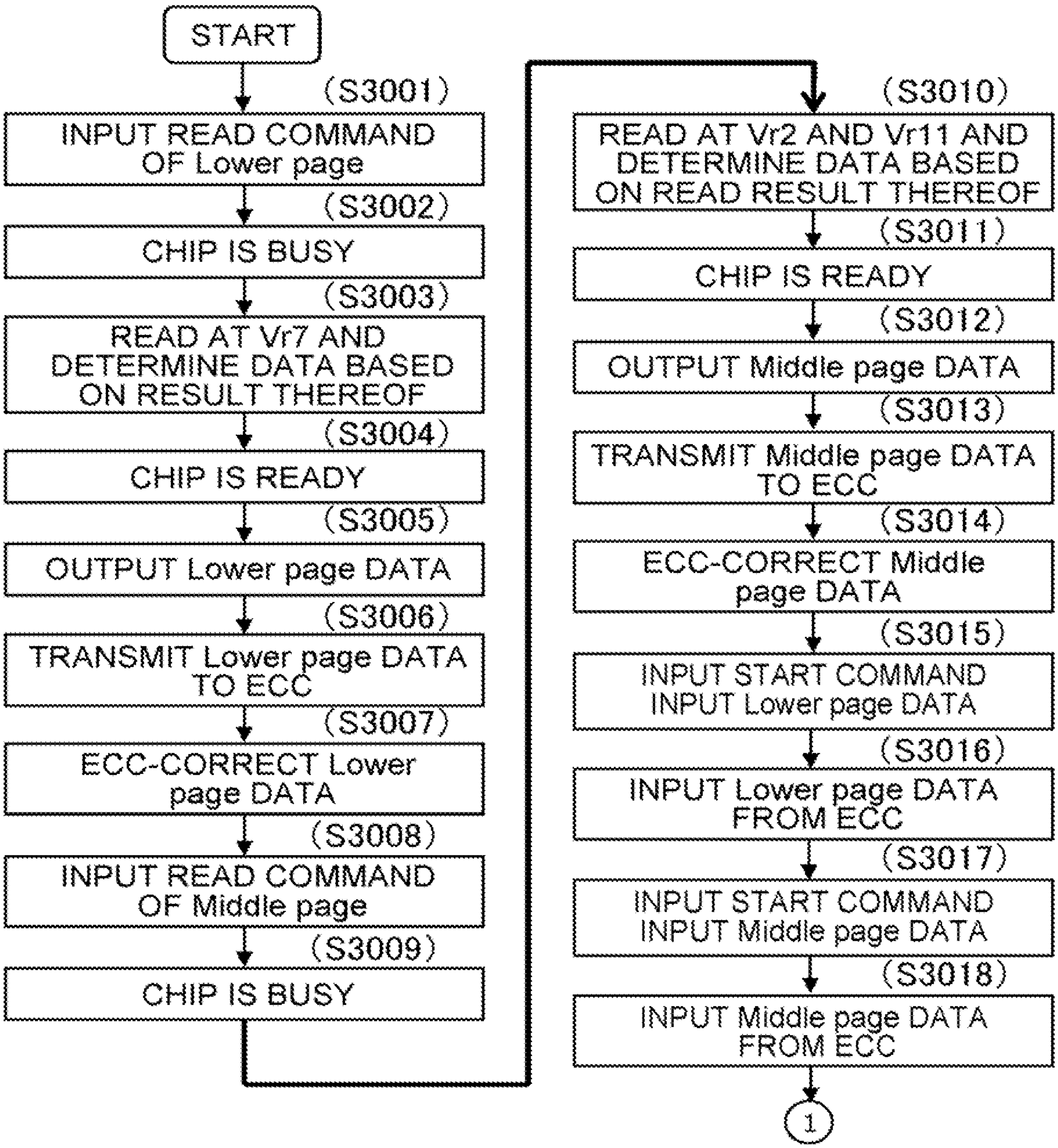
FIG. 13A is a sub-flowchart illustrating a modification of the writing procedure in the second stage.
Figure 13B:
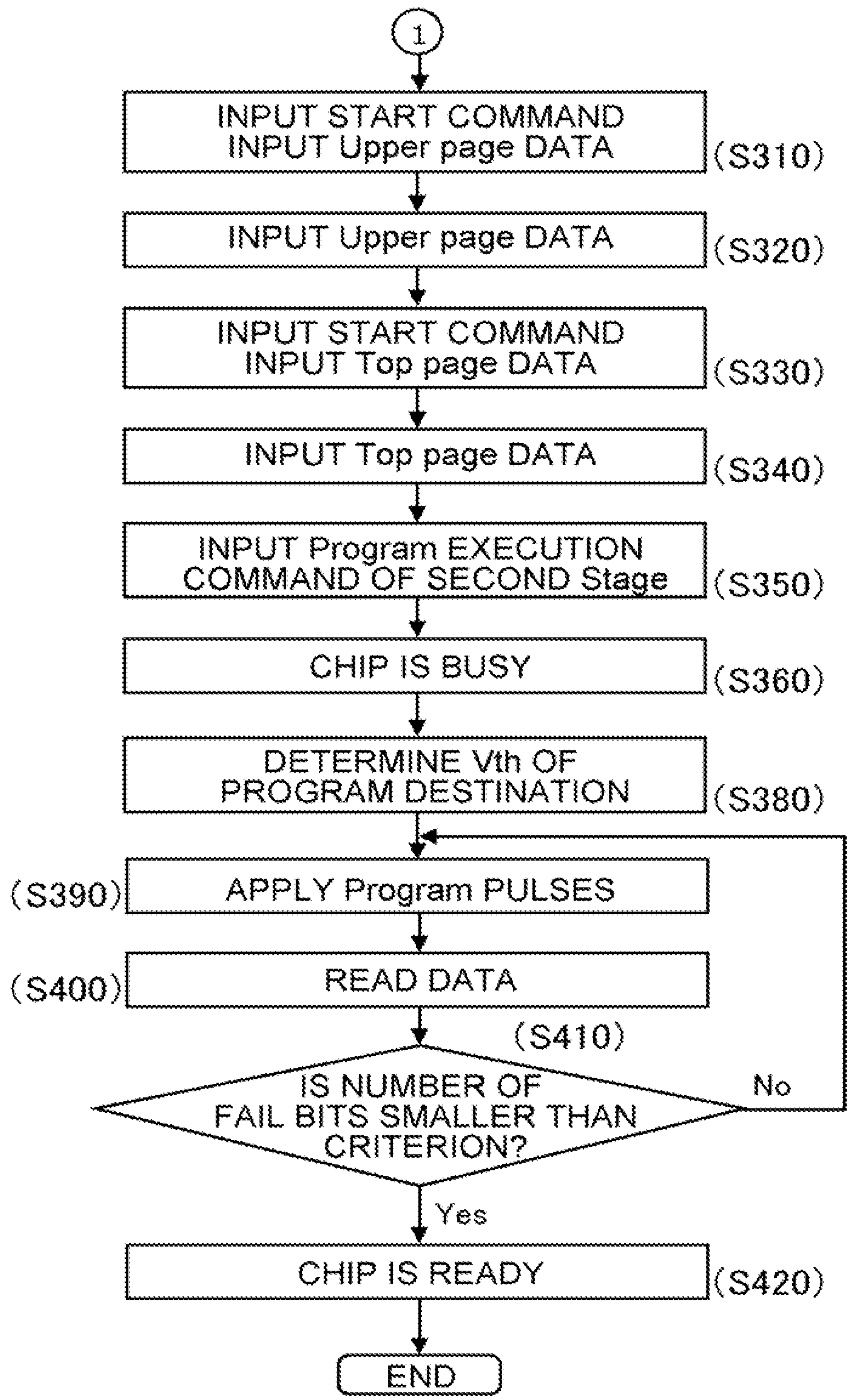
FIG. 13B is a flowchart following FIG. 13A.

Here, a modification of the writing procedure illustrated in FIG. 11 will be described. FIGS. 13A and 13B are sub-flowcharts illustrating a modification of the writing procedure in the second stage according to the first embodiment. In the process procedure shown in FIGS. 13A and 13B, the process procedure in steps S310 to S420 is the same as that in FIG. 11 except that the process in step S370 described in FIG. 11 is not performed.

In the case of the process procedure shown in FIGS. 13A and 13B, steps S3001 to S3018 are performed before step S310. Specifically, first, the read command of the Lower page is input from the memory controller 2 to the nonvolatile memory 3 (step S3001), and thereby the chip is busy (step S3002).

Thereafter, the control unit 22 reads the Lower page data at the threshold voltage of Vr7. Then, the control unit 22 determines the value of the read data as “0” or “1” based on the read result at the threshold voltage of Vr7 (step S3003). Thereafter, the chip is ready (step S3004).

When the Lower page data read by the control unit 22 is output (step S3005), the Lower page data is transmitted to the ECC circuit 10 (step S3006). As a result, the ECC circuit 10 performs ECC correction on the Lower page data (step S3007).

Next, the read command of the Middle page is input from the memory controller 2 to the nonvolatile memory 3 (step S3008), and thereby the chip is busy (step S3009).

Thereafter, the control unit 22 reads the Middle page data at the threshold voltage of Vr7. Then, the control unit 22 determines the value of the read data as “0” or “1” based on the read result at the threshold voltages of Vr2 and Vr11 (step S3010). Thereafter, the chip is ready (step S3011).

When the Middle page data read by the control unit 22 is output (step S3012), the Middle page data is transmitted to the ECC circuit 10 (step S3013). Accordingly, the ECC circuit 10 performs ECC correction on the Middle page data (step S3014).

Then, the input start command of the Lower page data is input from the memory controller 2 to the nonvolatile memory 3 (step S3015). As a result, the ECC circuit 10 inputs the Lower page data to the nonvolatile memory 3 (step S3016). Next, the input start command of the Middle page data is input from the memory controller 2 to the nonvolatile memory 3 (step S3017). Thereby, the ECC circuit 10 inputs the data of the Middle page to the nonvolatile memory 3 (step S3018).

Thereafter, the processes of steps S310 to S420 are performed. In step S380, the Vth of the program destination of the Upper page and the Top page is determined based on the Lower page data/Middle page data from the ECC circuit 10.

In the above-described second stage program, the data input to the nonvolatile memory 3 is performed in only two pages of the Upper page and the Top page. However, in this second stage, Vth, which is the destination of the memory cell program, requires data for four pages including the Lower page and the Middle page (Vth before starting the second stage). For this reason, in the program at this stage, as a preprocess, the control unit 22 performs the operation of reading the Lower page data and Middle page data first and synthesizing the data with the input Upper page and Top page to determine the Vth of the program destination.

Note that the read level before the second stage writing may be slightly different from the read level after the second stage writing. Further, the process procedure illustrated in FIG. 13A may be a process procedure in which the ECC correction is performed on only one of the Lower page or Middle page and reading the other page, and in the other page, the data is internally read out as illustrated in FIG. 11. Also, for example, when the Lower page data is internally read out and the ECC correction is performed on the Middle page, the read level of the Lower page data is Vr8' in the four-value threshold distribution in (T2) of FIG. 7A. Thus, the interval between the threshold regions S2 and S8 may be set wider than the interval between the other threshold regions. Also, for example, when Middle page data is internally read out and ECC correction is performed on the Lower page, the read level of the Lower page data is Vr2' and Vr12 in the four-value threshold distribution in (T2) of FIG. 7A. Thus, the interval between the threshold regions S0 and S2 and the interval between S8 and S12 may be set wider than the intervals between the other threshold regions.

The reason why the Lower page data or the Middle page data can be read out is because 1-4-5-5 coding is adopted in which the number of the Lower page boundaries is 1 and the number of the Middle page boundaries is 2. By reading the Lower page data and Middle page data at the second stage, it is not necessary to input the Lower page data and the Middle page data at the second stage. That is, since 1-4-5-5 coding is adopted and the Vth of the program destination is determined based on the Lower page data and the Middle page data, the interference between adjacent memory cells between word lines WLi can be reduced, and one page data only needs to be input once.

As a result, when 1-4-5-5 coding is adopted and the Foggy-Fine program is executed in two stages, the memory amount required for the write buffer of the memory controller 2 is a plurality of word lines (maximum eight pages). On the other hand, in this embodiment, the memory amount required for the write buffer of the memory controller 2 is at most two pages.

Figure 14:
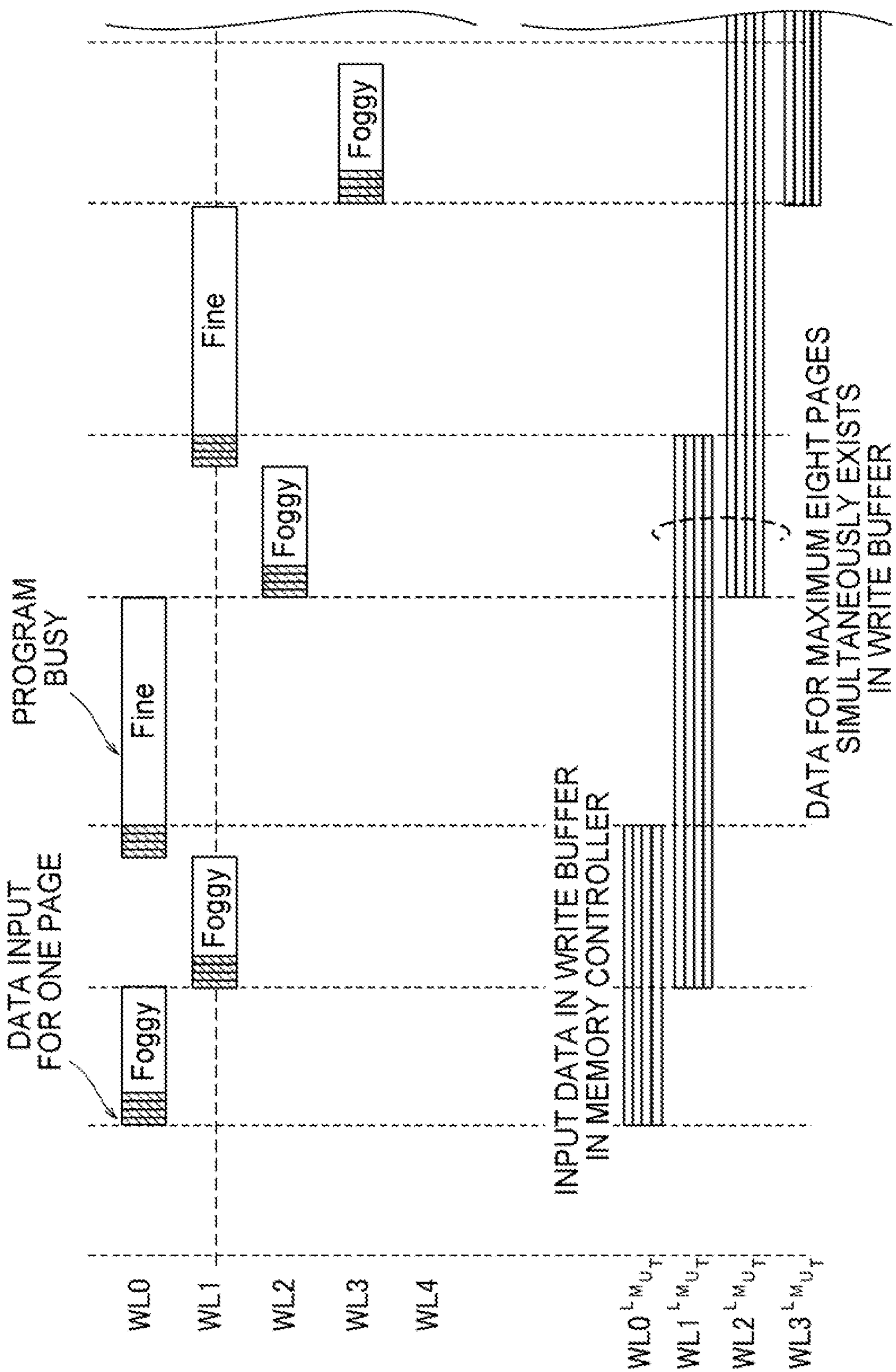
FIG. 14 is a diagram for explaining the data amount of the write buffer of Foggy-Fine program.

Here, a comparison between the process procedure of the Foggy-Fine program adopting 1-4-5-5 coding and the program process procedure of this embodiment will be described. FIG. 14 is a diagram for explaining the data amount of the write buffer in the Foggy-Fine program adopting 1-4-5-5 coding.

Figure 15:
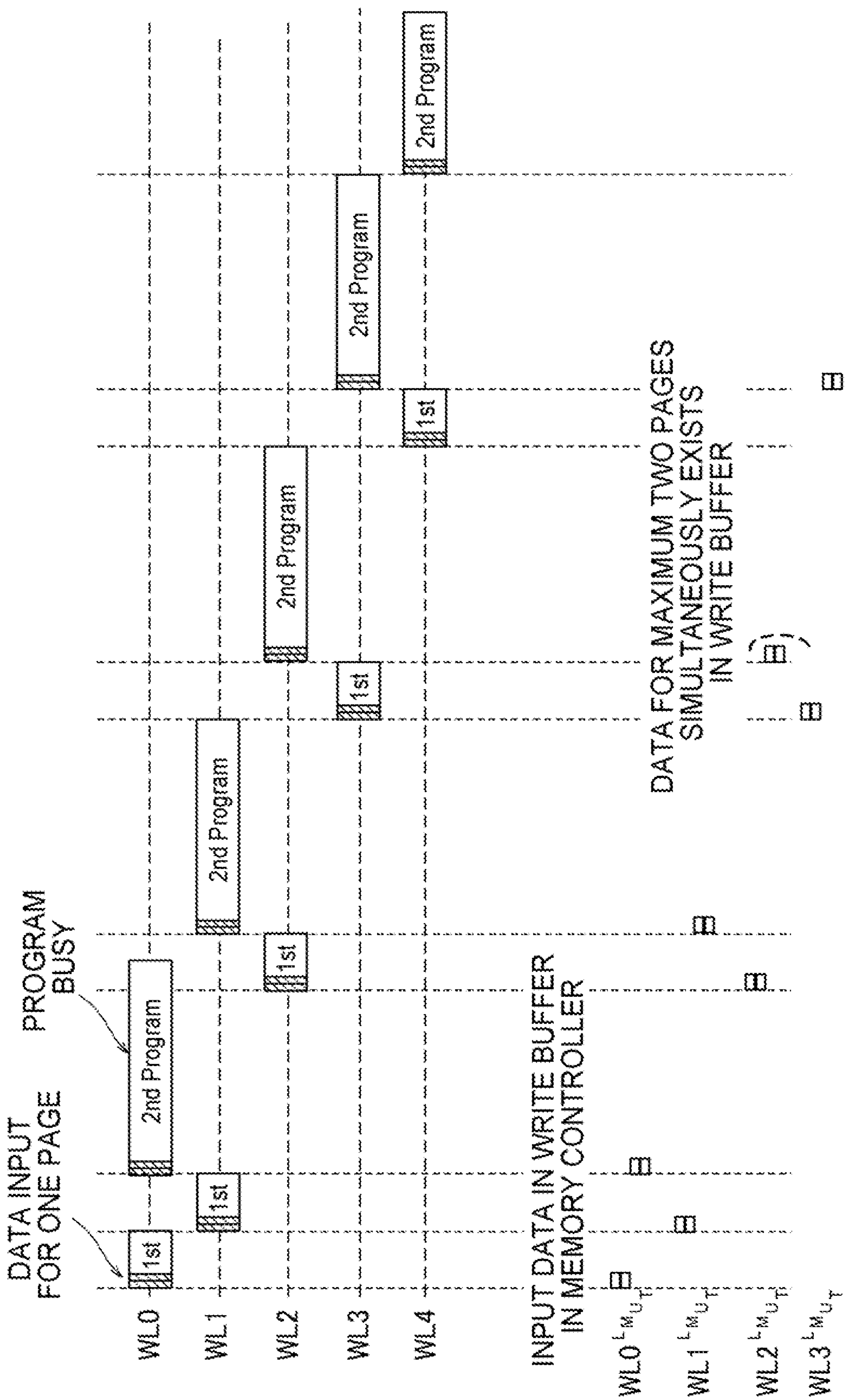
FIG. 15 is a diagram for explaining a write buffer amount according to the first embodiment.

In FIGS. 14 and 15 described later, the time chart of data input for block writing and program execution is shown on the upper side, and the time chart for the period necessary to hold data in the write buffer is shown on the lower side. Note that FIGS. 14 and 15 to be described later illustrate a case where the number of strings St in one block is 1 in order to simplify the description. When there are a plurality of strings St, a memory amount that is several times the number of strings St is required. In FIGS. 14 and 15, each of the four or two small rectangular regions with hatches represents data input for one page.

In the case of the Foggy-Fine program with the 1-4-5-5 coding, the data input for four pages and the program for four pages (Foggy stage program) are performed in the Foggy stage which is the first stage. In addition, in the case of the Foggy-Fine program with 1-4-5-5 coding, the data input for four pages and the program for four pages (Fine stage program) are performed also in the Fine stage which is the second stage.

For each of the word lines WL0, WL1, WL2, and so on, it is necessary to store the data for four pages written in the Foggy stage in the write buffer until the program is started in the Fine stage.

Even in the Foggy-Fine program, the data for four Lower/Middle/Upper/Top pages is not written continuously in order to reduce the interference between adjacent memory cells. For example, after the Foggy stage to the word line WL0 is executed, the Foggy stage to the word line WL1 adjacent to the word line WL0 is executed before the Fine stage to the word line WL0 is executed. Further, after the Foggy stage to the word line WL0 is executed, the Foggy stage to the word line WL2 adjacent to the word line WL1 is executed before the Fine stage to the word line WL1 is executed. In the case of this method, it is necessary to hold the data for four Lower/Middle/Upper/Top pages in the write buffer until the data input of the final second Fine stage is completed. Further, in order to reduce the interference between adjacent memory cells, it is necessary to hold the data for a plurality of word lines WLi in the write buffer. For example, when the Foggy stage is executed for the word line WL2, it is necessary to hold the data for four pages for the word line WL1 and the data for four pages for the word line WL2 in the write buffer. Thus, in the case of the Foggy-Fine program with 1-4-5-5 coding, it is necessary to hold the data for maximum eight pages in the write buffer, FIG. 15 is a diagram for explaining a write buffer amount (buffer data amount) in the program of the first embodiment.

In the program of this embodiment, a two-stage program is used in 1-4-5-5 coding. In the program of this embodiment, data input for two pages (Lower page and Middle page) and a program for this one page (first program) are performed in the first stage. In the case of the program of this embodiment, data input for two pages (Upper page and Top page) and a program for two pages (second program) are performed in the second stage.

For each of the word lines WL0, WL1, WL2, and so on, the data may be stored at the time of data input of each stage in the write buffer. When the program is started, the data may be deleted from the write buffer. For example, when data is input in the first stage, this data is stored in the write buffer. When the program is started at the first stage, the data stored in the write buffer may be deleted. Similarly, when the data is input in the second stage, this data is stored in the write buffer. When the program is started at the second stage, the data stored in the write buffer may be deleted. For this reason, in the case of the program of this embodiment, the data that needs to be held in the write buffer is data for at most two pages.

Also in the program of this embodiment, the data for four pages of Lower/Middle/Upper/Top is not continuously written in order to reduce interference between adjacent memory cells. For example, after the first stage to the word line WL0 is executed, the first stage to the word line WL1 adjacent to the word line WL0 is executed before the second stage to the word line WL0 is executed. Similarly, after the first stage for the word line WL1 is executed, the first stage to the word line WL2 adjacent to the word line WL1 is executed before the second stage to the word line WL1 is executed.

As described above, in this embodiment, all the page data is necessary only for one stage of the program, and therefore the data in the write buffer can be discarded when the data input is completed. Therefore, in this embodiment, the number of pages that need to be simultaneously held in the write buffer can be reduced.

The page data to be programmed into the nonvolatile memory 3 is once held in a write buffer in the RAM 6 and then written into the nonvolatile memory 3 at the time of programming. In this embodiment, the required capacity of the RAM 6 can be reduced, so that the cost can be reduced.

Also, as illustrated in FIG. 14, when the Foggy-Fine program is used, all page data must be transferred twice, so it takes time to transfer and extra consumption power is necessary during the transfer. In this embodiment, all the page data is completed by one data transfer for each page, so that the transfer time and power consumption can be reduced to about ½.

Here, the page reading process will be described. The page reading method differs depending on whether the program for the word line WLi including the page to be read is before or after writing in the second stage.

Before the second stage writing, only the Lower page and Middle page are valid as recorded data. For this reason, the control unit 22 reads data from the memory cell only when the read page is the Lower page or the Middle page. Then, in the case of other pages, the control unit 22 performs control to all forcibly output "1" as read data without performing the memory cell read operation.

On the other hand, in the case of the word line WLi that is completed to the second stage, the control unit 22 reads the memory cell regardless of whether the read page is any one of the Top/Upper/Middle/Lower pages. In this case, since the necessary read voltage differs depending on which page is read, the control unit 22 executes only necessary read for the selected page.

According to the coding illustrated in FIG. 6, since there is only one boundary between the threshold states at which the Lower page data changes, the control unit 22 determines the data depending on the position of the threshold in the two ranges separated by the boundary. For example, when the threshold voltage is smaller than Vr8, the control unit 22 performs control to output "1" as data of the memory cell. On the other hand, when the threshold voltage is higher than Vr8, the control unit 22 performs control to output "0" as data of the memory cell.

In addition, since there are four boundaries between threshold states where the data of the Middle page changes, the control unit 22 determines the data depending on the position of the threshold voltage in the five ranges separated by these boundaries.

In addition, since there are five boundaries between threshold states where the data of the Top page or Upper page changes, the control unit 22 determines the data depending on the position of the threshold voltage in the six ranges separated by these boundaries.

Figure 16:
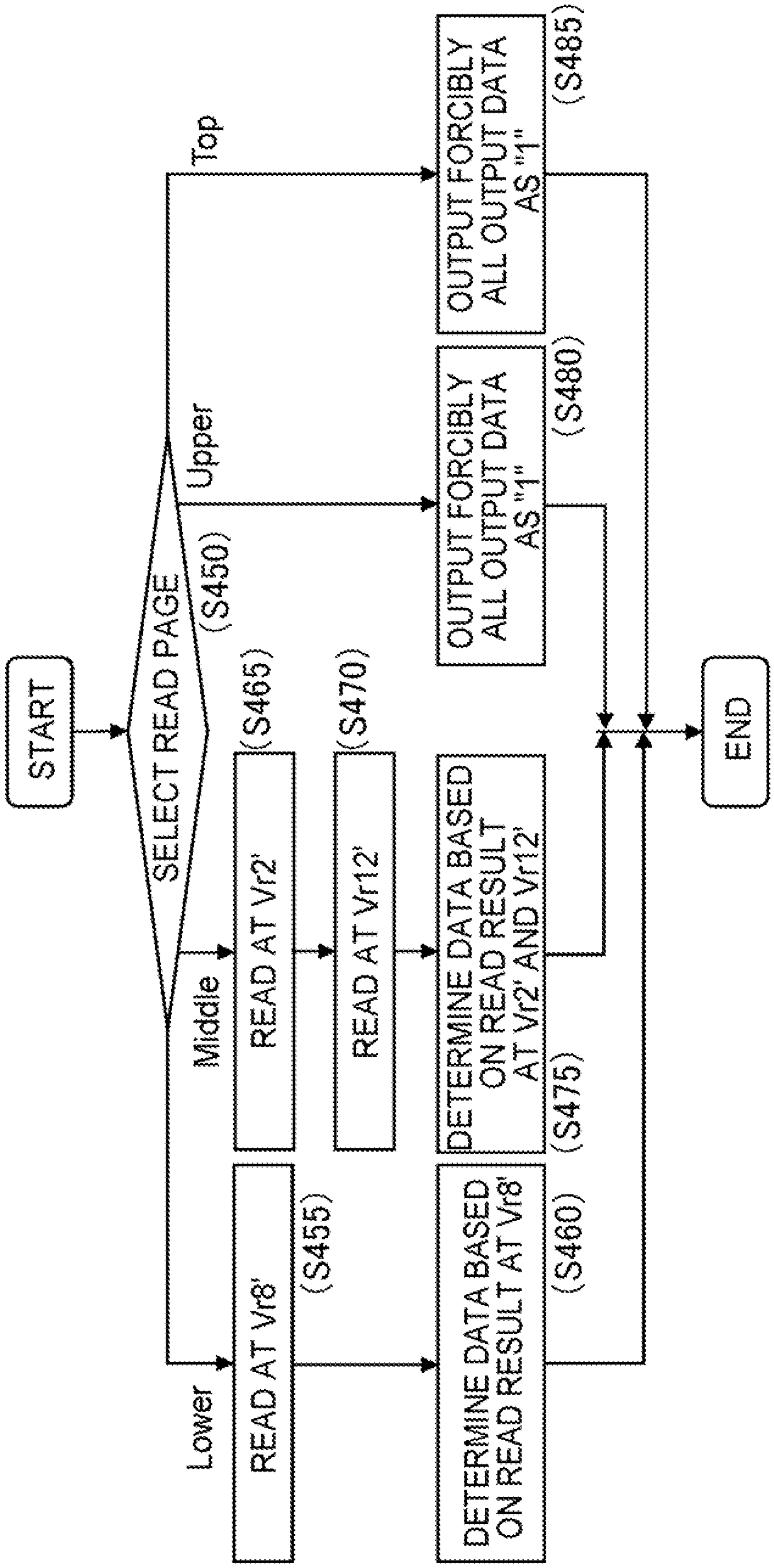
FIG. 16 is a flowchart illustrating a page read process procedure before second stage writing.
Figure 17:
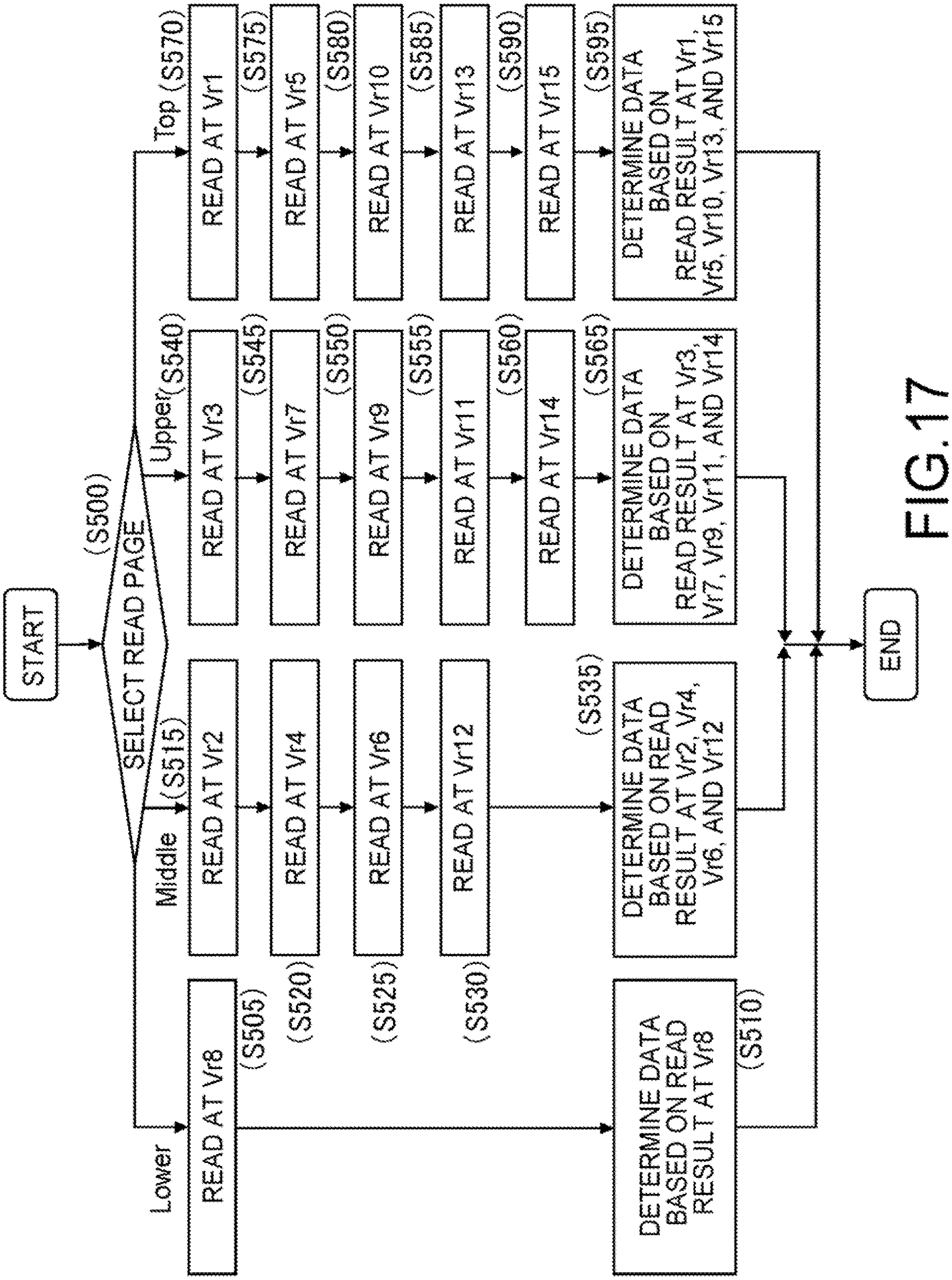
FIG. 17 is a flowchart illustrating the page read process procedure in a state where the program is completed up to the second stage.

Hereinafter, a specific process procedure for page reading will be described. FIG. 16 is a flowchart illustrating a page read process procedure before second stage writing in the memory system 1 according to the first embodiment. FIG. 17 is a flowchart illustrating a page read process procedure in a state where the program is completed up to the second stage in the memory system 1 according to the first embodiment.

As illustrated in FIG. 16, in the case of the word line WLi before the second stage writing, the control unit 22 selects a read page (step S450). When the read page is the Lower page, the control unit 22 performs reading with one read voltage (step S455). This voltage is Vr8' (≤Vr8) as described above. However, in the case of a word line before second stage writing, as illustrated in FIG. 7A (T2), with a margin of the read voltage and the threshold voltage, Vr7' (≤Vr7) may also be used, for example. Then, the control unit 22 determines the value of the read data as "0" or "1" based on the read result at the threshold voltage of Vr8' (step S460).

When the read page is the Middle page, the control unit 22 performs reading with two read voltages of Vr2' (≤Vr2) and Vr12' (≤Vr12) (steps S465 and S470). In the case of the word line before the second stage writing, as illustrated in FIG. 7A (T2), with a margin of the read voltage and the threshold voltage, Vr11' Vr11) may be used instead of Vr12', for example. Then, the control unit 22 determines the value of the read data as "0" or "1" based on the read result at the threshold voltage of Vr2' and the read result at the threshold voltage of Vr12' (step S475).

When the read page is the Upper page, the control unit 22 performs control to all forcibly output "1" as the output data of the memory cell (step S480). When the read page is the Top page, the control unit 22 performs control to all forcibly output "1" as the output data of the memory cell (step S485).

On the other hand, in the case of the word line WLi that is completely programmed up to the second stage, as illustrated in FIG. 17, the control unit 22 selects a read page (step S500). When the read page is the Lower page, the control unit 22 performs reading with the threshold voltage of Vr8 (step S505). Then, the control unit 22 determines the value of the read data as "0" or "1" based on the read result at the threshold voltage of Vr8 (step S510).

When the read page is the Middle page, the control unit 22 performs reading with the threshold voltages of Vr2, Vr4, Vr6, and Vr12 (steps S515, S520, S525, and S530). Then, the control unit 22 determines the value of the read data as "0" or "1" based on the read result at the threshold voltages of Vr2, Vr4, Vr6, and Vr12 (step S535).

When the read page is the Upper page, the control unit 22 performs reading with threshold voltages of Vr3, Vr7, Vr9, Vr11, and Vr14 (steps S540, S545, S550, S555, and S560). Then, the control unit 22 determines the value of the read data as "0" or "1" based on the read result at the threshold voltages of Vr3, Vr7, Vr9, Vr11, and Vr14 (step S565).

When the read page is the Top page, the control unit 22 performs reading with the threshold voltages of Vr1, Vr5, Vr10, Vr13, and Vr15 (steps S570, S575, S580, S585, and S590). Then, the control unit 22 determines the value of the read data as "0" or "1" based on the read result at the threshold voltages of Vr1, Vr5, Vr10, Vr13, and Vr15 (step S595).

Note that the memory controller 2 can manage and identify whether the program for the word line WLi is before or after the completion of the second stage writing. Since the memory controller 2 performs program control, if the memory controller 2 records the progress, the memory controller 2 can easily grasp the address and the program state of the nonvolatile memory 3. In this case, when reading is performed from the nonvolatile memory 3, the memory controller 2 identifies the program state of the word line WLi including the target page address and issues a read command corresponding to the identified state. In addition, another method can be provided in which a flag cell is provided for each word line WLi, the flag cell is written at the time of second stage writing, and whether the program is before or after the completion of second stage writing is managed and identified in the memory according to the flag cell data. The flag cell is described in, for example, U.S. patent application Ser. No. 15/437,391 filed on Feb. 20, 2017, "Memory System and Programming Method". This patent application Is incorporated herein by reference in its entirety.

Note that the read level before the second stage writing and after the second stage writing may be slightly different from the read level after the second stage writing.

In summary, the memory controller 2 in this embodiment causes the nonvolatile memory 3 to execute the second program for writing the data of the third bit and the fourth bit after causing the nonvolatile memory 3 to execute the first program for writing the data of the first bit and the second bit. Among the fifteen boundaries between the sixteen threshold regions, the number of the boundaries with different first bit values between the adjacent threshold regions, the number of the boundaries with different second bit values, the number of the boundaries with different third bit values, and the number of the boundaries with different fourth bit values, that is, the number of the changes of the bit values at the time of writing the first to fourth bit data are 1, 4, 5, 5 or 4, 1, 5, 5 in order. The first program and the second program are performed in the nonvolatile memory 3 such that the number of changes from the threshold region at the end of the first program to the threshold region at the end of the second program is within five of the threshold regions at the time of ending the second program. That is, the memory controller 2 causes the nonvolatile memory 3 to execute the first program having four threshold regions, and then causes the nonvolatile memory 3 to execute the second program having a total of 16 threshold regions in which the number of changes from the four threshold regions is within five.

The memory controller 2 causes the nonvolatile memory 3 to execute the first program and the second program so that the bit values of the second bit to the fourth bit do not change at the voltage level at the boundary position where the bit value of the first bit changes. For example, in the example of FIG. 7B, all the bit values of the Middle page, Upper page, and Top page are 011 before and after the boundary position where the Lower page changes from 1 to 0.

In addition, the memory controller 2 causes the nonvolatile memory 3 to execute the first program and the second program so that on one of the side where the voltage level is lower than the boundary position where the bit value of the first bit changes and the side where the voltage level is higher than the boundary position, at least a part of the order of change from the threshold region at the end of the first program to the threshold region at the end of the second program changes, and on the other side of the boundary position, the order of change from the threshold region at the end of the first program to the threshold region at the end of the second program does not change. That is, when the memory controller causes the nonvolatile memory to execute the second program, the memory controller 2 has any one of the transition to one threshold region of a plurality of second threshold regions from the first threshold region that is the threshold region at the end of the first program, the transition to one threshold region of a plurality of fourth threshold regions from the third threshold region that is the threshold region at the end of the first program and has a higher voltage level than the first threshold region and a lower voltage level than the boundary between threshold regions having different first bit values, the transition to one threshold region of a plurality of sixth threshold regions from the fifth threshold region that is the threshold region at the end of the first program and has a higher voltage level than the boundary between threshold regions having different first bit values, and the transition to one threshold region of a plurality of eighth threshold regions from the seventh threshold region that is the threshold region at the end of the first program and has a higher voltage level than the fifth threshold region. The voltage level of one threshold region of the plurality of second threshold regions is higher than the voltage level of one threshold region of the plurality of fourth threshold regions. The voltage levels of all the threshold regions of the plurality of sixth threshold regions are lower than the voltage levels of all the threshold regions of the plurality of eighth threshold regions, or the voltage levels of all the threshold regions of the plurality of second threshold regions are lower than voltage levels of all the threshold regions of the plurality of fourth threshold regions. The voltage level of one threshold region of the plurality of sixth threshold regions is higher than the voltage level of one threshold region of the plurality of eighth threshold regions.

The data coding in this embodiment can be considered in addition to 1-4-5-5 illustrated in FIG. 7A. The data coding different from that of FIG. 7 is also conceivable in the 1-4-5-5 data coding in which the boundary of the Lower page data is one place, and the boundaries of the Middle page data after the first stage program are four places.

Figure 18A:
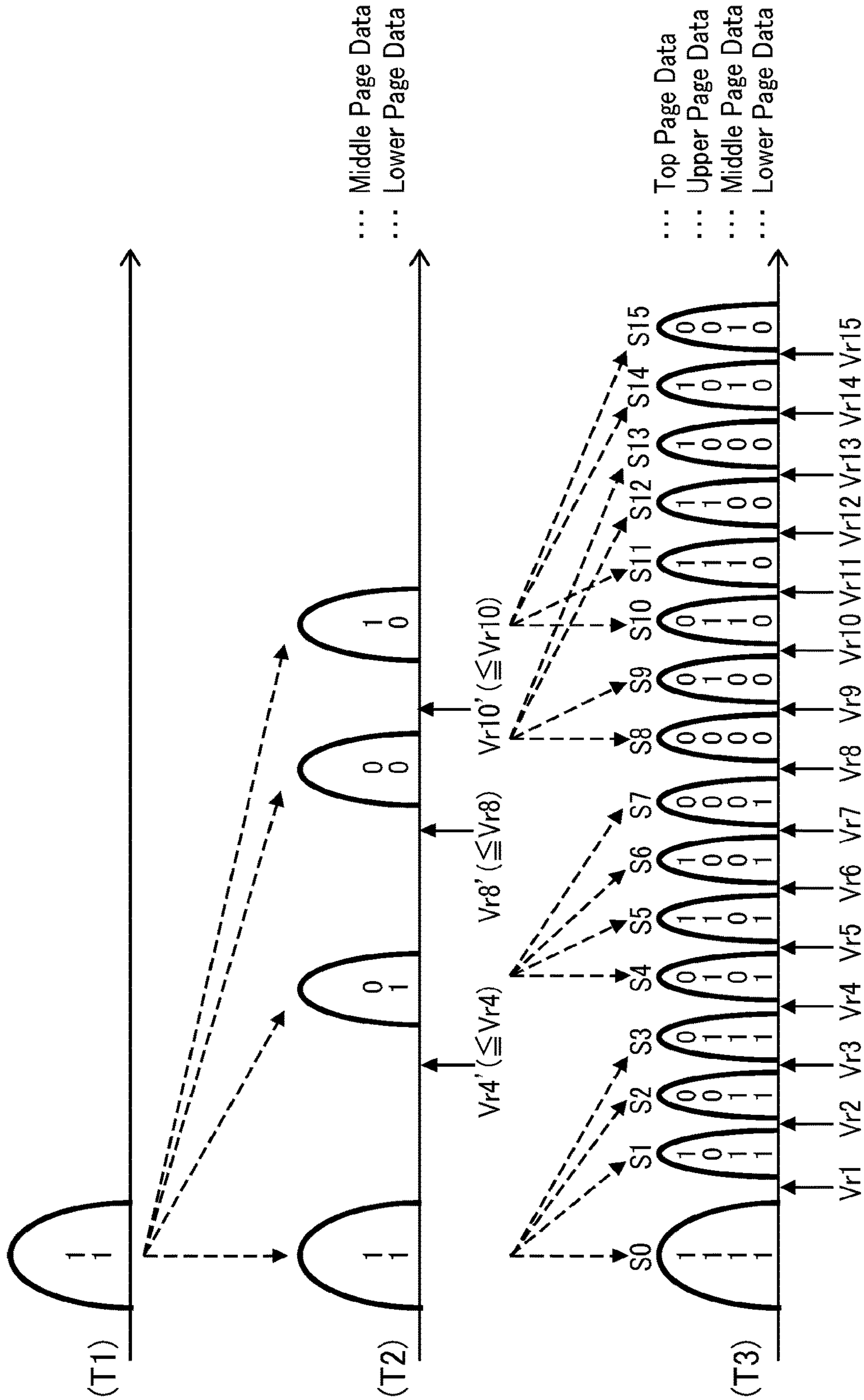
FIG. 18A is a diagram illustrating a modification of 1-4-5-5 data coding.
Figure 18B:
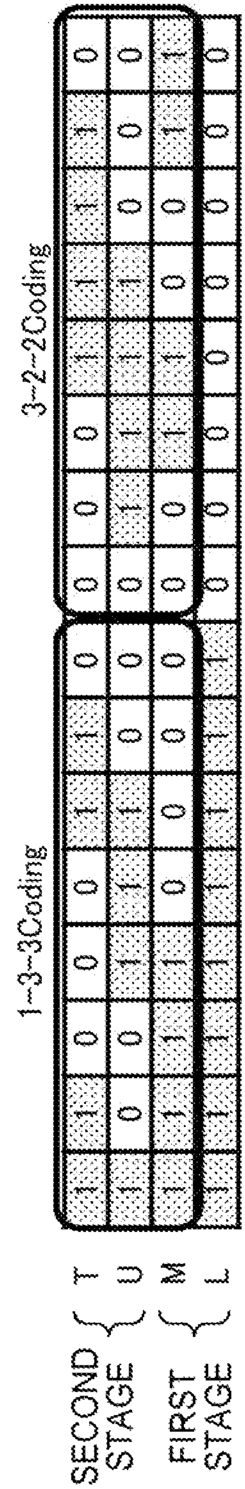
FIG. 18B is a diagram illustrating 4-bit data in each threshold region in FIG. 18A.

FIG. 18A is a diagram illustrating a modification of 1-4-5-5 data coding, and FIG. 18B is a diagram illustrating 4-bit data in each threshold region in FIG. 18A. The relationship between the threshold voltage and 4-bit data in FIG. 18A is as follows.

A memory cell of which the threshold voltage is in the S1 region is in a state of storing "1111".

A memory cell of which the threshold voltage is in the S1 region is in a state of storing "1011".

A memory cell of which the threshold voltage is in the S2 region is in a state of storing "0011".

A memory cell of which the threshold voltage is in the S3 region is in a state of storing "0111".

A memory cell of which the threshold voltage is in the S4 region is in a state of storing "0101".

A memory cell of which the threshold voltage is in the S5 region is in a state of storing "1101".

A memory cell of which the threshold voltage is in the S6 region is in a state of storing "1001".

A memory cell of which the threshold voltage is in the S7 region is in a state of storing "0001".

A memory cell of which the threshold voltage is in the S8 region is in a state of storing "0000".

A memory cell of which the threshold voltage is in the S9 region is in a state of storing "0100".

A memory cell of which the threshold voltage is in the S10 region is in a state of storing "0110".

A memory cell of which the threshold voltage is in the S11 region is in a state of storing "1110".

A memory cell of which the threshold voltage is in the S12 region is in a state of storing "1100".

A memory cell of which the threshold voltage is in the S13 region is in a state of storing "1000".

A memory cell of which the threshold voltage is in the S14 region is in a state of storing "1010".

A memory cell of which the threshold voltage is in the S15 region is in a state of storing "0010".

In FIG. 7, the transition line from the threshold region of the first stage to the threshold region of the second stage partially intersects on the lower voltage side than the boundary position of the Lower page, whereas in FIG. 18A, the transition line from the threshold region of the first stage to the threshold region of the second stage partially intersects on the higher voltage side than the boundary position of the Lower page. The number of changes from the threshold region of the first stage to the threshold region of the second stage is at most 5 in both FIGS. 7 and 18A.

On the left side from the boundary position between 1 and 0 of the Lower page in FIG. 18B, the number of boundaries between 1 and 0 of the Middle page is one, the number of boundaries of the Upper page is three, the number of boundaries of the Top page is three, and 1-3-3 coding is performed. Also, 3-2-2 coding is performed on the right side from the boundary position of the Lower page. By adding these two codings, the coding becomes 1-4-5-5 data coding.

Figure 19A:
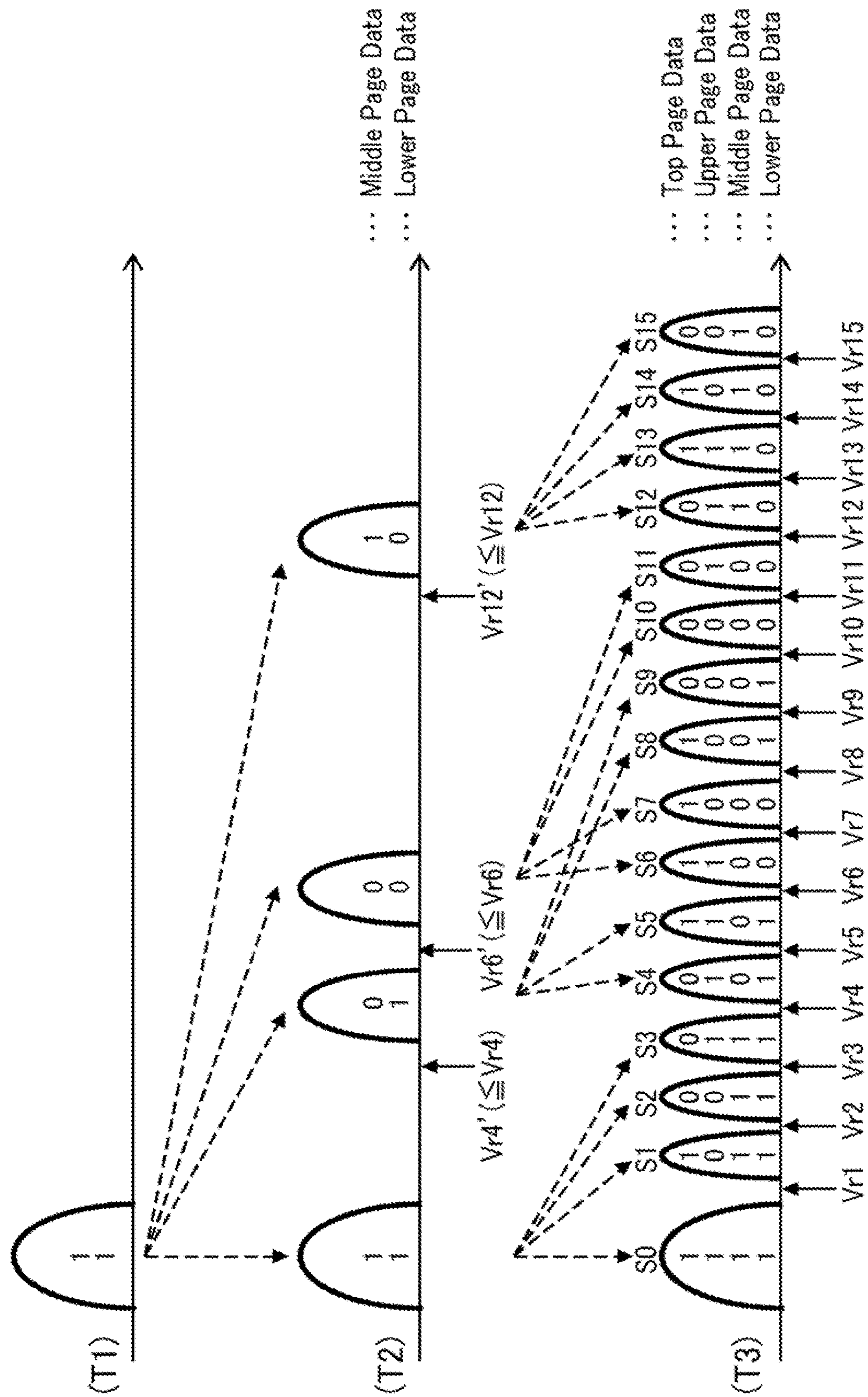
FIG. 19A is a diagram illustrating 3-2-5-5 data coding according to another modification.
Figure 19B:
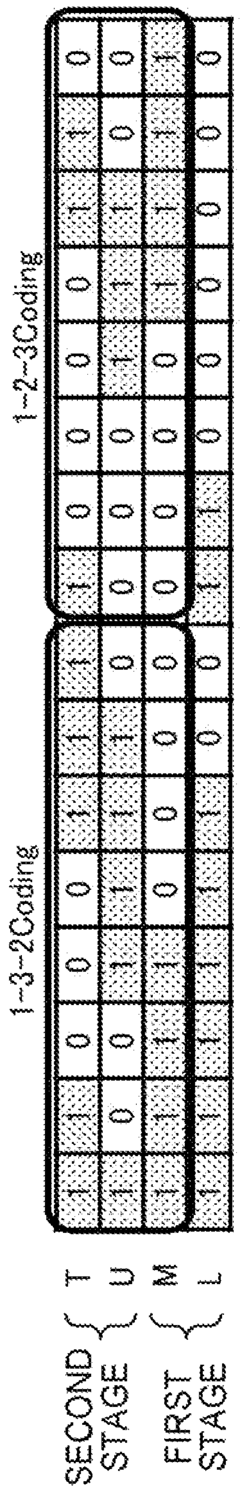
FIG. 19B is a diagram illustrating 4-bit data in each threshold region in FIG. 19A.

The data coding in this embodiment can be considered in addition to 1-4-5-5. As typical examples, 3-2-5-5 and 3-4-4-4 will be described below in order, FIG. 19A is a diagram illustrating 3-2-5-5 data coding which is another modification of this embodiment, and FIG. 19B is a diagram illustrating 4-bit data in each threshold region in FIG. 19A. The relationship between the threshold voltage and the data value in FIG. 19A is as follows.

A memory cell of which the threshold voltage is in the S0 region is in a state of storing "1111".

A memory cell of which the threshold voltage is in the S1 region is in a state of storing "1011".

A memory cell of which the threshold voltage is in the S2 region is in a state of storing "0011".

A memory cell of which the threshold voltage is in the S3 region is in a state of storing "0111".

A memory cell of which the threshold voltage is in the S4 region is in a state of storing "0101".

A memory cell of which the threshold voltage is in the S5 region is in a state of storing "1101".

A memory cell of which the threshold voltage is in the S6 region is in a state of storing "1100".

A memory cell of which the threshold voltage is in the S7 region is in a state of storing "1000".

A memory cell of which the threshold voltage is in the S8 region is in a state of storing "1001".

A memory cell of which the threshold voltage is in the S9 region is in a state of storing "0001".

A memory cell of which the threshold voltage is in the S10 region is in a state of storing "0000".

A memory cell of which the threshold voltage is in the S11 region is in a state of storing "0100".

A memory cell of which the threshold voltage is in the S12 region is in a state of storing "0110".

A memory cell of which the threshold voltage is in the S13 region is in a state of storing "1110".

A memory cell of which the threshold voltage is in the S14 region is in a state of storing "1010".

A memory cell of which the threshold voltage is in the S15 region is in a state of storing "0010".

In the case of 3-2-5-5 data coding in FIG. 19A, the memory controller 2 causes the nonvolatile memory 3 to execute the first program for writing the data of the first bit and the second bit and then execute the second program for writing the data of the third bit and the fourth bit. The nonvolatile memory 3 is caused to execute the first program and the second program so that the numbers of changes of the bit values at the time of writing the data of the first to fourth bits are 3, 2, 5, 5 or 2, 3, 5, 5 in order. In addition, the memory controller 2 causes the nonvolatile memory 3 to execute the first program having four threshold regions, and then causes the nonvolatile memory 3 to execute the second program having a total of 16 threshold regions in which the number of changes from the four threshold regions is within five.

As illustrated in FIG. 19B, the Lower page has boundary positions of 1 and 0 on the right and left sides with the center as a boundary. In addition, on the left side from the central position of the Lower page, the number of boundaries between 1 and 0 of the Middle page is one, the number of boundaries of the Upper page is three, the number of boundaries of the Top page is two, and 1-3-2 coding is performed. Also, 1-2-3 coding is performed on the right side from the boundary position of the Lower page. By adding these two codings, the coding becomes 3-2-5-5 data coding.

In FIGS. 7B, 18B, and 19B described above, the boundary position between 1 and 0 of the Lower page, the boundary position between 1 and 0 of the Middle page, the boundary position between 1 and 0 of the Upper page, and the boundary position between 1 and 0 of the Top page can be interchanged between the pages. For example, the boundary position between 1 and 0 of the Lower page and the boundary position between 1 and 0 of the Middle page may be interchanged. Similarly, the boundary position between 1 and 0 of the Upper page and the boundary position between 1 and 0 of the Top page may be interchanged.

[Additional 0001]

A modification of the page read process will be described below in which the boundary position between 1 and 0 of the Upper page is interchanged with the boundary position between 1 and 0 of the Top page. The page read process according to the modification may be performed only when the program for the word line WLi including the page to be read is after the second stage writing. The page read process according the modification is effective when all data of the selected word line is read since the reading speed may be improved in such a case.

[Additional 0002]

FIG. 19C shows an example of data coding suitable for the page read process according to the modification, which is obtained by interchanging the code assignment of the Top page with the code assignment of the Upper page shown in FIG. 19A. Another page read process performed in the case of this data coding will be described below. In the page read process according to the modification, data are read from all of Top, Upper, Middle, and Lower pages.

[Additional 0003]

Figure 19D:
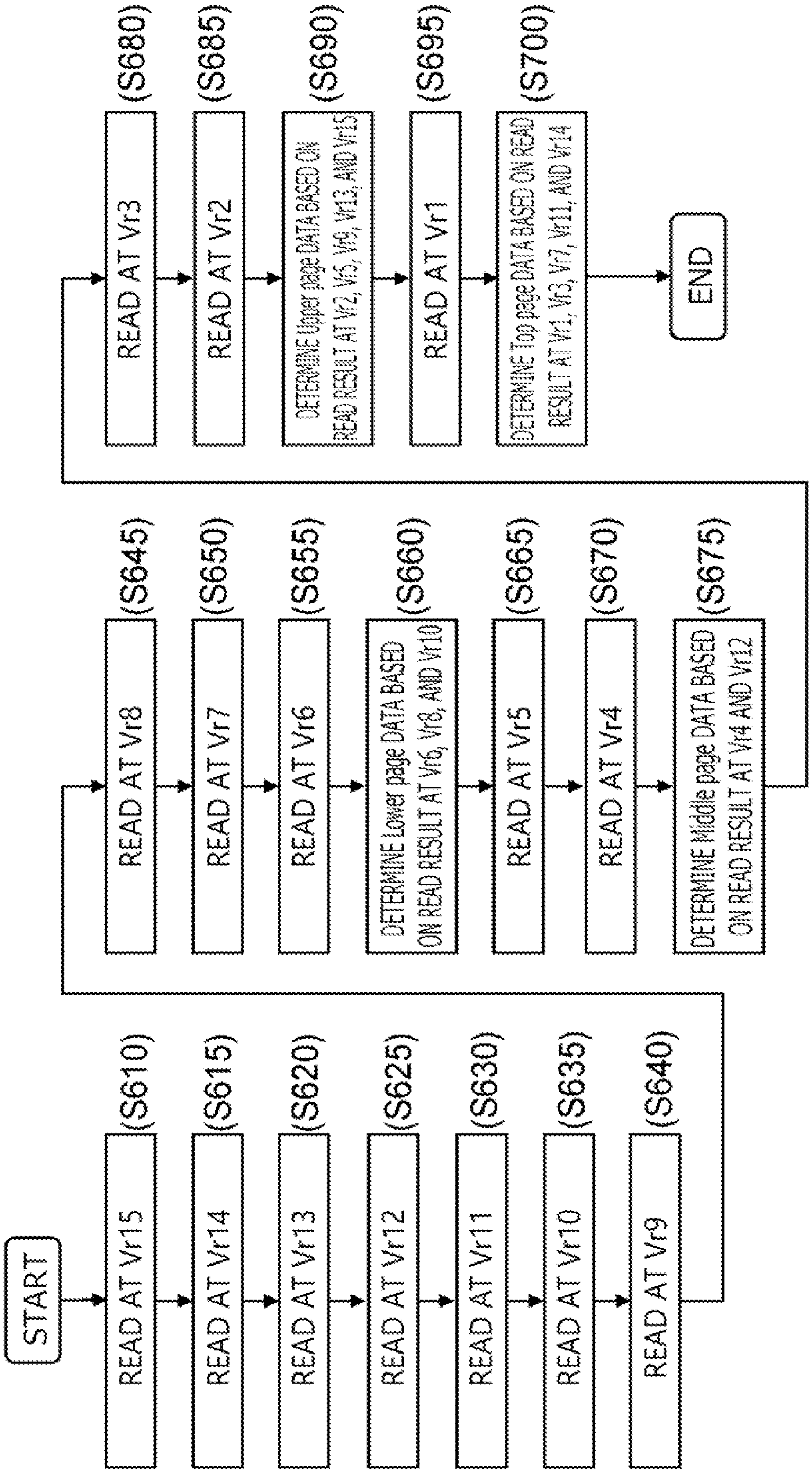
FIG. 19D is a flowchart illustrating a page read process procedure according to one modification.
Figure 19E:
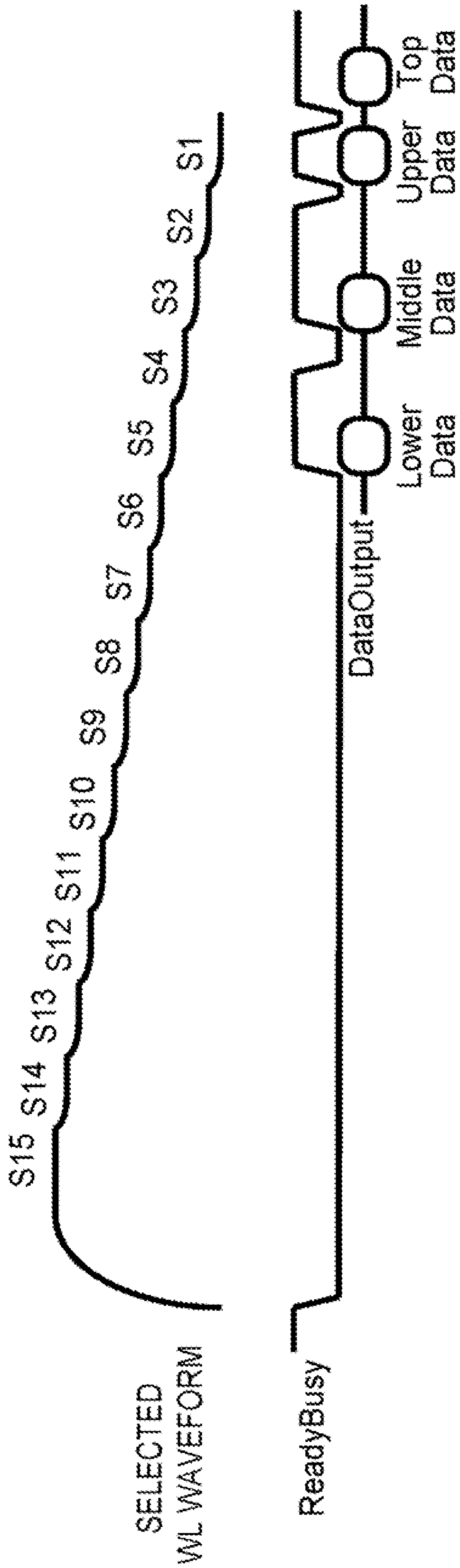
FIG. 19E is a voltage waveform diagram with respect to the selected word line, a ReadyBusy signal line, and an output data line.

FIG. 19D is a flowchart illustrating a page read process procedure according to the modification. FIG. 19E is a voltage waveform diagram with respect to the selected word line, a ReadyBusy signal line, and an output data line. The control unit 22 sequentially performs a reading operation with all of 15 read voltages from Vr15 to Vr1. As shown in FIG. 19E, the reading operation is started with the highest voltage, Vr15 (step S610), and then the read voltage is lowered stepwise (steps S615 to S695). When the reading procedure required to determine the data read from a certain page is completed, the data may be outputted.

[Additional 0004]

In the page read process according to the modification, the data is sequentially read with the voltage being changed from the voltage Vr15 to the voltage Vr6 (step S655), and then data of the Lower page is determined and may be outputted (step S660). In step S660, the data of the Lower page is determined based on the data read with the read voltages Vr6, Vr8, and Vr10.

[Additional 0005]

When the reading operation proceeds to the read voltage Vr4 (step S670), data of the Middle page is determined (step S675). In step S675, the data of the Middle page is determined based on the data read with the read voltages Vr4 and Vr12.

[Additional 0006]

When the reading operation proceeds to the read voltage Vr2 (step S685), data of the Upper page is determined (step S690). In step S690, the data of the Upper page is determined based on the data read with the read voltages Vr2, Vr5, Vr13 and Vr15.

[Additional 0007]

When the reading operation proceeds to the read voltage Vr1 (step S695), data of the Top page is finally determined (step S700). In step S700, the data of the Top page is determined based on the data read with the read voltages Vr1, Vr3, Vr7, Vr11, and Vr14.

[Additional 0008]

Although the latency for determining and outputting the data of an arbitrarily selected page in the page read process according to the modification is longer than that in the page read process where the pages are read one by one as described before, the total time for reading all of four pates is shorter. As shown in FIG. 19E, the charging of the word line from zero to the highest voltage, Vr15, is performed only once in the preparation for the reading operation, and when the read voltage level is changed, the fluctuations in the voltage change is small and the voltage becomes stable in a short time. Therefore, the time required for the stabilization of the read voltage is shortened. This shortens the total time needed for changing voltage levels in the selected word line when the reading operation is performed for all of the read voltages Vr15 to Vr1. As a result, the reading operation may be performed at a high speed.

[Additional 0009]

Figure 20A:
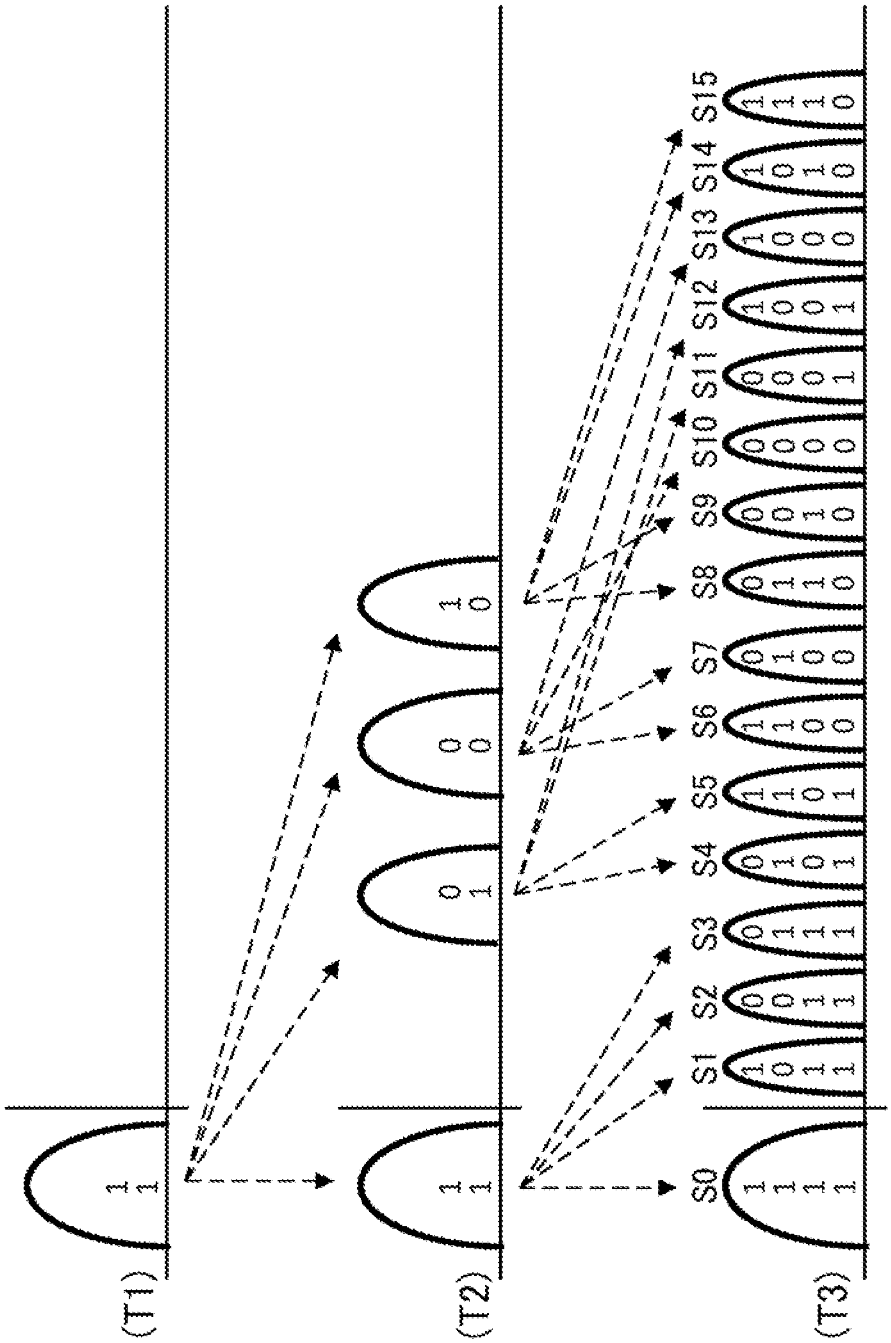
FIG. 20A is a diagram illustrating 3-4-4-4 data coding which is another modification.

Although the example of data coding shown in FIG. 19C has been described, basically any kind of data coding may be performed in the above-described manner. Since the reading operation is performed with the read voltage being sequentially changed from the highest voltage to the lowest voltage, whether the data of a page can be outputted depends on whether the reading operation with the read voltages that are required to determine the data is completed. Therefore, depending on the type of data coding, the pages are not read in the order of the Lower page, the Middle page, the Upper page, and the Top page, FIG. 20A is a diagram illustrating 3-4-4-4 data coding which is another modification of this embodiment, and FIG. 20B is a diagram illustrating 4-bit data in each threshold region in FIG. 20A. The relationship between the threshold voltage and the data value in FIG. 20A is as follows.

A memory cell of which the threshold voltage is in the S0 region is in a state of storing "1111".

A memory cell of which the threshold voltage is in the S1 region is in a state of storing "1101".

A memory cell of which the threshold voltage is in the S2 region is in a state of storing "1001".

A memory cell of which the threshold voltage is in the S3 region is in a state of storing "1011".

A memory cell of which the threshold voltage is in the S4 region is in a state of storing "0011".

A memory cell of which the threshold voltage is in the S5 region is in a state of storing "0111".

A memory cell of which the threshold voltage is in the S6 region is in a state of storing "0110".

A memory cell of which the threshold voltage is in the S7 region is in a state of storing "0010".

A memory cell of which the threshold voltage is in the S8 region is in a state of storing "1010".

A memory cell of which the threshold voltage is in the S9 region is in a state of storing "1000".

A memory cell of which the threshold voltage is in the S10 region is in a state of storing "0000".

A memory cell of which the threshold voltage is in the S11 region is in a state of storing "0001".

A memory cell of which the threshold voltage is in the S12 region is in a state of storing "0101".

A memory cell of which the threshold voltage is in the S13 region is in a state of storing "0100".

A memory cell of which the threshold voltage is in the S14 region is in a state of storing "1100".

A memory cell of which the threshold voltage is in the S15 region is in a state of storing "1110".

In the case of 3-4-4-4 data coding in FIG. 20A, the memory controller 2 causes the nonvolatile memory 3 to execute the first program for writing the data of the first bit and the second bit and then causes the nonvolatile memory 3 to execute the second program for writing the data of the third bit and the fourth bit. The nonvolatile memory 3 is caused to execute the first program and the second program so that the numbers of changes of the bit values at the time of writing the data of the first to fourth bits are 3, 4, 4, 4 in order. In addition, the memory controller 2 causes the nonvolatile memory 3 to execute the first program having four threshold regions, and then causes the nonvolatile memory 3 to execute the second program having a total of 16 threshold regions in which the number of changes from the four threshold regions is within seven.

As illustrated in FIG. 20B, the Lower page has one boundary position on the left side and two boundary positions on the right side with the center as a boundary. In addition, on the left side from the central position of the Lower page, the number of boundaries between 1 and 0 of the Middle page is two, the number of boundaries of the Upper page is three, the number of boundaries of the Top page is one, and 2-3-1 coding is performed. Also, 2-1-2 coding is performed on the right side from the boundary position of the Lower page. By adding these two codings, the coding becomes 3-4-4-4 data coding.

The boundary position between 1 and 0 can be arbitrarily interchanged between the pages in FIG. 20A. From the viewpoint that the maximum number of boundaries is four and the minimum number is three, 4-3-4-4 data coding is also conceivable. Alternatively, 4-4-3-4 or 4-4-4-3 coding is also conceivable. Furthermore, for example, various candidates are conceivable for 3-4-4-4 data coding. Hereinafter, the first to seventeenth candidate examples of 3-4-4-4 data coding will be described in order.

Figure 21A:
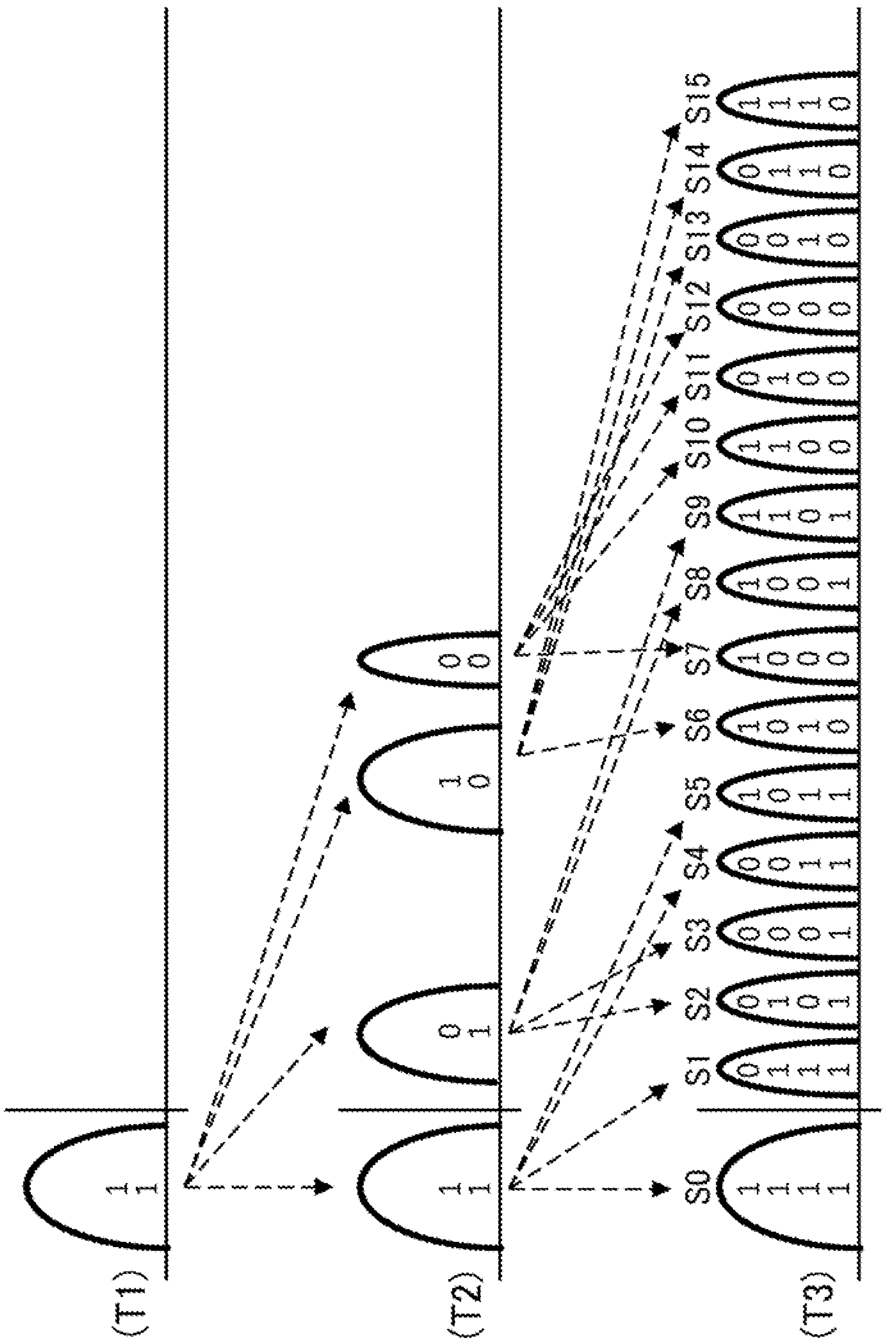
FIG. 21A is a diagram illustrating a first candidate example of 3-4-4-4 data coding.
Figure 22A:
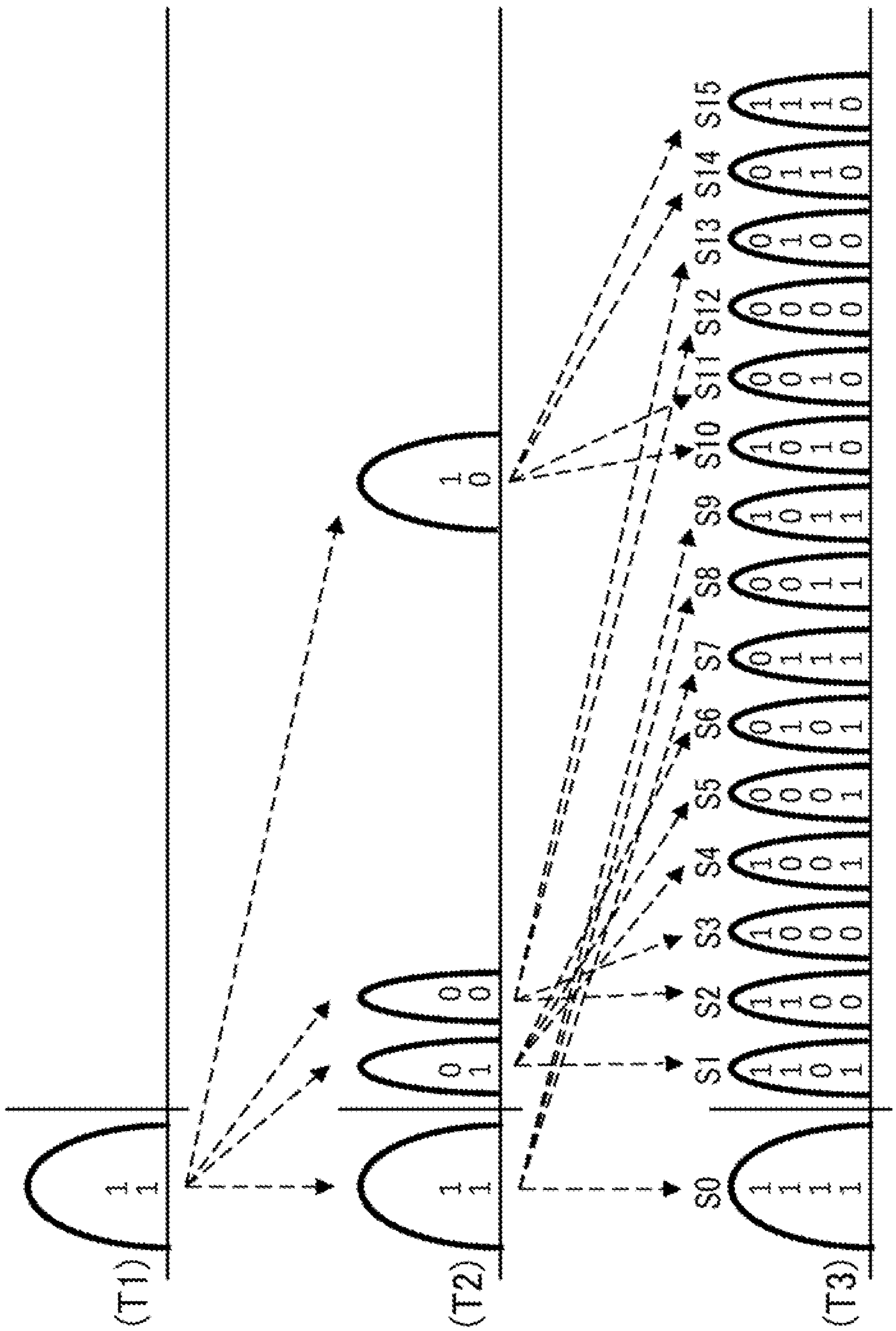
FIG. 22A is a diagram illustrating a second candidate example of 3-4-4-4 data coding.
Figure 23A:
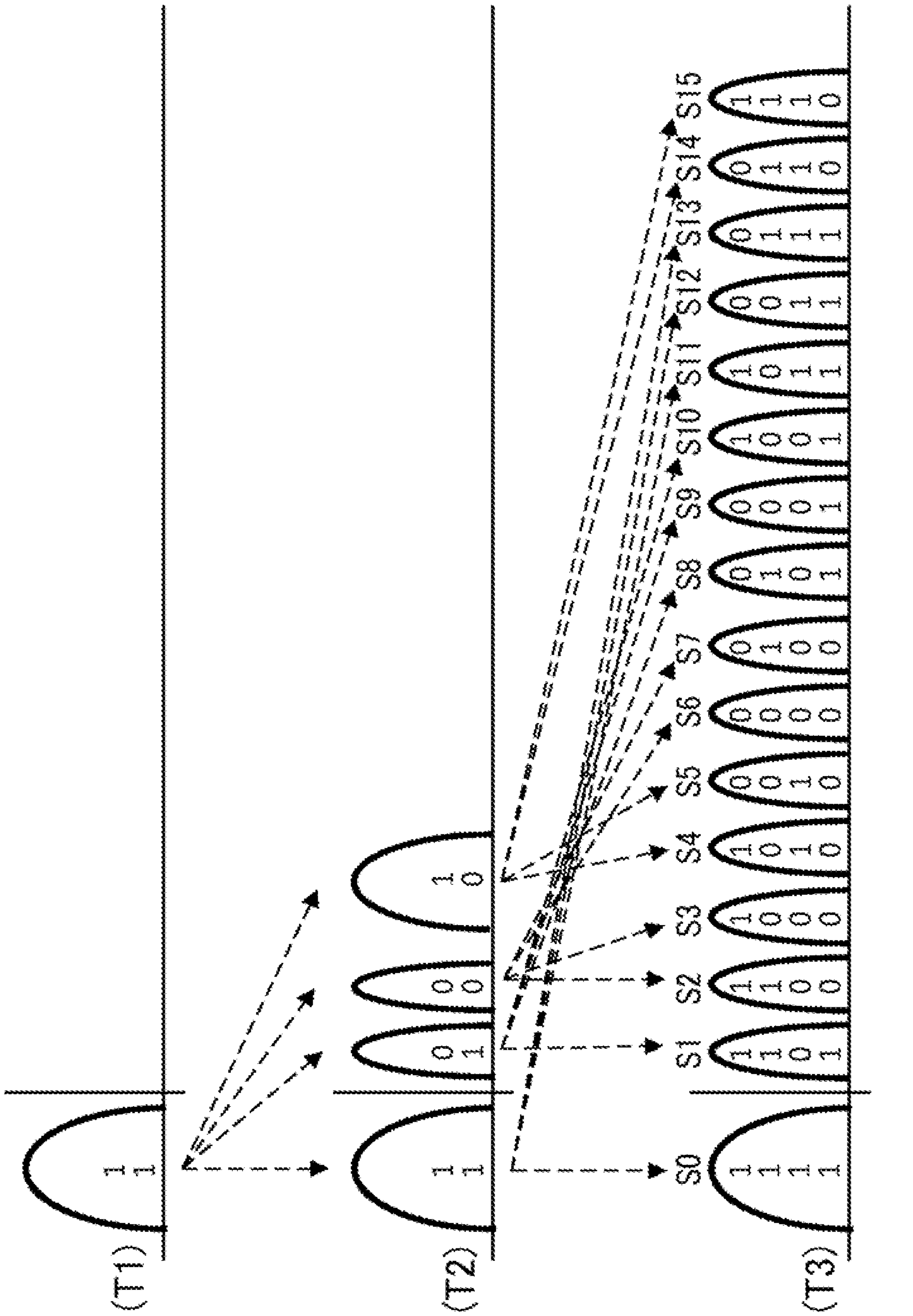
FIG. 23A is a diagram illustrating a third candidate example of 3-4-4-4 data coding.
Figure 24A:
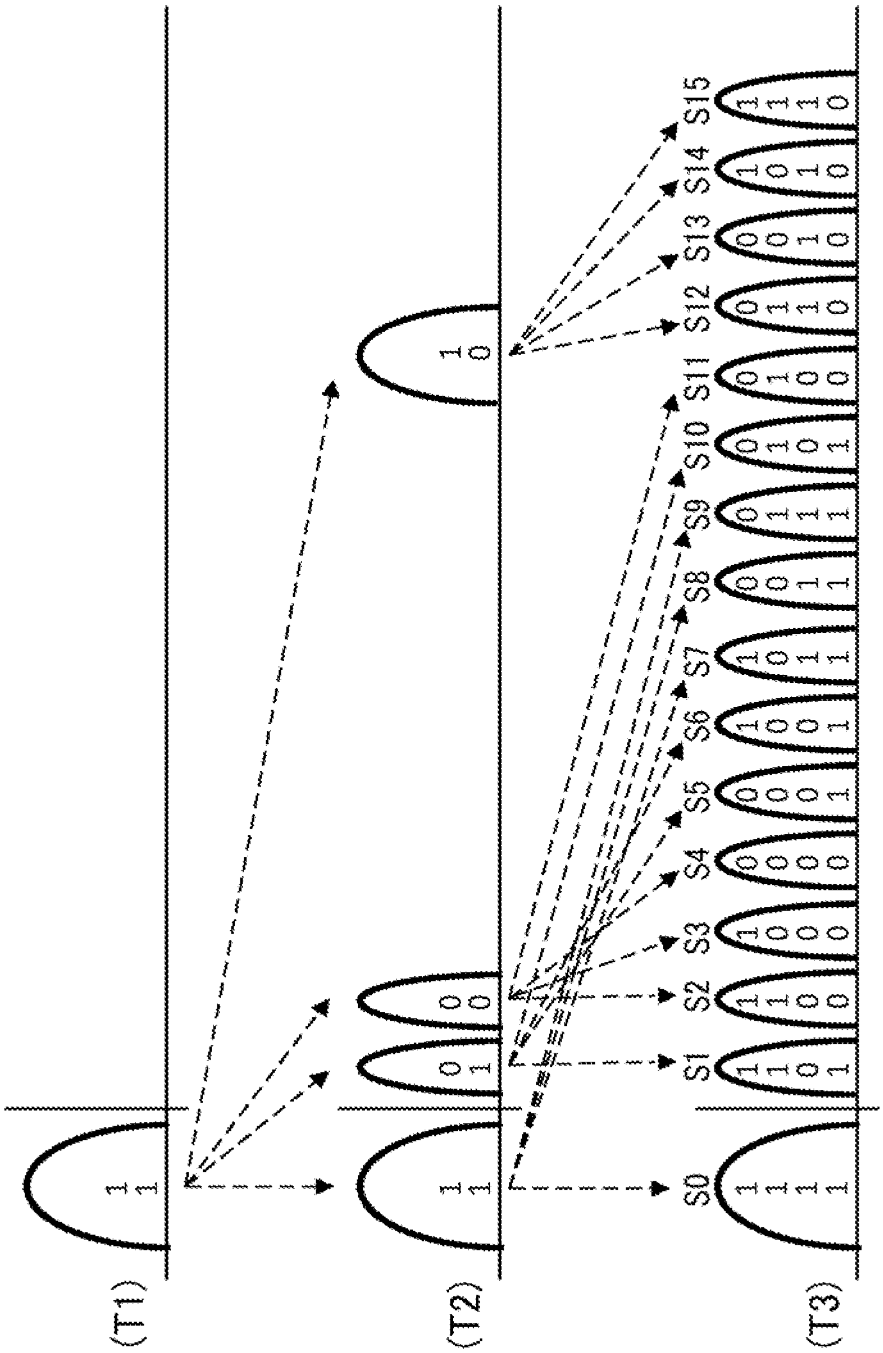
FIG. 24A is a diagram illustrating a fourth candidate example of 3-4-4-4 data coding.
Figure 25A:
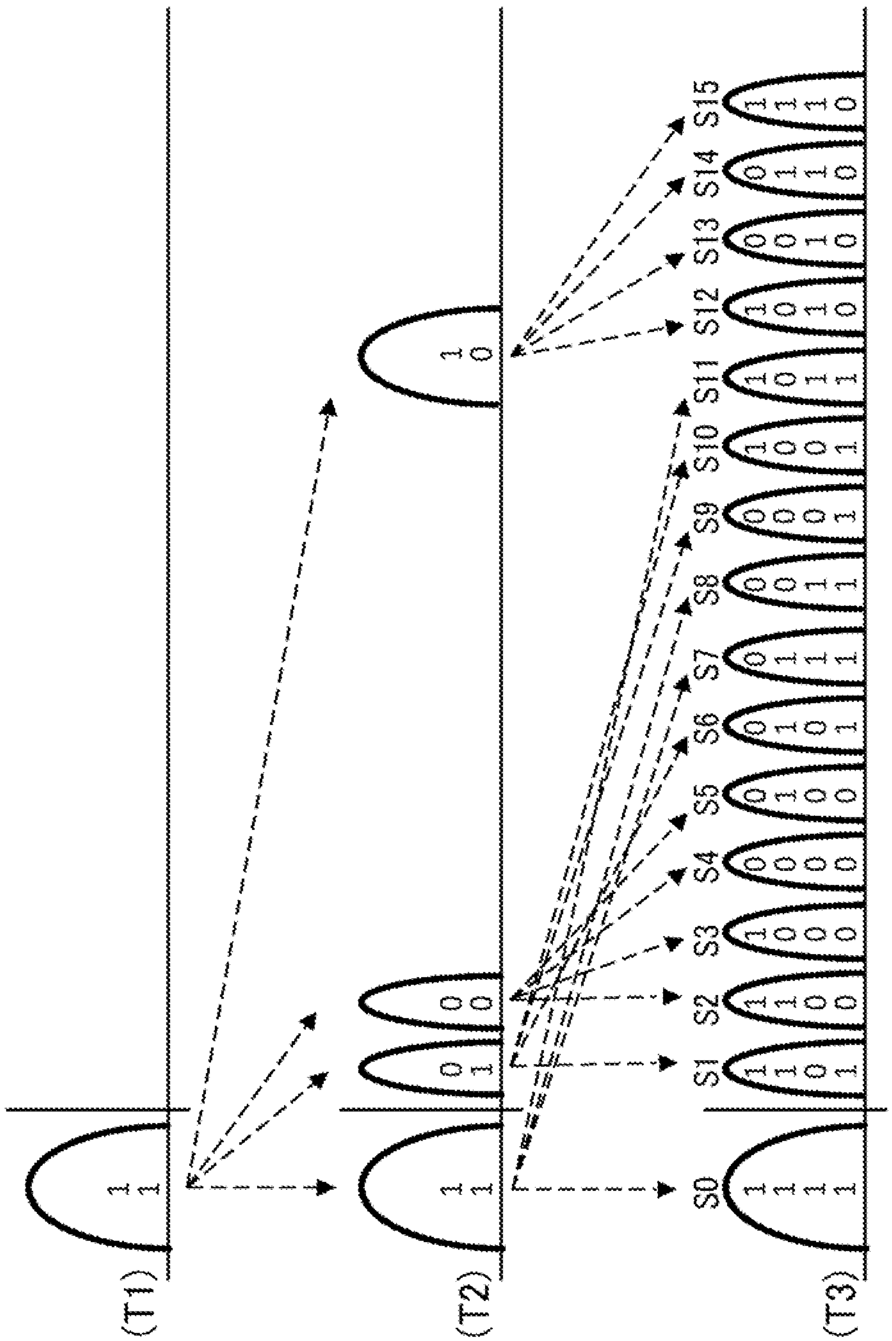
FIG. 25A is a diagram illustrating a fifth candidate example of 3-4-4-4 data coding.
Figure 26A:
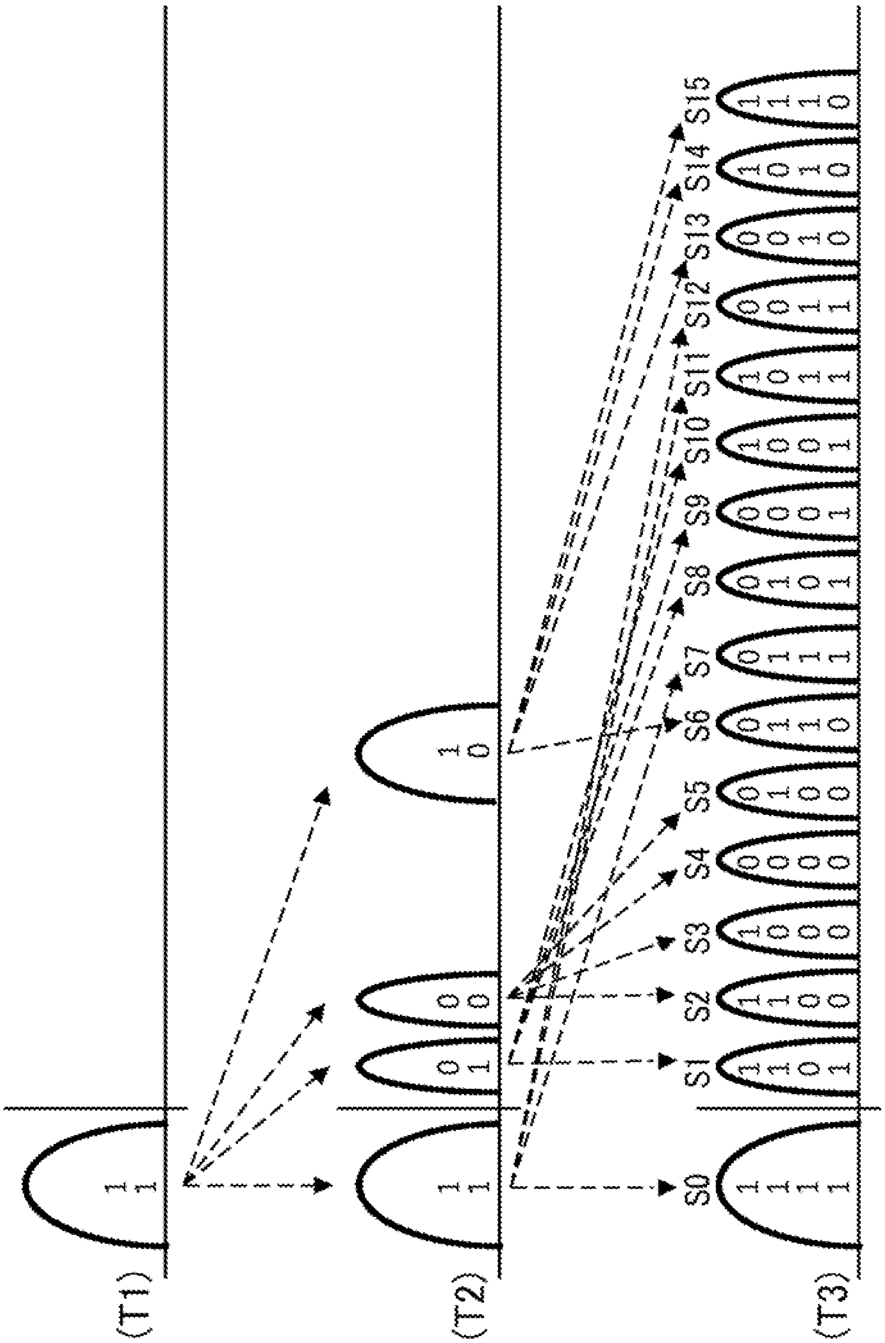
FIG. 26A is a diagram illustrating a sixth candidate example of 3-4-4-4 data coding.
Figure 27A:
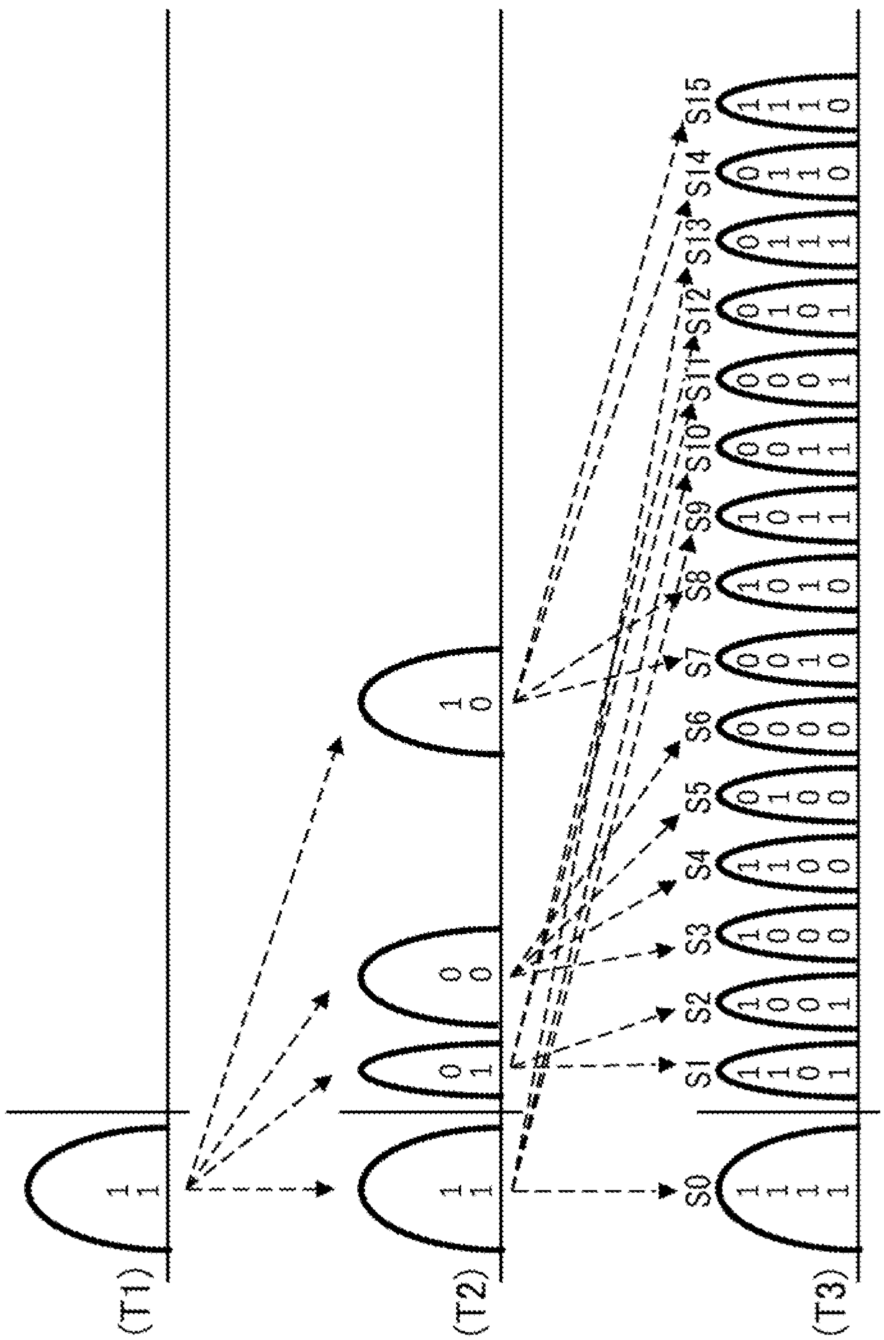
FIG. 27A is a diagram illustrating a seventh candidate example of 3-4-4-4 data coding.
Figure 28A:
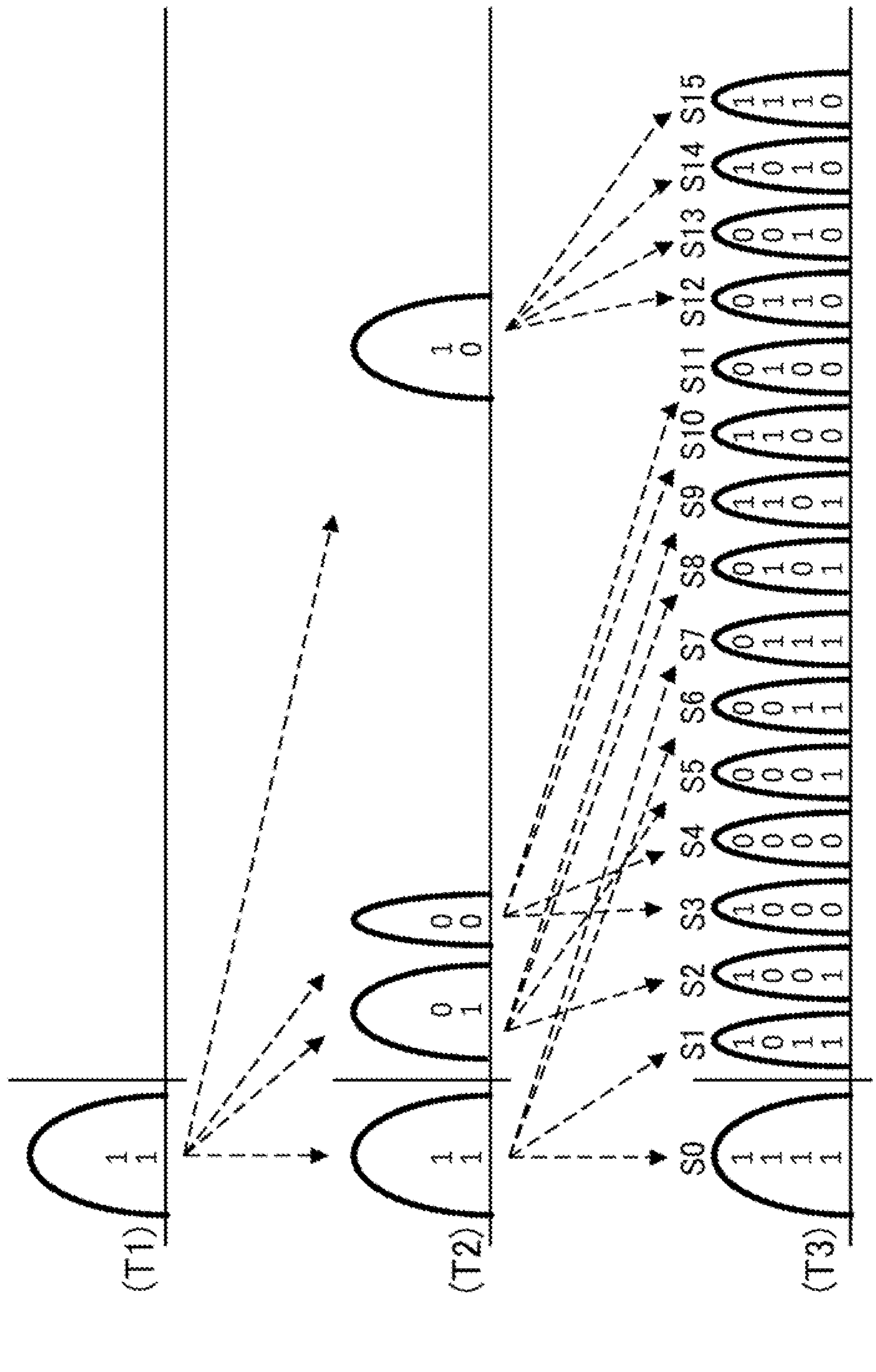
FIG. 28A is a diagram illustrating an eighth candidate example of 3-4-4-4 data coding.
Figure 29A:
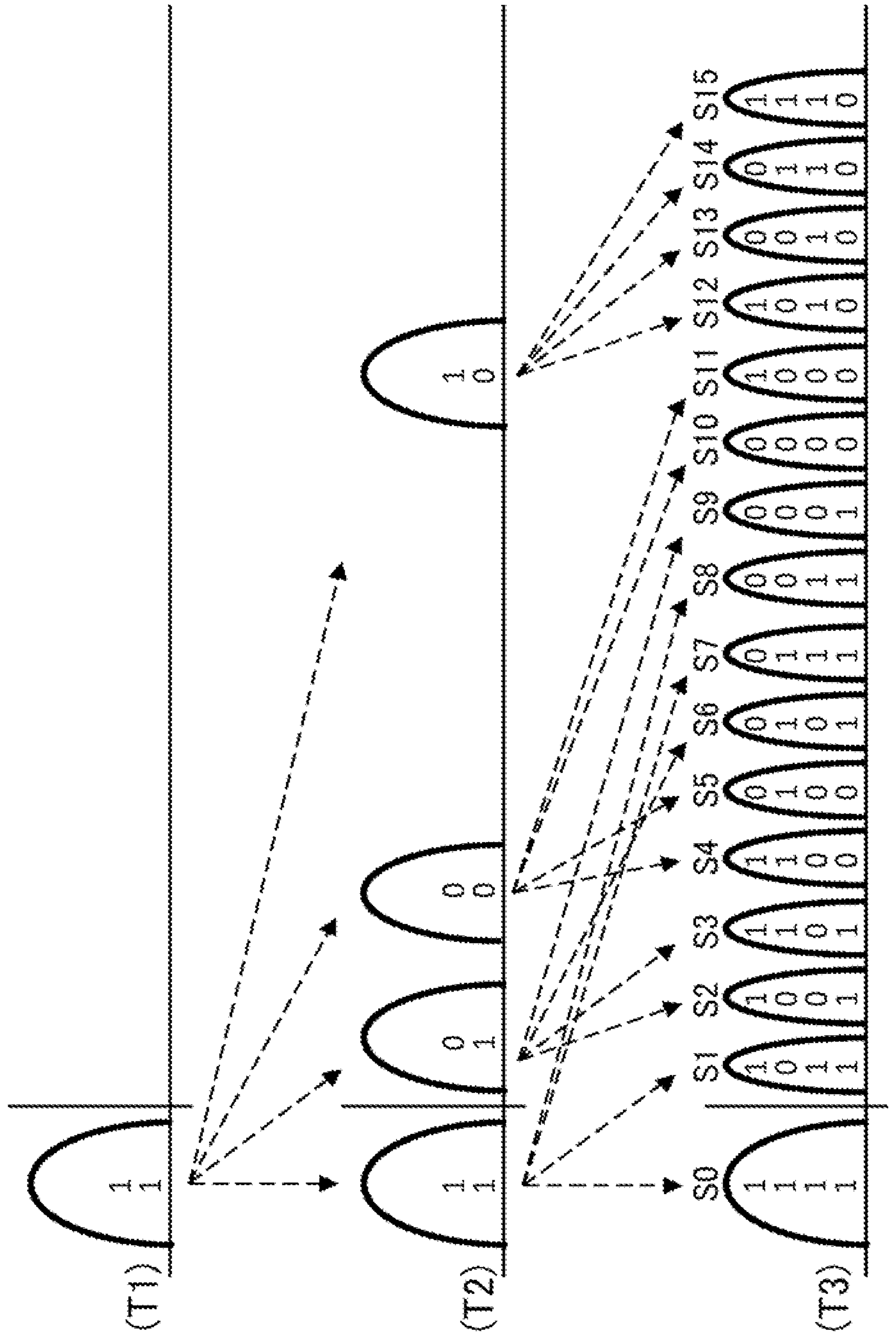
FIG. 29A is a diagram illustrating a ninth candidate example of 3-4-4-4 data coding.

For example, FIG. 21A is a diagram illustrating a first candidate example of 3-4-4-4 data coding, and FIG. 21B is a diagram illustrating 4-bit data in each threshold region in FIG. 20A, FIG. 22A is a diagram illustrating a second candidate example of 3-4-4-4 data coding, and FIG. 22B is a diagram illustrating 4-bit data in each threshold region in FIG. 22A. In the example of FIG. 22A, only one of the four threshold regions of the first stage is apart from the other threshold regions. FIG. 23A is a diagram illustrating a third candidate example of 3-4-4-4 data coding, and FIG. 23B is a diagram illustrating 4-bit data in each threshold region in FIG. 23A. In the example of FIG. 23A, four threshold regions of the first stage are arranged close to each other. FIG. 24A is a diagram illustrating a fourth candidate example of 3-4-4-4 data coding, and FIG. 24B is a diagram illustrating 4-bit data in each threshold region in FIG. 24A. In the example of FIG. 24A, only one of the four threshold regions of the first stage is arranged apart. FIG. 25A is a diagram illustrating a fifth candidate example of 3-4-4-4 data coding, and FIG. 2513 is a diagram illustrating 4-bit data in each threshold region in FIG. 25A. In the example of FIG. 25A, as in FIG. 24A, only one of the four threshold regions of the first stage is arranged apart. FIG. 26A is a diagram illustrating a sixth candidate example of 3-4-4-4 data coding, and FIG. 26B is a diagram illustrating 4-bit data in each threshold region in FIG. 26A. In the example of FIG. 26A, only one of the four threshold regions of the first stage is arranged slightly apart from the other three threshold regions. FIG. 27A is a diagram illustrating a seventh candidate example of 3-4-4-4 data coding, and FIG. 2713 is a diagram illustrating 4-bit data in each threshold region in FIG. 27A. In the example of FIG. 27A, as in FIG. 26A, only one of the four threshold regions of the first stage is arranged slightly apart from the other three threshold regions. FIG. 28A is a diagram illustrating an eighth candidate example of 3-4-4-4 data coding, and FIG. 2813 is a diagram illustrating 4-bit data in each threshold region in FIG. 28A. In the example of FIG. 28A, one of the four threshold regions of the first stage is arranged more apart from the other three threshold regions than that of FIG. 27A. FIG. 29A is a diagram illustrating a ninth candidate example of 3-4-4-4 data coding, and FIG. 29B is a diagram illustrating 4-bit data in each threshold region in FIG. 29A. In FIG. 29A, two of the four threshold regions of the first stage are arranged at a sufficient interval.

Figure 30A:
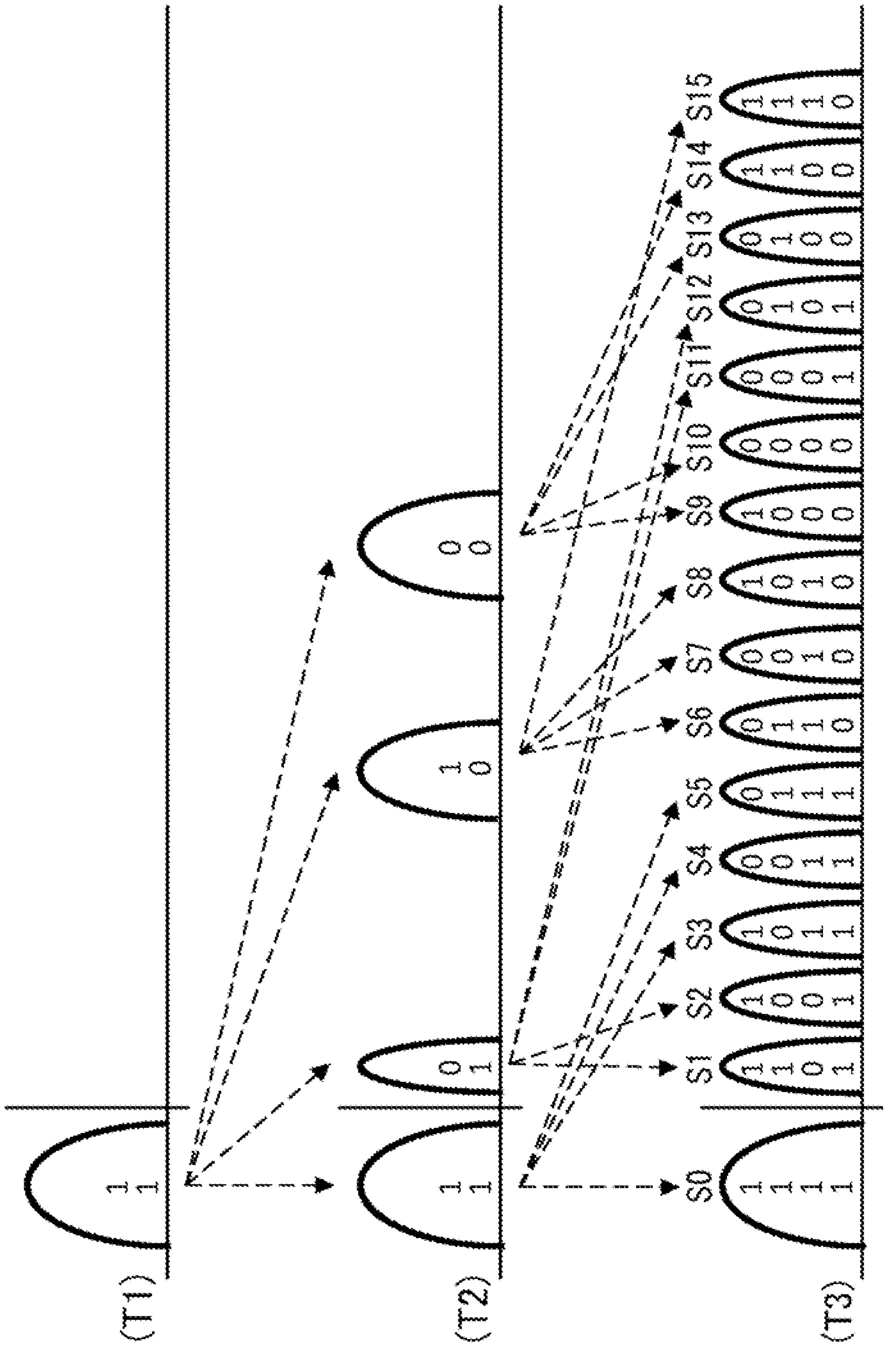
FIG. 30A is a diagram illustrating a tenth candidate example of 3-4-4-4 data coding.

FIG. 30A is a diagram illustrating a tenth candidate example of 3-4-4-4 data coding, and FIG. 30B is a diagram illustrating 4-bit data in each threshold region in FIG. 30A. FIG. 30A is an example in which the boundary positions between 1 and 0 of the predetermined pages in FIG. 20A are exchanged between pages.

Figure 31A:
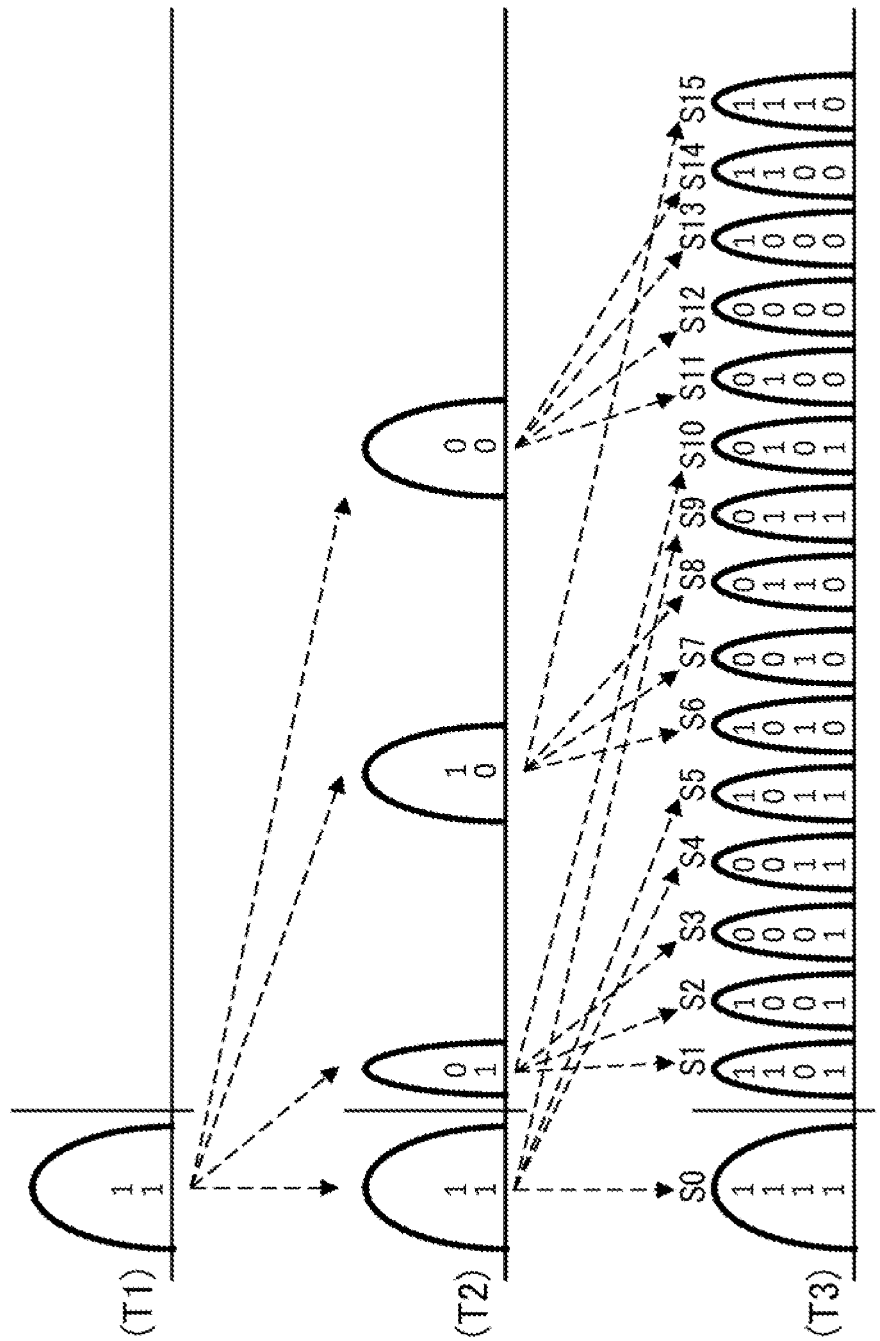
FIG. 31A is a diagram illustrating an eleventh candidate example for 3-4-4-4 data coding.
Figure 32A:
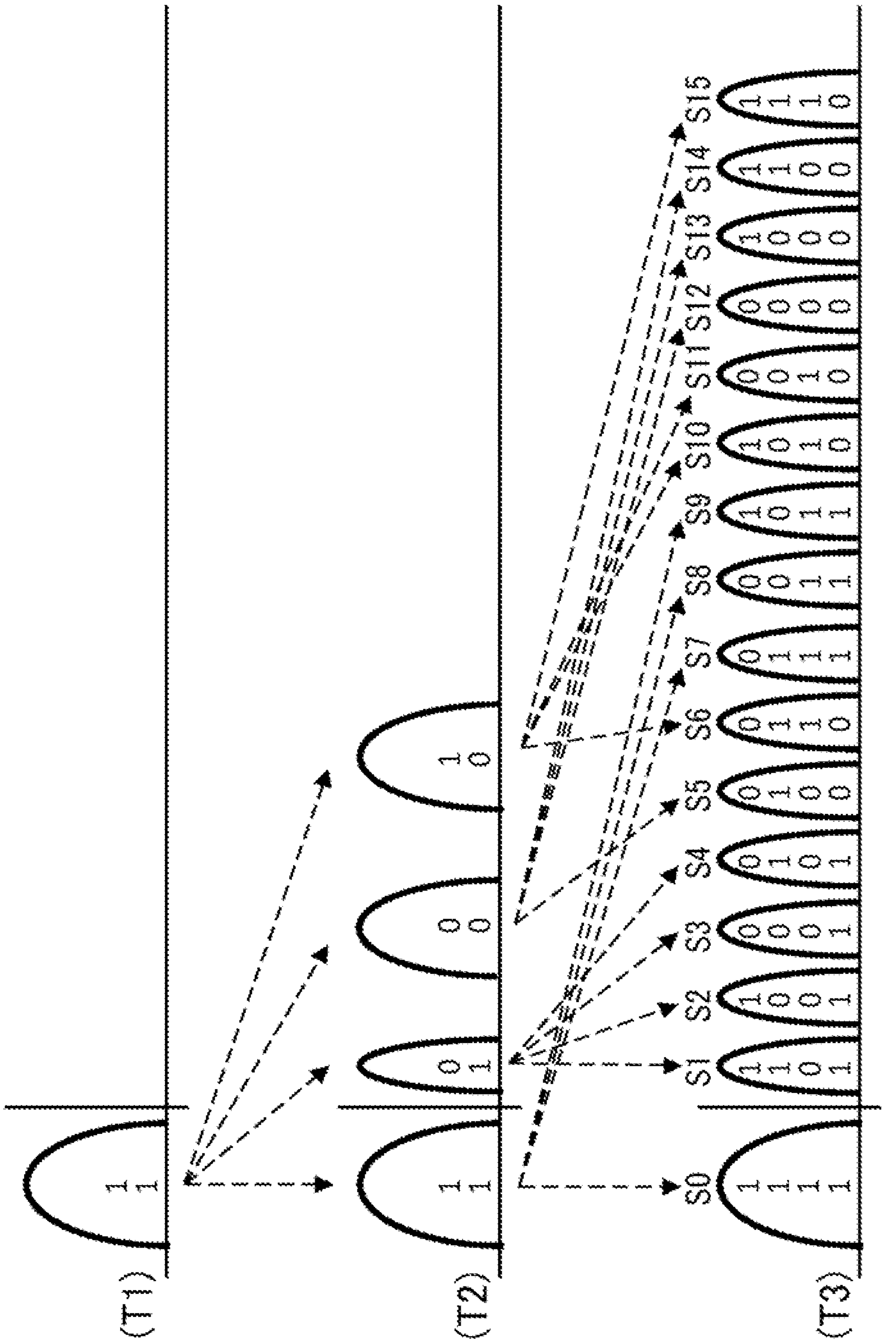
FIG. 32A is a diagram illustrating a twelfth candidate example of 3-4-4-4 data coding.
Figure 33A:
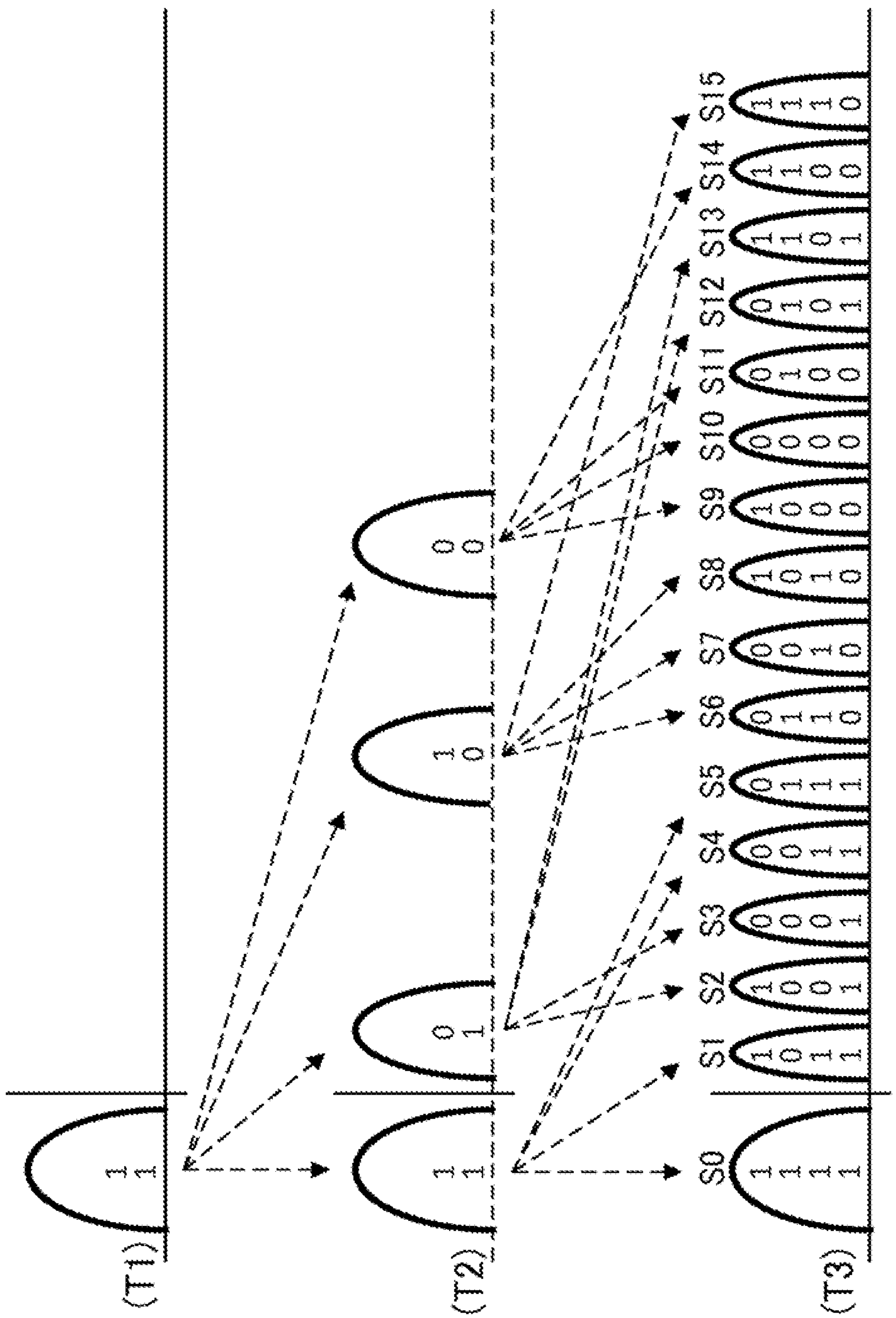
FIG. 33A is a diagram illustrating a thirteenth candidate example of 3-4-4-4 data coding.

FIG. 31A is a diagram illustrating an eleventh candidate example of 3-4-4-4 data coding, and FIG. 31B is a diagram illustrating 4-bit data in each threshold region in FIG. 31A. In FIG. 31A, two of the four threshold regions of the first stage are arranged at a sufficient interval. FIG. 32A is a diagram illustrating a twelfth candidate example of 3-4-4-4 data coding, and FIG. 32B is a diagram illustrating 4-bit data in each threshold region in FIG. 32A. In FIG. 32A, four threshold regions of the first stage are arranged dose to each other. FIG. 33A is a diagram illustrating a thirteenth candidate example of 3-4-4-4 data coding, and FIG. 33B is a diagram illustrating 4-bit data in each threshold region in FIG. 33A. In FIG. 33A, four threshold regions of the first stage are arranged dose to each other as in FIG. 32A.

Figure 34A:
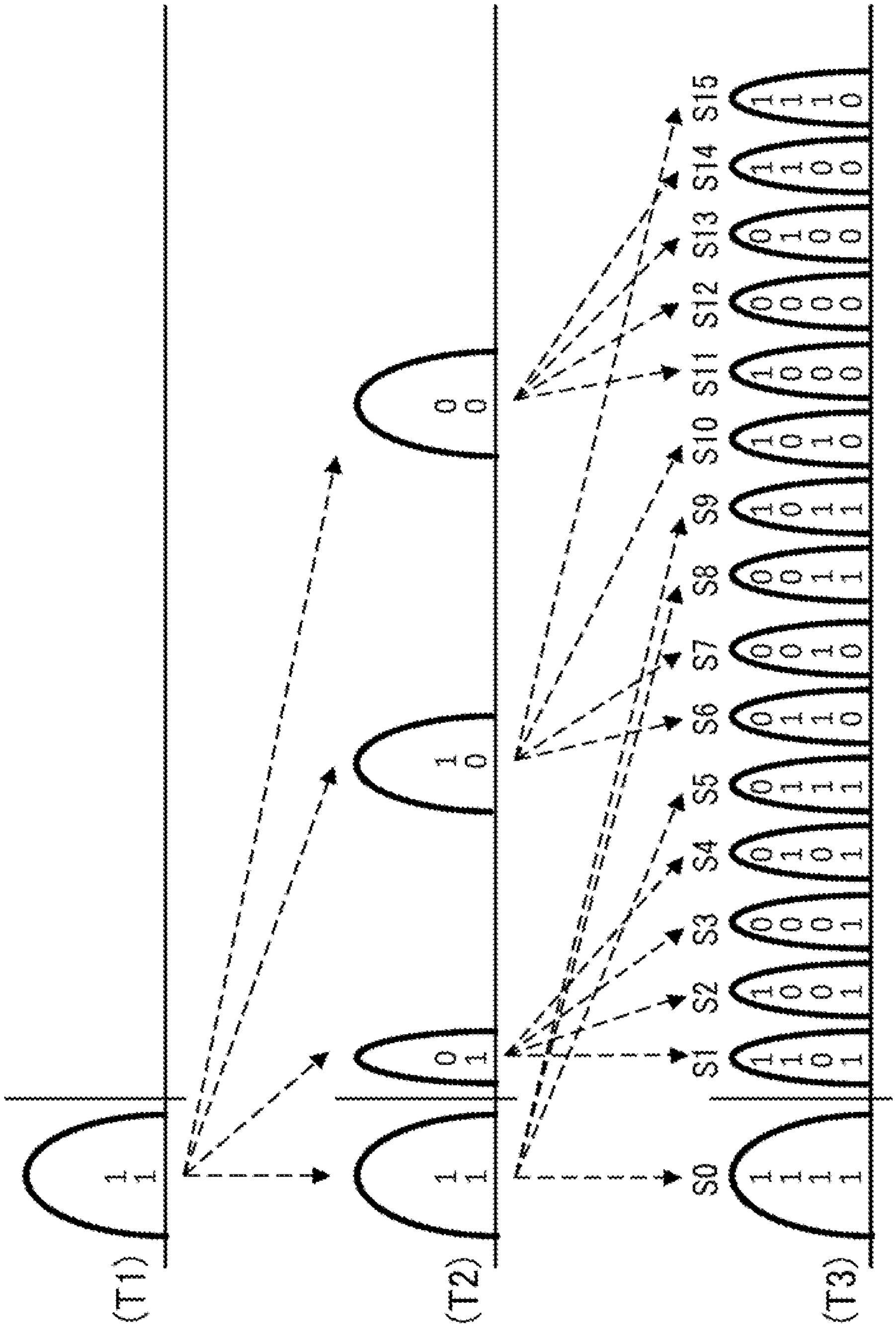
FIG. 34A is a diagram illustrating a fourteenth candidate example of 3-4-4-4 data coding.
Figure 35A:
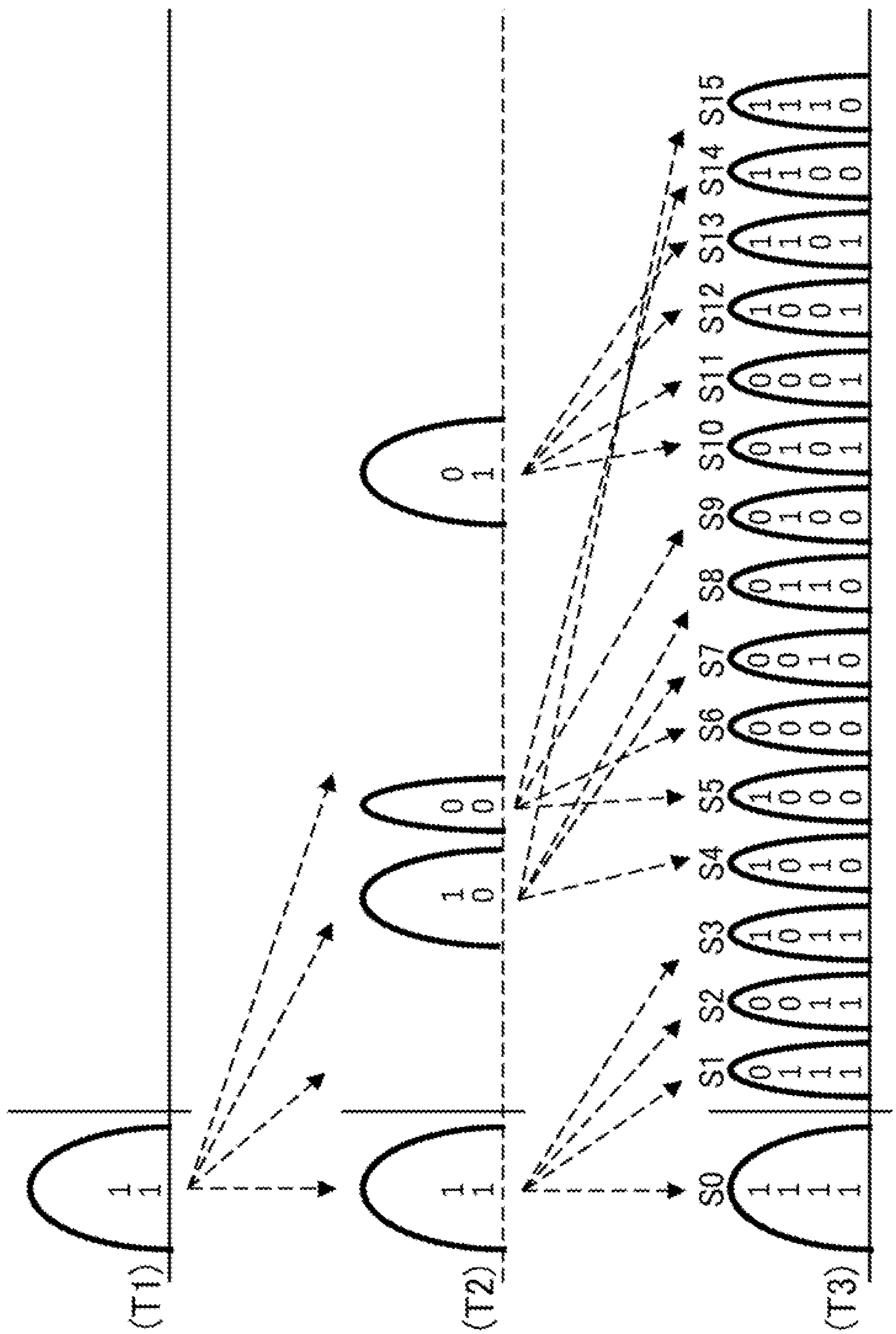
FIG. 35A is a diagram illustrating a fifteenth candidate example of 3-4-4-4 data coding.
Figure 36A:
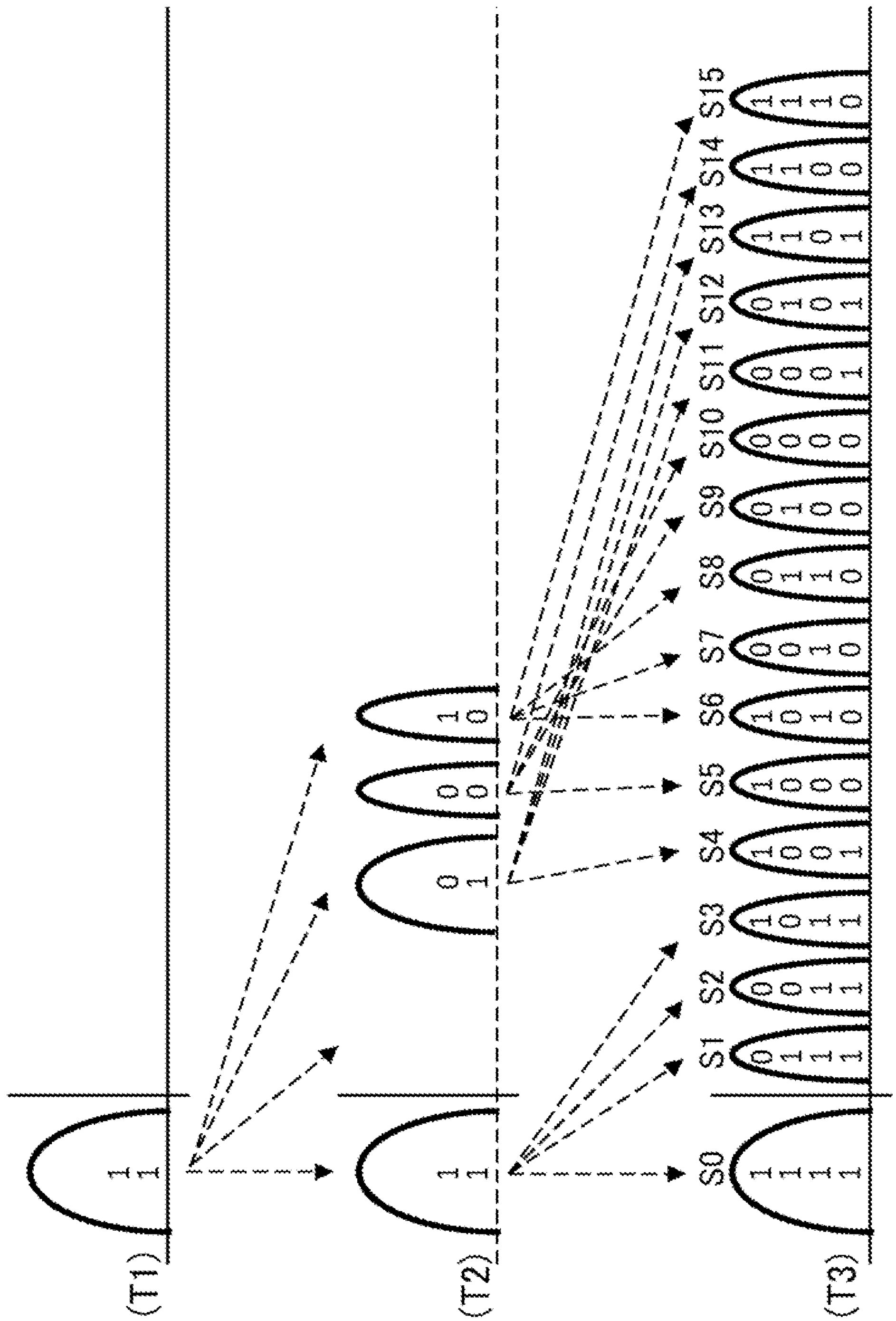
FIG. 36A is a diagram illustrating a sixteenth candidate example for 3-4-4-4 data coding.
Figure 37A:
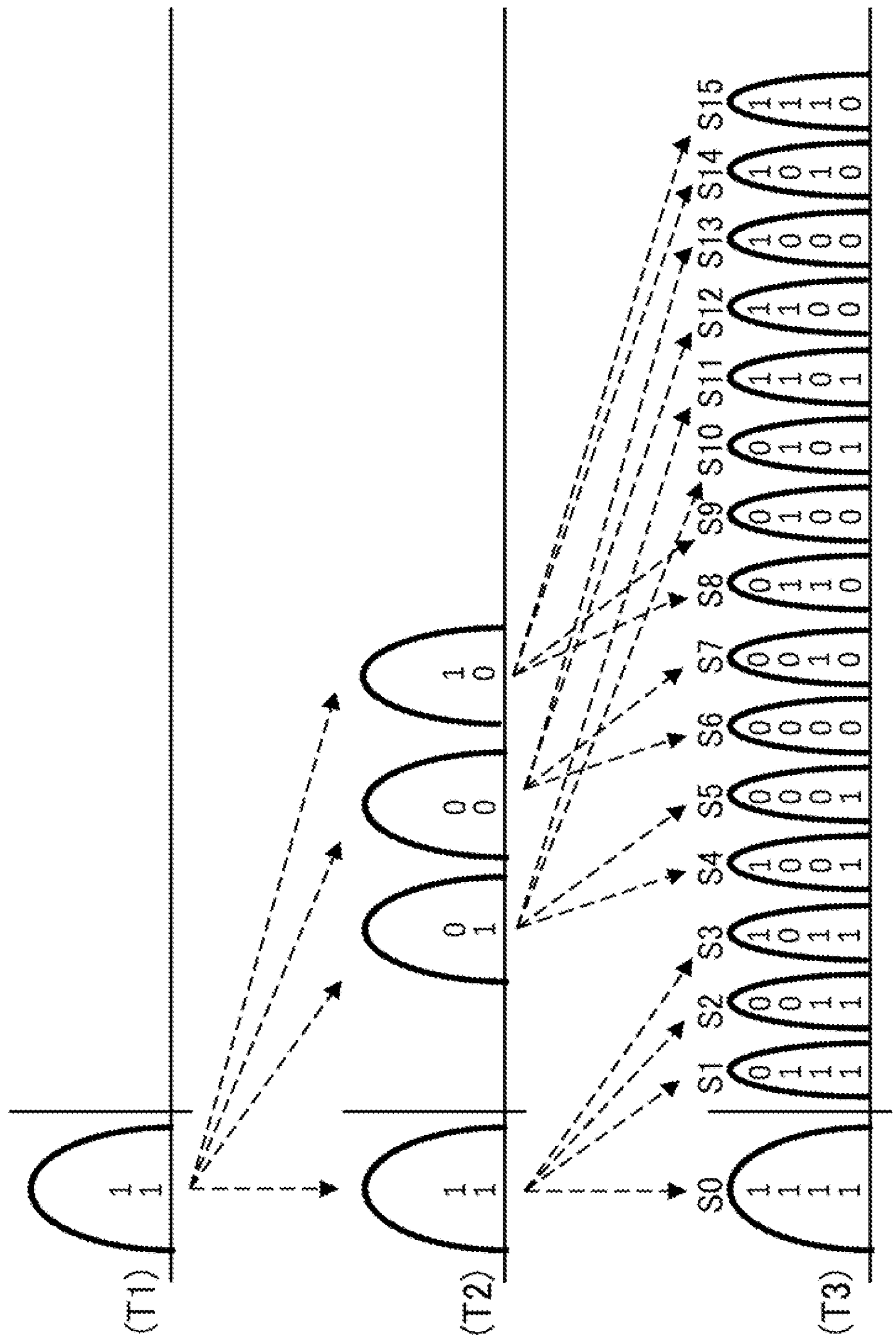
FIG. 37A is a diagram illustrating a seventeenth candidate example of 3-4-4-4 data coding.
Figure 38A:
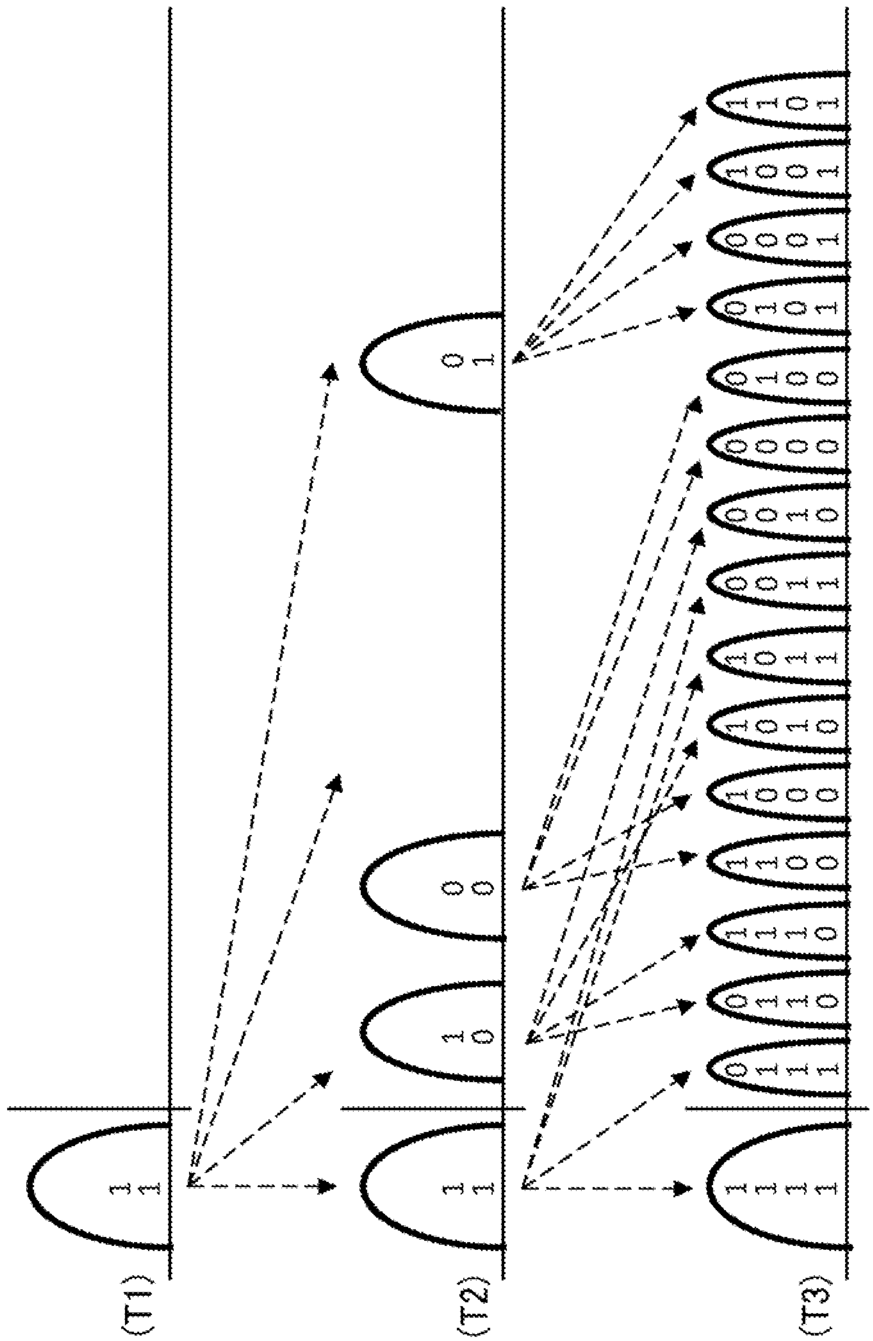
FIG. 38A is a diagram illustrating a modification of the 4-3-4-4 data coding of FIG. 20A.

FIG. 34A is a diagram illustrating a fourteenth candidate example of 3-4-4-4 data coding, and FIG. 34B is a diagram illustrating 4-bit data in each threshold region in FIG. 34A. FIG. 34A is an example in which the boundary positions of 1 and 0 of the predetermined pages in FIG. 21A are exchanged between pages, FIG. 35A is a diagram illustrating a fifteenth candidate example of 3-4-4-4 data coding, and FIG. 35B is a diagram illustrating 4-bit data in each threshold region in FIG. 35A. In FIG. 35A, four threshold regions of the first stage are arranged dose to each other as in FIG. 32A. FIG. 36A is a diagram illustrating a sixteenth candidate example of 3-4-4-4 data coding, and FIG. 36B is a diagram illustrating 4-bit data in each threshold region in FIG. 36A. In FIG. 36A, four threshold regions of the first stage are arranged dose to each other as in FIG. 35A. FIG. 37A is a diagram illustrating a seventeenth candidate example of 3-4-4-4 data coding, and FIG. 37B is a diagram illustrating 4-bit data in each threshold region in FIG. 37A. In FIG. 37A, two of the four threshold regions of the first stage are arranged at a sufficient interval. FIG. 38A is a diagram illustrating a modification of 3-4-4-4 data coding in FIG. 20A, and FIG. 38B is a diagram illustrating 4-bit data in each threshold region in FIG. 38A. In the example of FIG. 38A, one threshold region of the first stage is greatly apart from the other three threshold regions.

As described above, various modifications of the QLC in which two pages of program are performed in each of the first stage and the second stage have been described, but various other modifications also can be considered. Below, the modification which is not described until now is listed collectively.

FIGS. 39 and 40 are diagrams illustrating another modification of 1-4-5-5 data coding, and illustrate 4-bit data in each threshold region, FIG. 41 is a diagram illustrating another modification of 3-2-5-5 data coding. FIGS. 42 and 43 are diagrams illustrating other modifications of 3-5-3-4 data coding. FIGS. 44 and 45 are diagrams illustrating other modifications of 1-2-6-6 data coding. FIG. 46 is a diagram illustrating another modification of 1-2-6-6 data coding. FIG. 47 is a diagram illustrating another modification of 1-2-4-8 data coding, FIGS. 48, 50, and 51 are diagrams illustrating other modifications of 1-2-5-7 data coding, and FIG. 49 is a diagram illustrating another modification of 1-2-7-5 data coding.

In any of FIGS. 39 to 51, data coding in which the Top page and Upper page are interchanged is possible, and similarly, data coding in which the Middle page and Lower page are interchanged is also possible.

Thus, in the first embodiment, when programming a 4-bit/Cell NAND memory 5 having a three-dimensional structure or a two-dimensional structure, for example, 1-4-5-5 data coding as illustrated in FIG. 7A is adopted. The program is performed in two stages. Since the page data used for data programming in each stage is used only in that stage, the amount of data to be stored in the write buffer before programming can be greatly reduced. Therefore, the size of the write buffer built in the memory controller 2 can be reduced.

Further, in this embodiment, since the variation in the number of times the bit value changes in each page is small, the deviation of the bit error rate between pages of the nonvolatile memory 3 can be reduced. For this reason, it is not necessary to strengthen the error correction capability of the ECC circuit 10, and the cost required for the ECC circuit 10 can be reduced. Further, since data transfer is performed only once for each page, transfer time and power consumption can be suppressed. Further, since each program stage is executed while straddling the word line WLi, the amount of interference between adjacent cells with the adjacent word line WLi can be reduced.

Further, the number of changes at the time of changing from the threshold region of the first stage to the threshold region of the second stage can be suppressed by using 1-4-5-5 data coding in FIG. 7A or 18A, 3-2-5-5 data coding in FIG. 19A, or 3-4-4-4 data coding in FIG. 20A. In addition, since the four threshold regions programmed in the first stage are spaced evenly, the margin for the IDL performed before the second stage program can be expanded, and the reliability of the write sequence can be improved.

Further, by using 1-4-5-5 data coding in FIG. 7A or 18A, 3-2-5-5 data coding in FIG. 19A, or 3-4-4-4 data coding in FIG. 20A, the total number of data changes in the threshold regions of the Lower page and the Middle page can be suppressed to five, and thus the program for the Lower page and the Middle page can be sped up.

In any of FIGS. 7 and 18 to 51, the boundary positions of 1 and 0 of each page of the Lower page, Middle page, Upper page, and Top page can be arbitrarily interchanged between pages. That is, any two pages of the four pages can be programmed in the first stage. Therefore, there are ${}_4C_2=6$ combinations for each candidate example. Since writing is completed from the lower page, the page buffer 24 may be overwritten in the order of L→M→U→T.

The programming of the Lower page and the Middle page can be sped up, for example, when the step voltage at the time of writing while stepping up the write voltage little by little is set to a larger value compared to the time of the second stage program when writing and verifying after the writing are repeated.

Second Embodiment

Next, a second embodiment will be described using FIGS. 52 and 53. In the second embodiment, the second stage program of the word line WLn−1 and the first stage program of the word line WLn are performed together. That is, the memory controller 2 according to the second embodiment instructs the nonvolatile memory 3 to continuously execute the first program for the memory cells connected to the first word line and the second program for the memory cells connected to the second word line by a continuous command and a single data input. Also in this embodiment, a case where the same data coding as that described in FIG. 6 of the first embodiment is used will be described.

In the program flowchart illustrated in FIG. 9, the first stage program and the second stage program are all separated one by one, and each program command and program data is necessarily input for each program. On the other hand, in this embodiment, the program command and the program data input are combined as much as possible in the first stage program and the second stage program.

For example, in the example illustrated in FIG. 8B, the program of the first stage of the word line WLn and the program of the second stage of the word line WLn−1 are necessarily continuously performed except for the beginning and end of the block. Thus, in this embodiment, the program command and the program data are input together for the first stage program of the word line WLn and the second stage program of the word line WLn−1. That is, the program data of the Lower page/Middle page of the word line WLn and the Upper/Top pages of the word line WLn−1 are input together from the memory controller 2 to the nonvolatile memory 3 by a single command input. This is the same data amount as in a case where the data of the Lower/Middle/Upper/Top pages is input together for four pages with a single program command in the case of adopting the Foggy-Fine. However, in the case of Foggy-Fine, the page data in the same word line WLi are input together, whereas in this embodiment, the program command and the program data of the two word lines WLn and WLn−1 are input together.

In this way, by inputting program commands and program data together, the frequency of command input and polling (periodic check on whether or not chip busy has returned to ready) in the control performed by the memory controller 2 is reduced. Thus, the memory system 1 can be sped up, and the processing can be simplified.

Hereinafter, an example of a writing procedure according to the second embodiment will be described with reference to FIGS. 52 and 53. FIGS. 52 and 53 illustrate a writing procedure following the program order illustrated in FIG. 8B. The description of the same processes as those described in FIGS. 9 to 11 among the processes illustrated in FIG. 52 or 53 is omitted.

Figure 52:
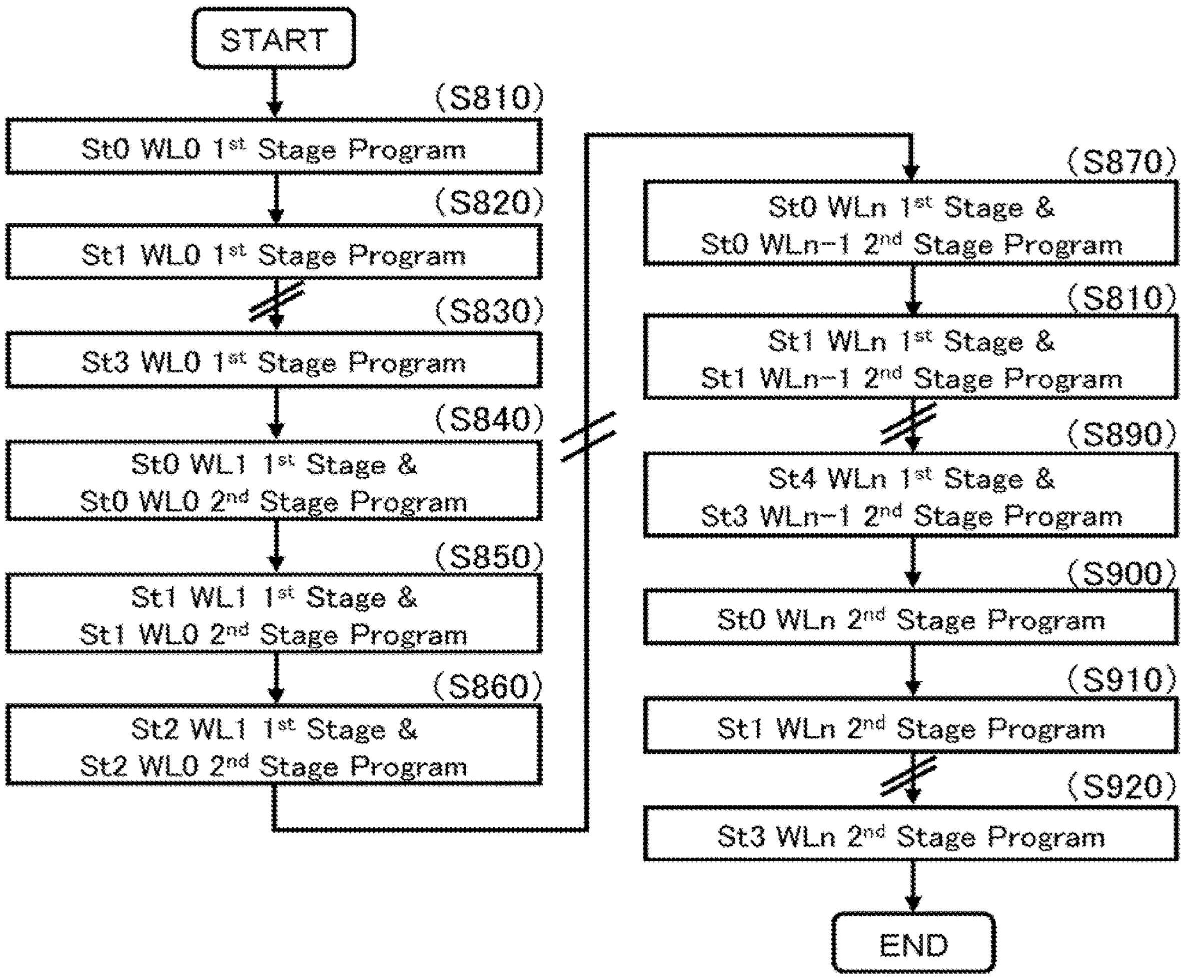
FIG. 52 is a flowchart illustrating a writing procedure for the entire one block according to a second embodiment.

FIG. 52 is a flowchart illustrating a writing procedure for the entire one block according to the second embodiment. One block here has n+1 word lines WLi of the word lines WL0 to WLn (n is a natural number). FIG. 53 is a sub-flowchart illustrating a writing procedure in the first stage and the second stage according to the second embodiment.

As illustrated in FIG. 52, when writing is started, the control unit 22 executes the processes of steps S810 to S830 which are the same processes as steps S10 to S30. As a result, the first stage program of the word line WL0 of the strings St0 to St3 is executed.

Further, the control unit 22 executes the first stage program of the string St0_word line WL1 and the second stage program of the string St0_word line WL0 (step S840). Next, the control unit 22 executes the first stage program of the string St1_word line WL1 and the second stage program of the string St1_word line WL0 (step S850). Next, the control unit 22 executes the first stage program of the string St2_word line WL1 and the second stage program of the string St2_word line WL0 (step S860). Thereafter, the control unit 22 repeats the processes of steps S840, S850, and S860 for each word line WLi of each string St.

Then, the control unit 22 executes the first stage program of the string St0_word line WLn and the second stage program of the string St0_word line WLn−1 (step S870). Next, the control unit 22 executes the first stage program of the string St1_word line WLn and the second stage program of the string St1_word line WLn−1 (step S880). Thereafter, the control unit 22 repeats the same processing as in steps S870 and S880 for each word line WLi of each string St.

Then, the control unit 22 executes the first stage program of the string St3_word line WLn and the second stage program of the string St3_word line WLn−1 (step S890). Next, the control unit 22 executes the processes of steps S900 to S920 which are the same processes as steps S100 to S120. As a result, the second stage program of the word lines WLn of the strings St0 to St3 is executed.

As described above, the program of only the first stage is executed at the beginning of the block as in the first embodiment, and the program of only the second stage is executed at the end of the block as in the first embodiment. In this case, the program of only the first stage is executed according to the procedure illustrated in FIG. 10, and the program of only the second stage is executed according to the procedure illustrated in FIG. 11. Also, between the beginning and end of the block, the first stage program and the second stage program are executed alternately on different word lines.

Figure 53:
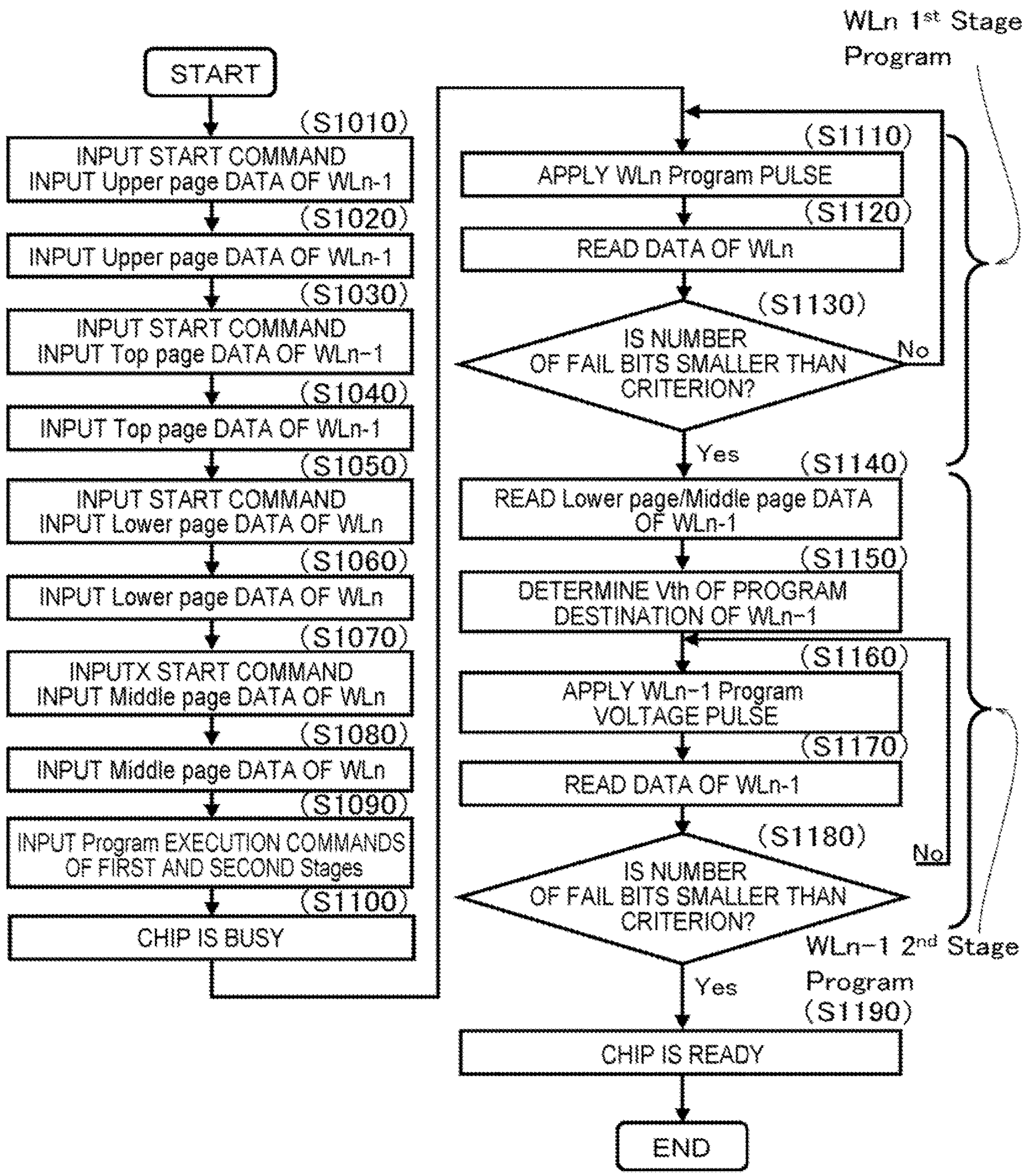
FIG. 53 is a flowchart illustrating a writing procedure of the first stage and the second stage according to the second embodiment.

FIG. 53 is a flowchart illustrating a writing procedure of the first stage and the second stage according to the second embodiment. In the first stage and second stage programs, after the second stage program is executed, the first stage program is subsequently executed. Specifically, first, the input start command of the Upper page data of the word line WLn−1 is input from the memory controller 2 to the nonvolatile memory 3 (step S1010). Then, the Upper page data of the word line WLn−1 is input from the memory controller 2 to the nonvolatile memory 3 (step S1020).

Next, the input start command of the Top page data of the word line WLn−1 is input from the memory controller 2 to the nonvolatile memory 3 (step S1030). Then, the Top page data of the word line WLn−1 is input from the memory controller 2 to the nonvolatile memory 3 (step S1040).

Next, the input start command of the Lower page data of the word line WLn is input from the memory controller 2 to the nonvolatile memory 3 (step S1050). Then, the Lower page data of the word line WLn is input from the memory controller 2 to the nonvolatile memory 3 (step S1060).

Next, the input start command of the Middle page data of the word line WLn is input from the memory controller 2 to the nonvolatile memory 3 (step S1070). Then, the Middle page data of the word line WLn is input from the memory controller 2 to the nonvolatile memory 3 (step S1080).

Next, the program execution commands of the first and second stages are input from the memory controller 2 to the nonvolatile memory 3 (step S1090), and thereby the chip is busy (step S1100).

Thereafter, one or more program voltage pulses are applied to the Lower page/Middle page of the word line WLn (step S1110). Then, in order to confirm whether or not the memory cell moves beyond the threshold boundary level, the data reading of the Lower page/Middle page of the word line WLn is performed (step S1120).

Furthermore, it is confirmed whether or not the number of data fail bits in the Lower page/Middle page is smaller than the criterion (step S1130). When the number of fail bits of data in the Lower page/Middle page is greater than or equal to the criterion (No in step S1130), the processes of steps S1110 to S1130 are repeated. When the number of data fail bits becomes smaller than the criterion (Yes in step S1130), the Lower page/Middle page data of the word line WLn−1 is read (step S1140).

Then, the Vth (threshold voltage) of the program destination of the Upper page and Upper page is determined based on the Lower/Middle page data of the word line WLn−1 (step S1150). Thereafter, the data writing to the Upper page and Top page of the word line WLn−1 is performed using the determined Vth.

At the time of writing data to the Upper page and Top page, one or more program voltage pulses are applied to the Upper page and Top page of the word line WLn−1 (step S1160). Then, in order to confirm whether or not the memory cell moves beyond the threshold boundary level, the data reading of the Upper page and Top page of word line WLn−1 is performed (step S1170).

Further, it is confirmed whether or not the number of data fail bits in the Upper page and the Top page is smaller than the criterion (step S1180). When the number of data fail bits in the Upper page and the Top page is greater than or equal to the criterion (No in step S1180), the processes of steps S1160 to S1180 are repeated. When the number of data fail bits becomes smaller than the criterion (Yes in step S1180), the chip is ready (step S1190).

Note that any of the processes of steps S1010, S1030, and S1050 may be performed first. In addition, any of the processes in steps S1020, S1040, and S1060 may be performed first. However, the process of step S1020 is performed after the process of step S1010, the process of step S1040 is performed after the process of step S1030, and the process of step S1060 is performed after the process of step S1050.

Note that the processes of steps S1140 to S1180 illustrated in FIG. 53 correspond to the second stage program of word line WLn−1, and the processes of steps S1110 to S1130 correspond to the first stage program of word line WLn.

As described above, in FIG. 53, the case where the first stage program of the word line WLn is executed before the second stage program of the word line WLn−1 has been described. This is because the first stage program of the word line WLn is performed first so that the cells of the word line WLn−1 to which the 16-value threshold voltage Vth is written are not affected by the adjacent cells.

As described above, in this embodiment, the data for four pages including the data of the Upper page and the Top page of the word line WLn−1 and the data of the Lower page and the Middle page of the word line WLn is continuously input from the memory controller 2 to the nonvolatile memory 3 by one program command and program data.

As another modification, after the program command is input, the Lower page and Middle page data of the word line WLn−1 is first read as the IDL, and then the Lower page and Middle page of the word line WLn are programmed. Next, the Vth of the program destination of the Upper page and the Top page is determined, and the Upper page and the Top page of the word line WLn are programmed with the determined Vth. In this way, the Lower page and Middle page data of the word line WLn−1 of the IDL can be read before the interference between adjacent cells due to the writing of the word line WLn is received.

The actual execution order of the program by the collective command of the first stage of the word line WLn and the second stage of the word line WLn−1 in this embodiment can be modified. That is, either the program of the Lower page and Middle page of the word line WLn illustrated in FIG. 53 or the reading of the Lower page and Middle page data of the word line WLn−1 as IDL may be performed first and can be interchanged. The IDL (reading the Lower page and Middle page data of the word line WLn−1) is performed before the program of the Lower page and Middle page of the word line WLn, so that the IDL is possible without being affected by the program of the Lower page and Middle page of the word line WLn.

As described above, in the second embodiment, since the second stage program of the word line WLn−1 and the first stage program of the word line WLn are collectively performed, the frequency of command input and polling is reduced. Therefore, the memory system 1 can be sped up, and the process can be simplified.

Third Embodiment

Next, a third embodiment will be described with reference to FIG. 54. In the third embodiment, the Lower page program is executed in the first stage, and the Middle/Upper/Top page programs are executed in the second stage.

Figure 54:
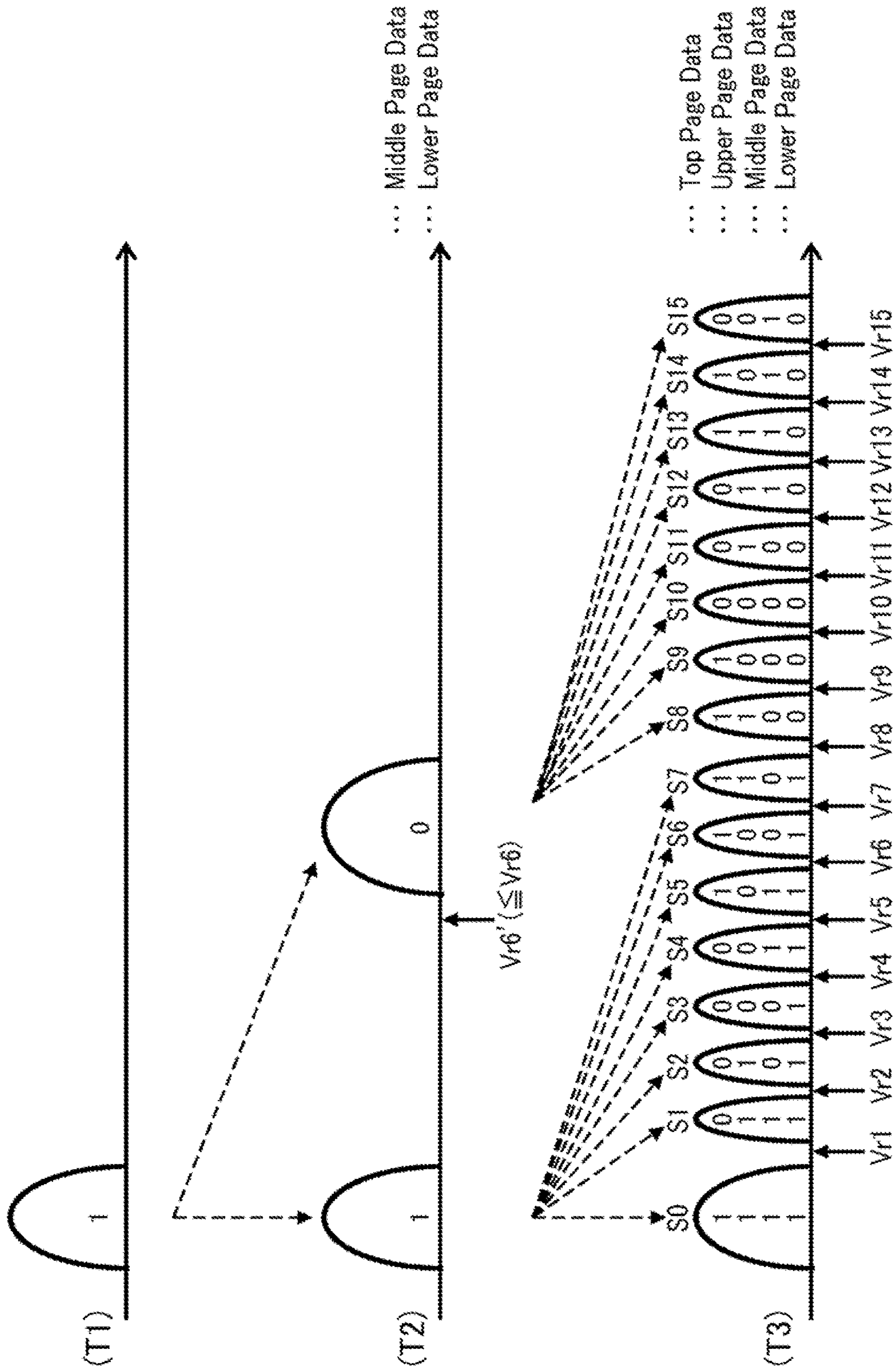
FIG. 54 is a diagram illustrating each threshold region after programming in a third embodiment.
Figure 57A:
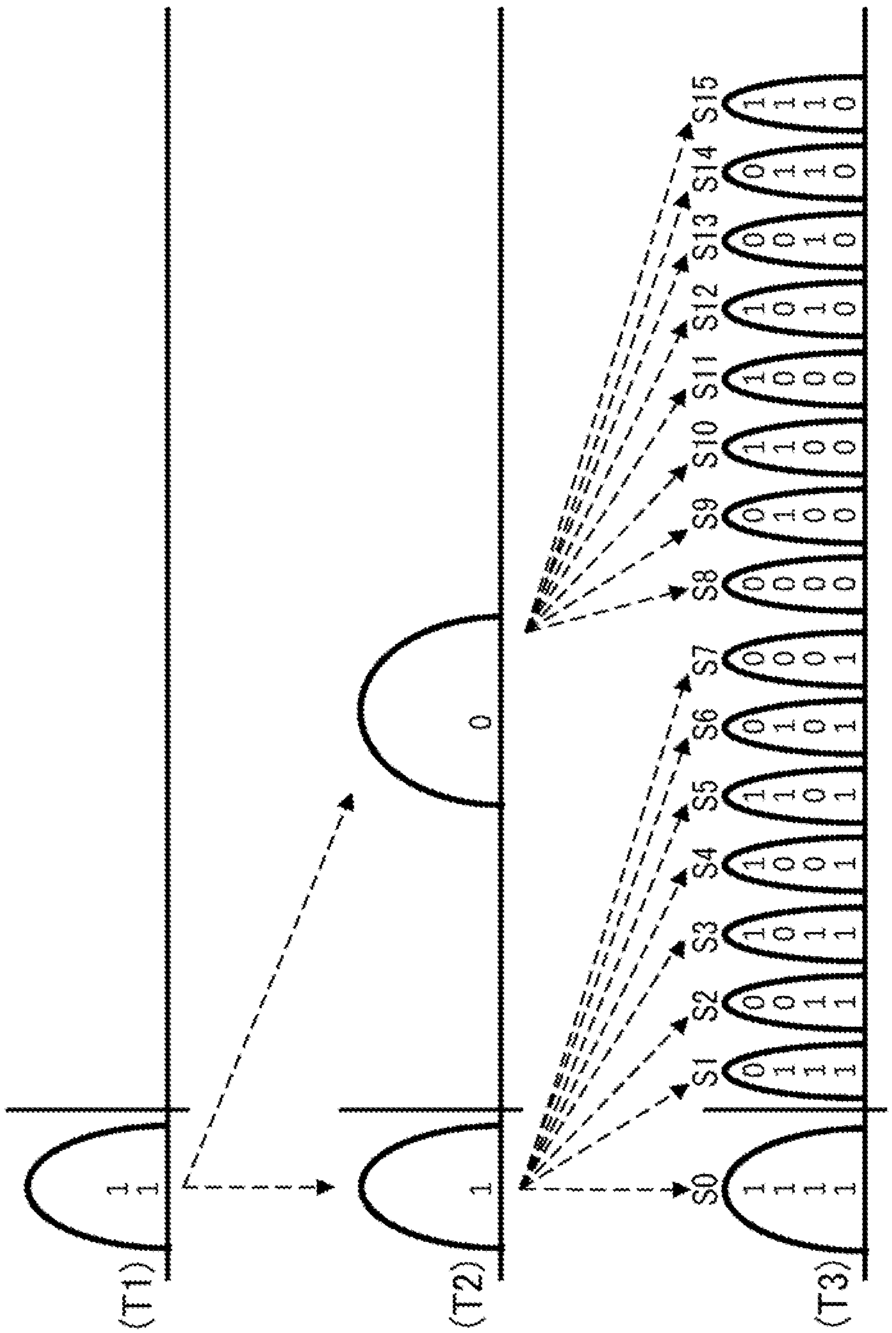
FIG. 57A is a diagram illustrating a threshold region of 1-2-6-6 data coding according to the second modification.

FIG. 54 is a diagram illustrating each threshold region after programming in the third embodiment, and FIG. 57A is a diagram illustrating 4-bit data in each threshold region in FIG. 54. (T1) in FIG. 54 illustrates the threshold region in the erased state which is the initial state before programming. (T2) in FIG. 54 illustrates the threshold region after the first stage program. (T3) in FIG. 54 illustrates the threshold region after the second stage program, FIG. 54 illustrates an example of 1-4-5-5 data coding.

As illustrated in (T1) of FIG. 54, all the memory cells in the NAND memory cell array 23 have a threshold region S0 in an unwritten state. As illustrated in (T2) of FIG. 54, in the first stage program, according to the bit value written to the Lower page, the control unit 22 of the nonvolatile memory 3 remains the threshold region S0 for each memory cell as it is according to the bit value written in the Lower page or moves the threshold region to a threshold region having a higher voltage level than the threshold region S0 by injecting electrons into the charge storage layer 47. As a result, the memory cell is programmed to a binary level by the Lower page data.

As illustrated in (T3) of FIG. 54, in the second stage program, 3-bit data for three pages of the Middle/Upper/Top pages is written. The control unit 22 of the nonvolatile memory 3 adds the data of the Middle/Upper/Top pages to the data of the first stage as the second stage. More specifically, the control unit 22 performs the second stage program so as to obtain 16 separated threshold regions after the second stage program.

For example, the threshold region level when the first stage is programmed to the binary level is as follows. The threshold region having a higher voltage level among the two threshold regions programmed in the first stage is transitioned to one of the threshold regions S8 to S15 in the second stage. For this reason, the control unit 22 causes the threshold region with the higher voltage level among the two threshold regions programmed in the first stage to have the same threshold distribution as the threshold region S8 generated in the second stage or to have a threshold distribution having a sufficient interval from the threshold region S0 without reaching the threshold region S8 generated in the second stage. The first stage program only needs to be divided into two threshold regions, and the first stage program can be sped up by allowing the width of each threshold region to be widened. Even when the width of the two threshold regions generated at the first stage is wide, if the interval between the two threshold regions is wide, the widths of the 16 threshold regions can be narrowed by programming the second stage, and the interval between the threshold regions can be secured.

In the third embodiment, the programs are executed in the same order as the order illustrated in FIG. 8B in order to reduce the influence of interference between adjacent memory cells. That is, in the first stage and the second stage, continuous programs for the same word line WLi are not performed. In order to reduce the interference between adjacent memory cells between the word lines, it is effective to reduce the fluctuation amount of the threshold of the adjacent word line after the word line is completely programmed to the second stage. In the sequence illustrated in FIG. 8B, the program stage of the adjacent word line after the word line is completely programmed to the second stage is only the second stage, so that the influence of the interference between adjacent memory cells can be reduced.

Figure 56A:
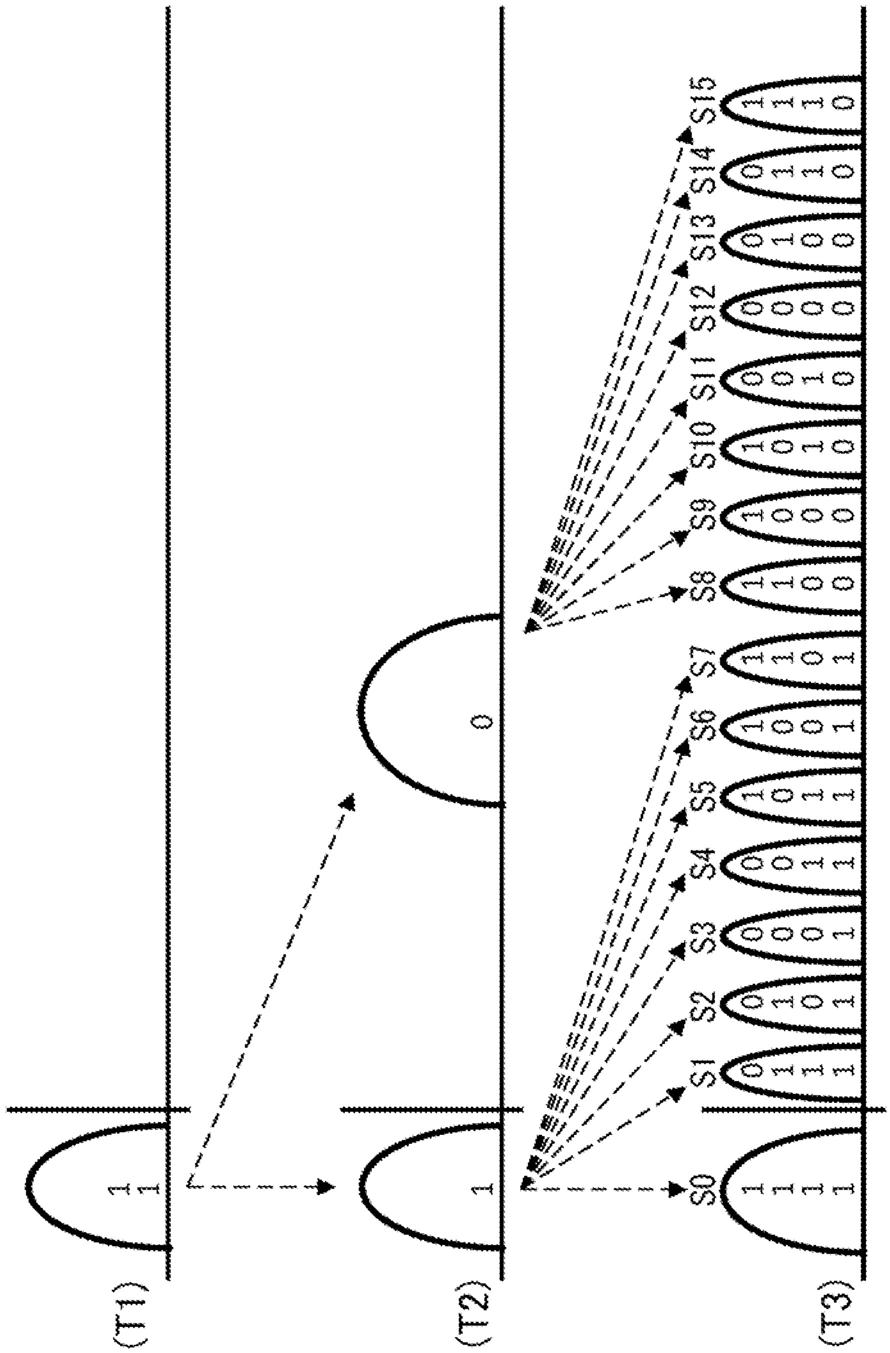
FIG. 56A is a diagram illustrating a threshold region of 1-6-4-4 data coding according to the first modification.
Figure 56B:
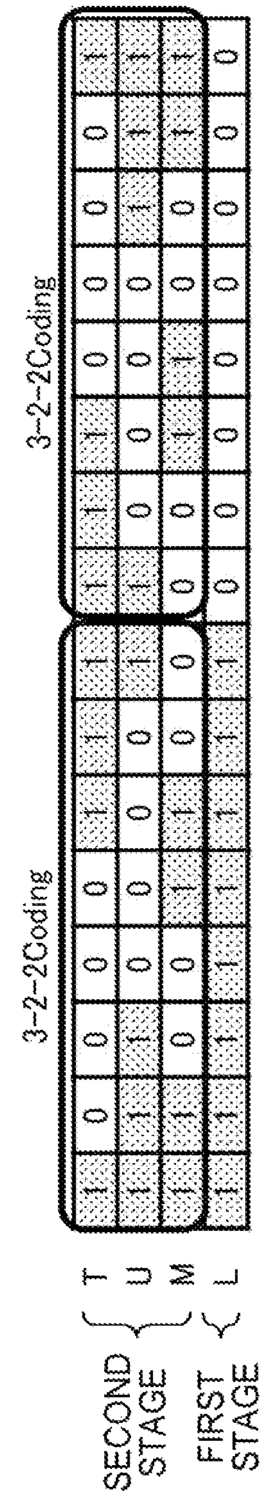
FIG. 56B is a diagram illustrating 4-bit data in each threshold region in FIG. 58A.
Figure 57B:
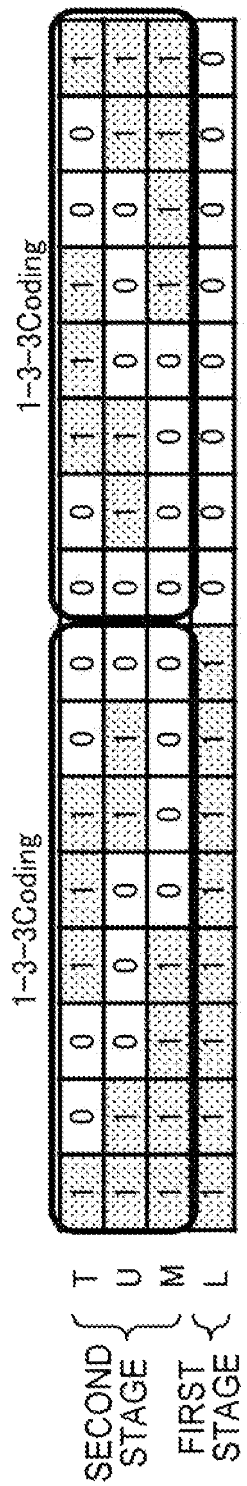
FIG. 57B is a diagram illustrating 4-bit data in each threshold region in FIG. 59A.
Figure 58A:
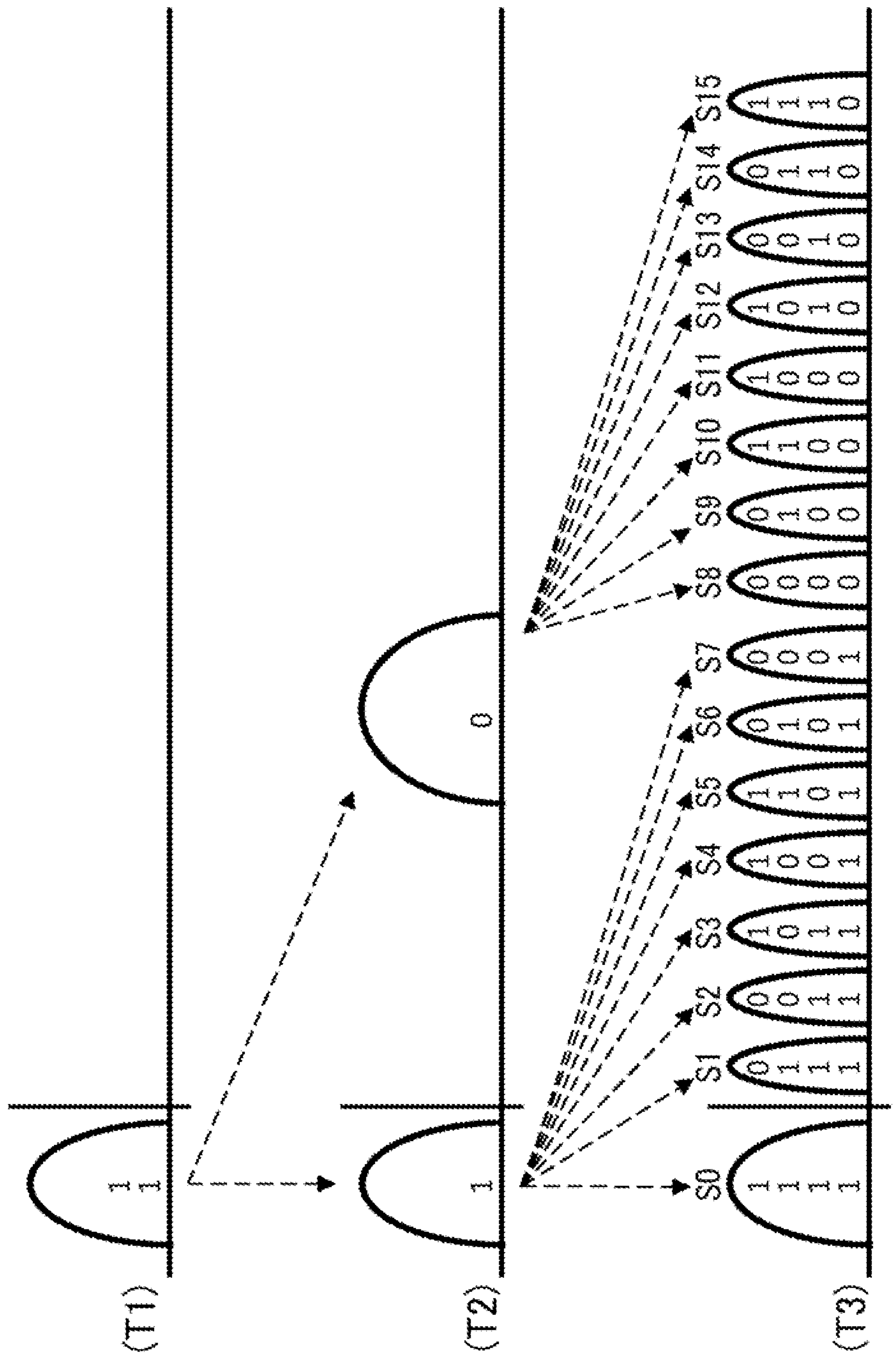
FIG. 58A is a diagram illustrating a threshold region of 1-4-5-5 data coding according to the third modification.
Figure 58B:
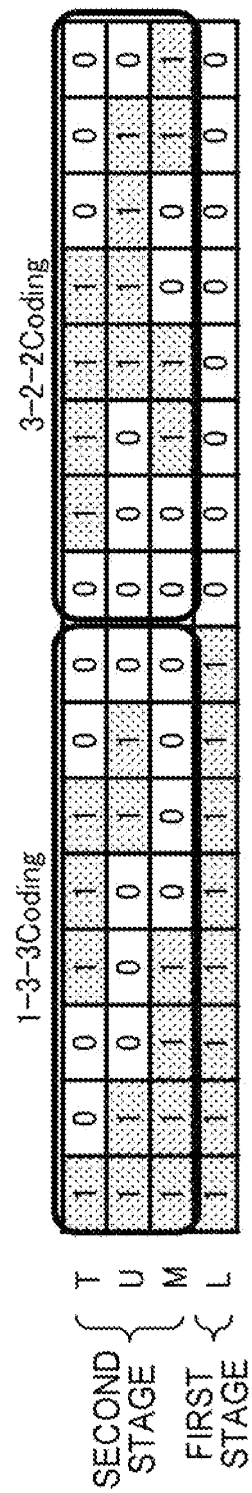
FIG. 58B is a diagram illustrating 4-bit data in each threshold region in FIG. 60A.

FIG. 55A is a diagram illustrating 4-bit data in each of the threshold regions S0 to S15 in FIG. 54. The type of 4-bit data assigned to each threshold region is not necessarily limited to FIG. 55A. For example, the assignment illustrated in FIG. 55B or the assignment illustrated in FIG. 55C may be used. The data coding in this embodiment is not necessarily limited to 1-4-5-5 as illustrated in FIG. 54. For example, FIG. 56A is a diagram illustrating a threshold region of 1-6-4-4 data coding according to the first modification of this embodiment, and FIG. 56B is a diagram illustrating 4-bit data in each threshold region in FIG. 56A, FIG. 57A is a diagram illustrating a threshold region for 1-2-6-6 data coding according to the second modification of this embodiment, and FIG. 57B is a diagram illustrating 4-bit data in each threshold region in FIG. 57A. FIG. 58A is a diagram illustrating a threshold region of 1-4-5-5 data coding according to the third modification of this embodiment, and FIG. 58B is a diagram illustrating 4-bit data in each threshold region in FIG. 58A.

In all FIGS. 54, 56A, 57A, and 58A, when the second stage program is executed, the threshold region is transitioned by at most seven threshold regions from the threshold region of the first stage, and the intervals between two threshold regions in the first stage are about the same. Therefore, in all FIGS. 54, 56A, 57A, and 58A, the interference between adjacent cells can be suppressed to the same extent.

Next, a writing procedure according to the third embodiment will be described. The writing procedure for the entire one block according to the third embodiment is the same as the writing procedure (FIG. 9) for the entire one block according to the first embodiment, and thus the description thereof is omitted. Also in this embodiment, as in the first embodiment, the program stage is advanced while straddling the word lines WLi in a discontinuous order. Therefore, the program is executed by using a group (here, block) of certain word lines WLi as a group of program sequences.

Figure 59:
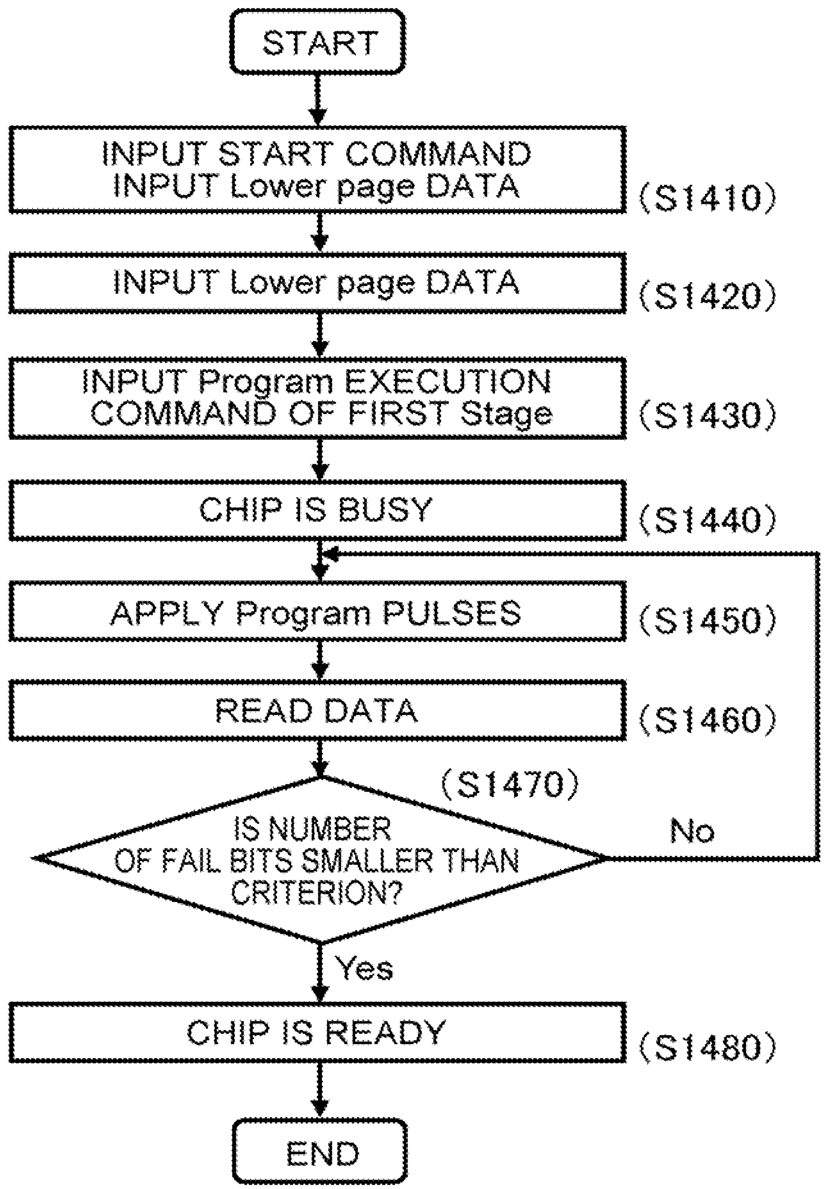
FIG. 59 is a sub-flowchart illustrating a writing procedure in the first stage according to the third embodiment.
Figure 60:
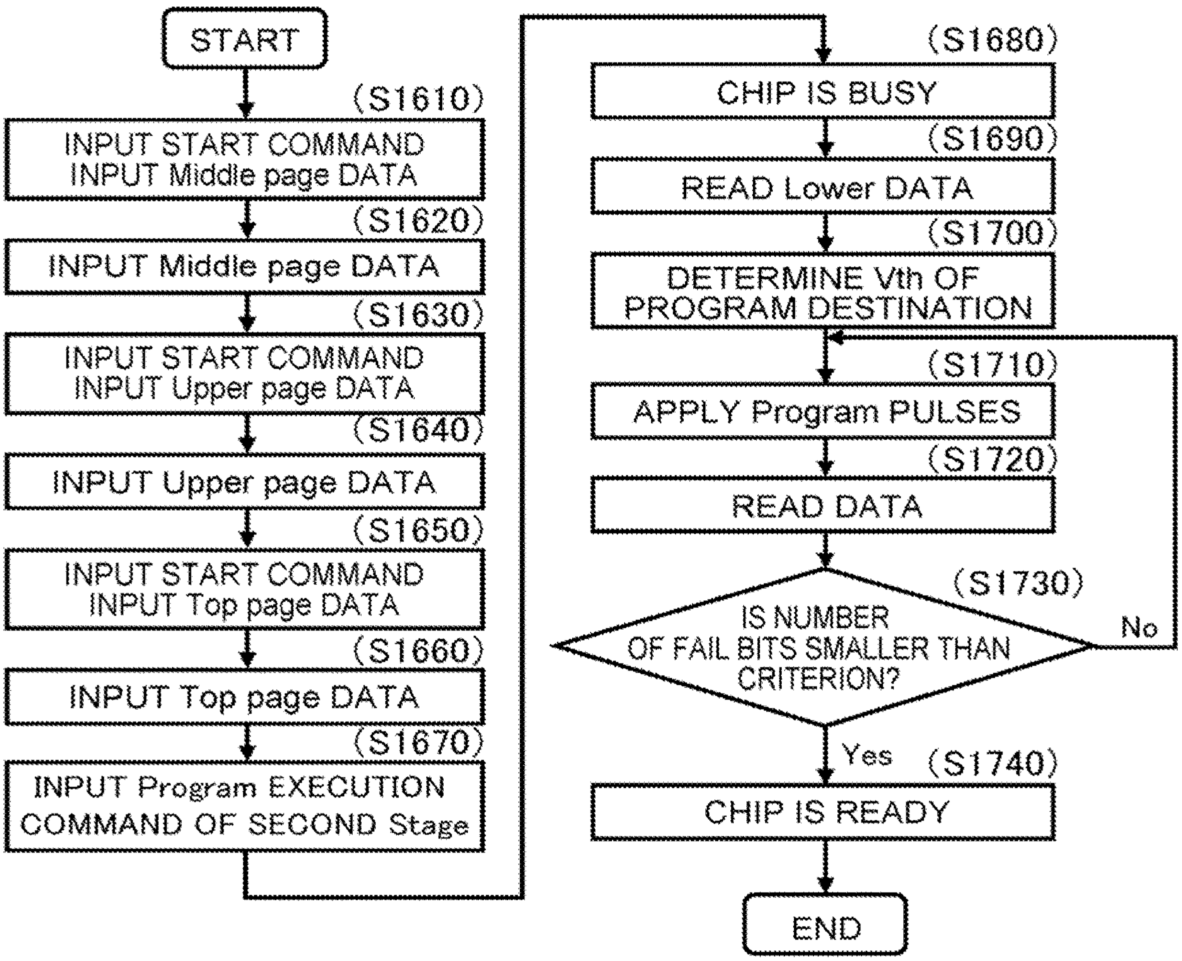
FIG. 60 is a sub-flowchart illustrating a writing procedure in the second stage according to the third embodiment.

FIG. 59 is a sub-flowchart illustrating a writing procedure in the first stage according to the third embodiment, and FIG. 60 is a sub-flowchart illustrating a writing procedure in the second stage according to the third embodiment. The description of the same processes as those illustrated in FIG. 10 among the processes illustrated in FIG. 59 is omitted. Also, the description of the same processes as those illustrated in FIG. 11 among the processes illustrated in FIG. 60 is omitted.

As illustrated in FIG. 59, in the first stage program, first, the input start command of the Lower page data is input from the memory controller 2 to the nonvolatile memory 3 (step S1410). Then, the Lower page data is input from the memory controller 2 to the nonvolatile memory 3 (step S1420).

Then, the program execution command of the first stage is input from the memory controller 2 to the nonvolatile memory 3 (step S1430), and thereby chip is busy (step S1440).

Thereafter, the data writing to the Lower page and the Middle page is performed by using the Vth determined based on the Lower page data.

At the time of data writing to the Lower page, one or more program voltage pulses are applied (step S1450). Then, reading is performed to confirm whether or not the memory cell moves beyond the threshold boundary level (step S1460). Furthermore, it is confirmed whether or not the number of data fail bits in the Lower page is smaller than the criterion (judgment criterion) (step S1470). If the number of data fail bits is greater than or equal to the criterion (No in step S1470), the processes of steps S1450 to S1470 are repeated. When the number of data fail bits becomes smaller than the criterion (Yes in step S1470), the chip is ready (step S1480).

In the second stage program illustrated in FIG. 60, first, the input start command for the Middle page data is input from the memory controller 2 to the nonvolatile memory (step S1610). Then, the Middle page data is input from the memory controller 2 to the nonvolatile memory 3 (step S1620). Next, the input start command of the Upper page data is input from the memory controller 2 to the nonvolatile memory 3 (step S1630). Then, the Upper page data is input from the memory controller 2 to the nonvolatile memory 3 (step S1640). Next, the input start command of the Top page data is input from the memory controller 2 to the nonvolatile memory 3 (step S1650). Then, the Top page data is input from the memory controller 2 to the nonvolatile memory 3 (step S1660). Next, the program execution command of the second stage is input from the memory controller 2 to the nonvolatile memory 3 (step S1670), and thereby the chip is busy (step S1680).

Thereafter, the Lower page data as the IDL is read (step S1690). The Vth of the program destination of the Middle/Upper/Top pages is determined based on the Lower page data (step S1700). Thereafter, the data writing to the Middle/Upper/Top pages is performed using the determined threshold voltage Vth.

Furthermore, in order to increase the reliability of the IDL read data, the control unit 22 can perform reading a plurality of times and use the majority decision of the read results in the page buffer 24 in the chip as next write data. Of course, the control unit 22 can perform reading a plurality of times during a normal reading operation and use the majority decision of the read results in the chip as the read data to the outside.

At the time of data writing to the Upper page, one or more program voltage pulses are applied (step S1710). Then, in order to confirm whether or not the memory cell moves beyond the threshold boundary level, data reading of the Middle/Upper/Top pages is performed (step S1720).

Further, it is confirmed whether or not the number of data fail bits in the Middle/Upper/Top pages is smaller than the criterion (step S1730). When the number of data fail bits in the Middle/Upper/Top pages is greater than or equal to the criterion (No in step S1730), the processes of steps S1680 to S1700 are repeated. When the number of data fail bits becomes smaller than the criterion (Yes in step S1730), the chip is ready (step S1740).

Figure 61:
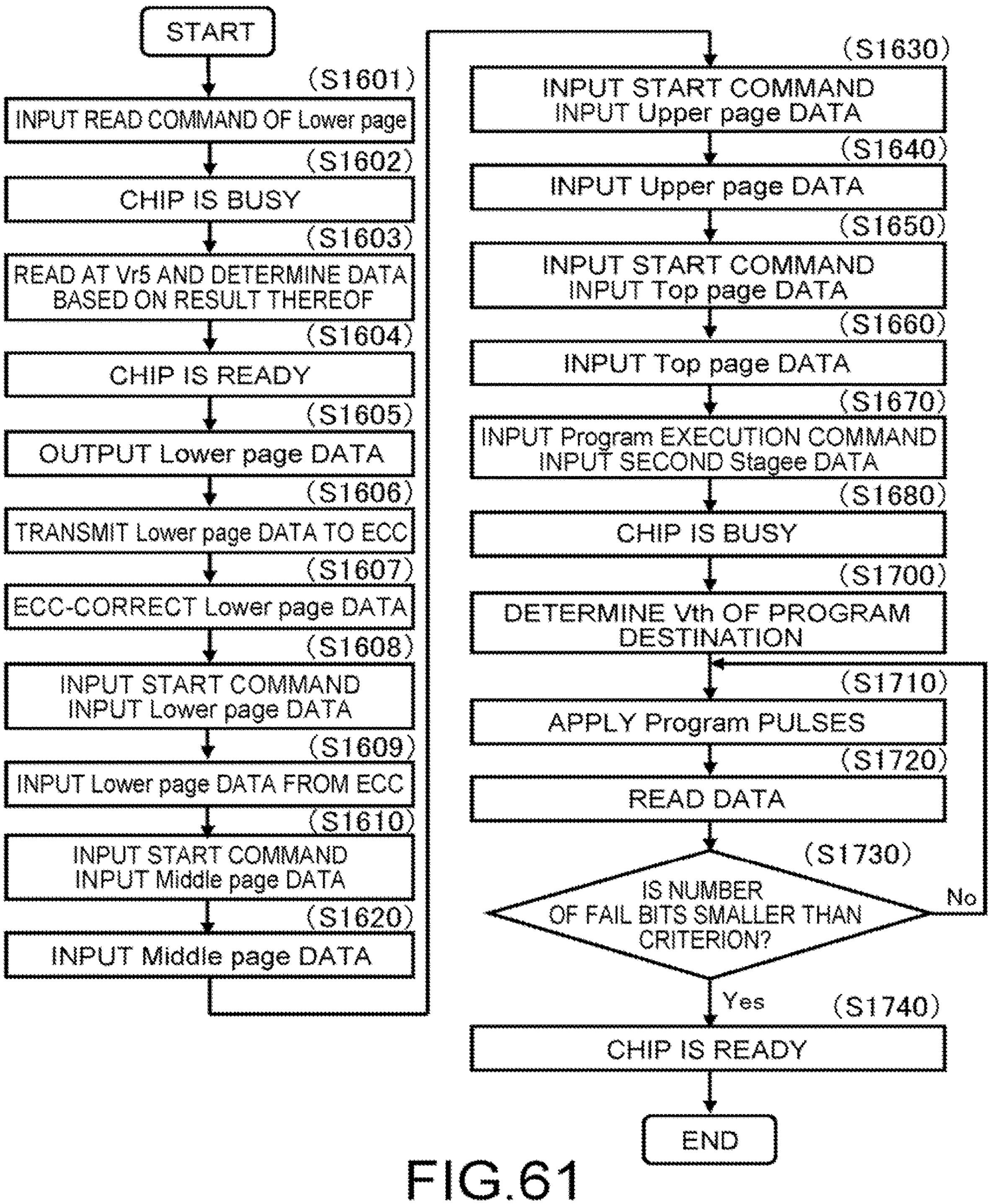
FIG. 61 is a sub-flowchart illustrating a modification of the writing procedure in the second stage according to the third embodiment.

Here, a modification of the writing procedure illustrated in FIG. 60 will be described. FIG. 61 is a sub-flowchart illustrating a modification of the writing procedure in the second stage according to the third embodiment. In the process procedure shown in steps S1610 to S1740 in FIG. 61, the process procedure in steps S1610 to S1740 is the same as that in FIG. 60 except that the process in step S1.690 described in FIG. 60 is not performed.

In the process procedure illustrated in FIG. 61, steps S1601 to S1609 are performed before step S1610. Specifically, first, the read command of the Lower page is input from the memory controller 2 to the nonvolatile memory 3 (step S1601), and thereby the chip is busy (step S1602).

Thereafter, the control unit 22 reads the Lower page data at the threshold voltage of Vr5. Then, the control unit 22 determines the value of the read data as “0” or “1” based on the read result at the threshold voltage of Vr5 (step S1603). Thereafter, the chip is ready (step S1604).

When the Lower page data read by the control unit 22 is output (step S1605), the Lower page data is transmitted to the ECC circuit 10 (step S1606). As a result, the ECC circuit 10 performs ECC correction on the Lower page data (step S1607).

Then, the input start command of the Lower page data is input from the memory controller 2 to the nonvolatile memory 3 (step S1608). As a result, the ECC circuit 10 inputs the data of the Lower page data to the nonvolatile memory 3 (step S1609).

Thereafter, the processes of steps S1610 to S1740 are performed. In step S1700, the 4th of program destinations of the Middle page, Upper page, and Top page is determined based on the Lower page data from the ECC circuit 10.

As described above, in this embodiment, the data input in the second stage program is performed in three pages of the Middle page, the Upper page, and the Top page. However, in order to determine the final threshold of the memory cell by this second stage program, data for four pages including the Lower page is required. Therefore, in this second stage program, the Lower page data is first read as a preprocess. Then, by synthesizing the read data with the input Middle page, Upper page, and Top page, the threshold voltage Vth of the program destination of the Middle page, the Upper page, and the Top page is determined. Note that the read level before the second stage writing and after the second stage writing may be slightly different from the read level after the second stage writing.

Next, the page reading process will be described. The page read method differs depending on whether the program for the word line WLi including the page to be read is before the second stage writing and after the second stage completion.

In the case of the word line WLi before the second stage writing, only the Lower page is valid as the recorded data. For this reason, the control unit 22 reads data from the memory cell when the read page is the Lower page. Then, in a case where the read page is the Middle page, the Upper page, and the Top page, the control unit 22 performs control to all forcibly output "1" as read data without performing the memory cell read operation.

On the other hand, in the case of the word line WLi that is completed to the second stage, the control unit 22 reads the memory cell regardless of whether the read page is any one of the Top/Upper/Middle/Lower pages. In this case, since the necessary read voltage differs depending on which page is read, the control unit 22 executes only necessary read for the selected page.

According to the coding illustrated in FIGS. 54, 56A, 57A, and 58A, since there is only one boundary between the threshold states at which the Lower page data changes, the control unit 22 determines the data depending on the position of the threshold in the two voltage ranges divided by the boundary.

Further, there are two to six boundaries between threshold states at which the data of the Middle page, Upper page, or Top page changes depending on the examples shown in FIGS. 54, 56A, 57A, and 58A. Therefore, the control unit 22 determines data depending on the position of the threshold in the voltage ranges divided by those boundaries.

Figure 62:
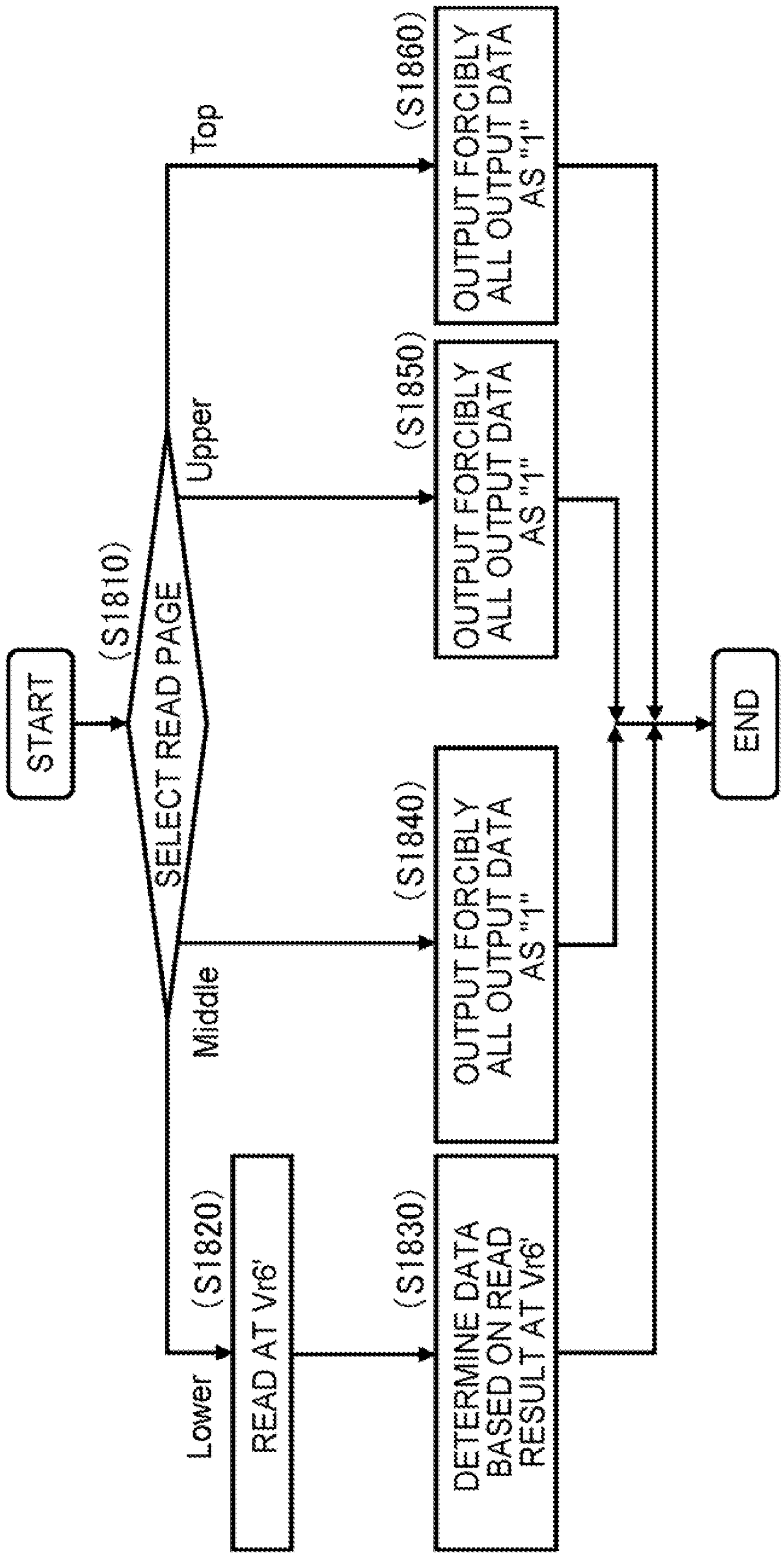
FIG. 62 is a flowchart illustrating a page read process procedure on a word line before second stage writing in the memory system 1 according to the third embodiment.
Figure 63:
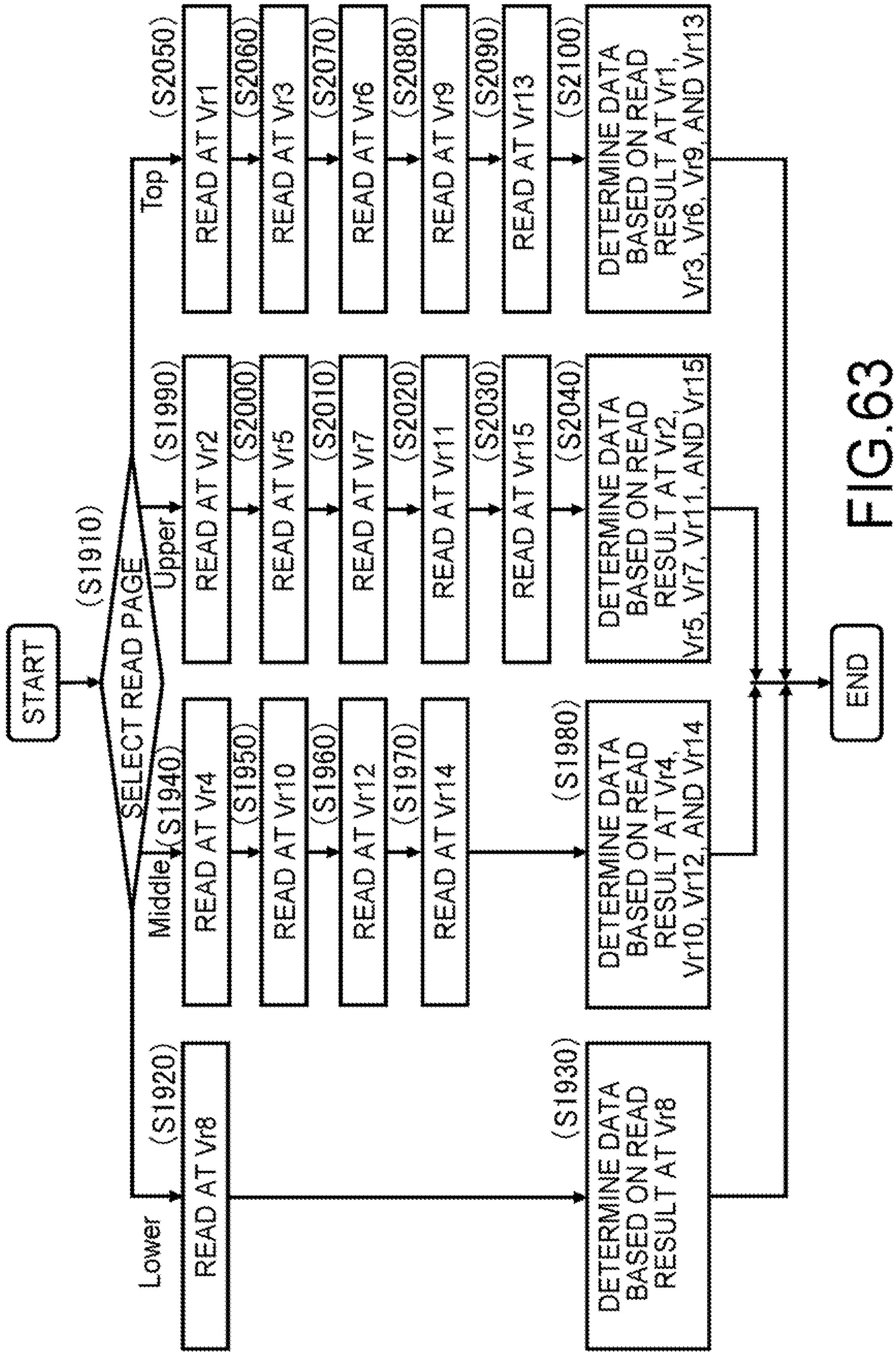
FIG. 63 is a flowchart illustrating a page read process procedure on a word line for which the program is completed up to the second stage in the memory system 1 according to a fourth embodiment.

Hereinafter, a specific process procedure for page reading will be described. FIG. 62 is a flowchart illustrating a page read process procedure on a word line before second stage writing in the memory system 1 according to the third embodiment. FIG. 63 is a flowchart illustrating a page read process procedure on a word line for which the program is completed up to the second stage in the memory system 1 according to the fourth embodiment. The description of the same processes as those illustrated in FIG. 16 among the processes illustrated in FIG. 62 is omitted. Also, the description of the same processes as those illustrated in FIG. 17 among the processes illustrated in FIG. 63 is omitted.

As illustrated in FIG. 62, in the case of the word line WLi before the second stage writing, the control unit 22 selects a read page (step S1810). When the read page is the Lower page, the control unit 22 performs reading with the threshold voltage of Vr5 (step S1820). Then, the control unit 22 determines the value of the read data as "0" or "1" based on the read result at the threshold voltage of Vr5 (step S1830).

When the read page is the Middle page, the control unit 22 performs control to all forcibly output "1" as the output data of the memory cell (step S1840). When the read page is the Upper page, the control unit 22 performs control to all forcibly output "1" as the output data of the memory cell (step S1850). When the read page is the Top page (Top in step S1810), the control unit 22 performs control to all forcibly output "1" as the output data of the memory cell (step S1860).

On the other hand, in the case of the word line WLi that is completely programmed up to the second stage, as illustrated in FIG. 63, the control unit 22 selects a read page (step S1910). When the read page is the Lower page, the control unit 22 performs reading with the threshold voltage of Vr8 (step S1920). Then, the control unit 22 determines the value of the read data as "0" or "1" based on the read result at the threshold voltage of Vr8 (step S1930).

When the read page is the Middle page, the control unit 22 performs reading with the threshold voltages of Vr4, Vr10, Vr12, and Vr14 (steps S1940, S1950, S1960, and S1970). Then, the control unit 22 determines the value of the read data as "0" or "1" based on the read result at the threshold voltages of Vr4, Vr10, Vr12, and Vr14 (step S1980).

When the read page is the Upper page, the control unit 22 performs reading with threshold voltages of Vr2, Vr5, Vr7, Vr11, and Vr15 (steps S1990, S2000, S2010, S2020, and S2030). Then, the control unit 22 determines the value of the read data as "0" or "1" based on the read result at the threshold voltages of Vr2, Vr5, Vr7, Vr11, and Vr15 (step S2040).

When the read page is the Top page, the control unit 22 performs reading with the threshold voltages of Vr1, Vr3, Vr6, Vr9, and Vr13 (steps S2050, S2060, S2070, S2080, and S2090). Then, the control unit 22 determines the value of the read data as "0" or "1" based on the read result at the threshold voltages of Vr1, Vr3, Vr6, Vr9, and Vr13 (step S2100).

In this way, in the program control of the threshold as illustrated in FIG. 58A, in the case of reading Lower page data, only Vr5 is used as a read level that can separate the two levels one by one up and down.

On the other hand, in the case of the word line WLi that is completely programmed up to the second stage, the memory cell is read even when the read page is any of Top/Upper/Middle/Lower, but the required read voltage differs depending on which page is read. Thus, only the reading required according to the selected page is executed.

Note that it is possible for the memory controller 2 to manage and identify whether the program for the word line WLi is completed up to the first stage or the second stage. Since the memory controller 2 performs program control, if the memory controller 2 records the progress, the memory controller 2 can easily refer to the address and the program state of the nonvolatile memory 3. In this case, when reading is performed from the nonvolatile memory 3, the memory controller 2 identifies the program state of the word line WLi including the target page address and issues a read command corresponding to the identified state.

Note that the read level before the second stage writing and after the second stage writing may be slightly different from the read level after the second stage writing.

The second embodiment may be applied to this embodiment. That is, also in this embodiment, the second stage program of the word line WLn−1 and the first stage program of the word line WLn may be performed together. In this case, the command input and data input for the programs related to the two programs described above are performed together.

Further, in this embodiment, the restriction that the number of the boundaries of the Middle page after the end of the first stage is two becomes unnecessary. For this reason, the data coding other than the data coding used in the first and second embodiments may be applied. Also in the modifications of this embodiment illustrated in FIGS. 54, 56A, 57A, and 58A, for example, the embodiment can be modified variously such that the data allocation of the Top/Middle/Upper page is interchanged between pages. That is, in in FIGS. 55A, 55B, 55C, 56B, 57B, and 58B described above, the boundary position between 1 and 0 of the Lower page, the boundary position between 1 and 0 of the Middle page, the boundary position between 1 and 0 of the Upper page, and the boundary position between 1 and 0 of the Top page can be interchanged between the pages. Further, the boundary position between 1 and 0 of the Lower page and the boundary position between 1 and 0 of the Middle page may be interchanged. Similarly, the boundary position between 1 and 0 of the Upper page and the boundary position between 1 and 0 of the Top page may be interchanged.

As described above, in the third embodiment, as in the first embodiment, when programming the nonvolatile memory 3 including the NAND memory 5 of 4 bits/Cell having a three-dimensional structure or a two-dimensional structure, 1-4-5-5 Data coding or the like was adopted, and the program stage is set to a two-stage system. Since the programming is performed in two stages, the amount of data input during data programming is reduced, and the amount of write buffer required for the memory controller 2 can be suppressed. In addition, since the deviation of the bit error rate between the pages of the nonvolatile memory 3 can be reduced, it is not necessary to increase the error correction capability of the ECC circuit 10, and thus the cost of the ECC circuit 10 can be reduced. Further, since data transfer is performed only once for each page, transfer time and power consumption can be suppressed.

Further, since each program stage is executed while straddling the word line WLi, the amount of interference between adjacent cells with the adjacent word line WLi can be reduced. Further, since the change width from the threshold region of the first stage to the threshold region of the second stage becomes small, the adjacent cell buffer effect amount can be suppressed. In addition, the IDL margin before the second stage can be expanded, and the reliability of the write sequence can be improved. In addition, when the first stage program ends, by setting one threshold boundary in the Lower page, it is possible to speed up the first stage program, that is, the Lower page program. The programming of the first page can be sped up, for example, when the step voltage at the time of writing while stepping up the write voltage little by little is set to a larger value compared to the time of ending the second stage program when writing and writing verification are repeated.

In summary, the memory controller 2 according to the third embodiment causes the nonvolatile memory 3 to execute the first program for writing the first bit data, and then execute the second program for writing the second bit, third bit, and fourth bit data. More specifically, the memory controller 2 causes the nonvolatile memory 3 to execute the first program and the second program so that the order of changing from the threshold region at the time of the first program to the threshold region at the end of the second program is not changed. For example, the memory controller 2 causes the nonvolatile memory 3 to execute the first program and the second program so that the number of changes of the bit values at the time of writing the first to fourth bits of data is 1, 4, 5, 5 or 1, 6, 4, 4, or 1, 2, 6, 6 or 1, 5, 5, 4 or 1, 5, 4, 5 or 1, 4, 6, 4 or 1, 4, 4, 6 or 1, 5, 6, 3 or 1, 5, 3, 6 or 1, 3, 6, 5 or 1, 3, 5, 6 or 1, 6, 5, 3 or 1, 6, 3, 5 in order. The first bit is the least significant bit of the 4-bit data.

As described above, various modifications of the QLC in which one page of program is performed in the first stage, and three pages of program are performed in the second stage have been described. However, in addition to the above data coding, various modifications of data coding can be considered. Below, the modifications of the data coding described above are listed collectively.

FIG. 64 is a diagram illustrating another modification of 1-4-5-5 data coding. FIGS. 65 to 67 are diagrams illustrating other modifications of 1-5-5-4 data coding. FIGS. 68 and 69 are diagrams illustrating other modifications of 1-4-5-5 data coding. FIG. 70 is a diagram illustrating another modification of 1-5-4-5 data coding. FIGS. 71 and 72 are diagrams illustrating other modifications of 1-4-5-5 data coding. FIGS. 73 to 75 are diagrams illustrating other modifications of 1-5-4-5 data coding. FIGS. 76 to 80 are diagrams illustrating other modifications of 1-4-6-4 data coding. FIG. 81 is a diagram illustrating another modification of 1-6-4-4 data coding, FIGS. 82 to 84 are diagrams illustrating other modifications of 1-4-4-6 data coding. FIGS. 85 and 86 are diagrams illustrating other modifications of 1-5-6-3 data coding. FIGS. 87 to 89 are diagrams illustrating other modifications of 1-3-6-5 data coding. FIGS. 90 and 91 are diagrams illustrating modifications of 1-3-5-6 data coding, and FIG. 92 is a diagram illustrating another modification of 1-3-6-5 data coding. FIG. 93 is a diagram illustrating another modification of 1-6-5-3 data coding. FIGS. 94 and 95 are diagrams illustrating other modifications of 1-3-5-6 data coding. FIG. 96 is a diagram illustrating another modification of 1-5-3-6 data coding. FIG. 97 is a diagram illustrating another modification of 1-3-6-5 data coding. FIG. 98 is a diagram illustrating another modification of 1-3-5-6 data coding. FIGS. 99 and 100 are diagrams illustrating other modifications of the 1-2-6-6 data coding.

Also in any of FIGS. 64 to 100, the data coding also can be performed in which the boundary position between 1 and 0 of the Top page, the boundary position between 1 and 0 of the Upper page, the boundary position between 1 and 0 of the Middle page are arbitrarily interchanged between the pages. That is, any one page of the four pages can be programmed in the first stage. Therefore, there are ${}_4C_1$=4 combinations for each candidate example. Since writing is completed from the Lower page, the page buffer 24 may be overwritten in the order of L→M→U→T.

In the above description, in the first stage, writing is performed to the binary threshold distribution by the Lower page, writing is performed to the four-value threshold distribution by the Lower page and the Middle page, or writing is performed to the eight-value threshold distribution by the data of the Lower page, the Middle page, and the Upper page. Then, in the second stage, writing is performed to the sixteen-value threshold distribution by the remaining page data. However, partial or all input data of the Lower page, Middle page, or Upper page of the first stage may be input again in the second stage, and writing may be performed to the sixteen-value threshold distribution in the second stage. Alternatively, before writing in the second stage, the data written in the first stage may be read out and corrected by the ECC or the like, and then the data may be input again also in the second stage and written in the sixteen-value threshold distribution in the second stage.

As described above, in the third embodiment, in the first stage program (first program), only the first bit of the 4-bit data is programmed. Thus, the interval between the two threshold regions after the first stage program can be sufficiently widened. As a result, the first stage program can be performed at high speed. Also, during second stage program (second program), the program is performed such that the order of change from the threshold region at the first stage to the threshold region at the second stage does not change. Thus, the interference between adjacent cells can be suppressed.

Fourth Embodiment

In a fourth embodiment, the Lower page, Middle page, and Upper page programs are executed in the first stage, and the Top page program is executed in the second stage.

FIG. 101A is a diagram illustrating each threshold region after programming in the fourth embodiment, and FIG. 101E is a diagram illustrating 4-bit data assigned to each threshold region in FIG. 101A, FIG. 101A illustrates an example in which 2-3-6-8 data coding is performed.

In the first stage in the fourth embodiment, one of the eight threshold regions is set for each memory cell according to the bit value written in the Lower page, the Middle page, and the Upper page. The control unit 22 of the nonvolatile memory 3 generates eight threshold regions by the first stage program.

Further, the control unit 22 generates a total of sixteen threshold regions shifted by one at a maximum from the eight threshold regions programmed in the first stage by the second stage program.

As described above, in this embodiment, when the second stage program is performed, the threshold region moves only slightly, and thus the interference between adjacent cells can be prevented. In the first stage, eight threshold regions are generated, but bit errors can also be prevented by programming so that the intervals between the threshold regions are evenly secured.

Figure 102B:
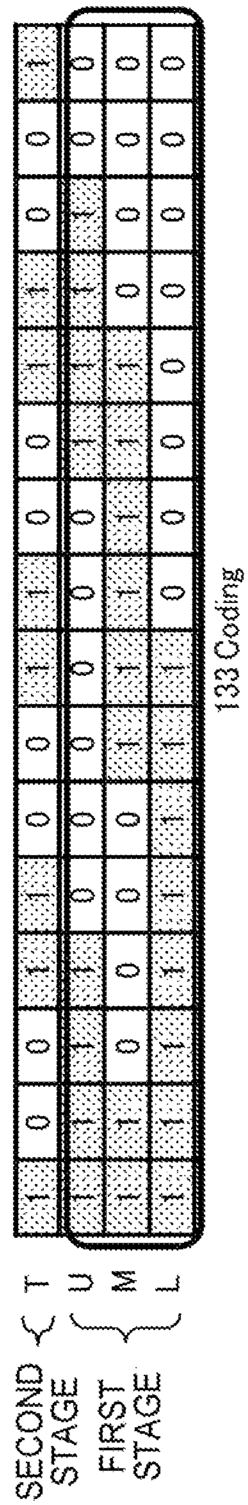

The data coding in the fourth embodiment is not necessarily limited to 2-3-2-8. For example, FIG. 102A is a diagram illustrating a threshold region according to a modification of the fourth embodiment, and FIG. 102B is a diagram illustrating each threshold region after the program assigned to each threshold region in FIG. 102A. FIG. 102A illustrates an example in which 1-3-3-8 data coding is performed.

In both the examples of FIG. 101A and FIG. 102A, the programs of a total of three pages of the Lower page, the Middle page, and the Upper page are performed at the first stage, and the Top level program is performed at the second stage. Since eight threshold regions can be generated in the first program, the number of changes from the threshold regions in the second stage can be suppressed to one or less, and the interference between adjacent cells is less likely to occur.

Thus, in the fourth embodiment, since the Lower page, Middle page, and Upper page programs are performed in the first stage, eight threshold regions are generated in the first stage. For this reason, the interval between the threshold regions is narrowed. However, when the Top page program is performed in the second stage, the change width from the threshold region of the first stage to the threshold region of the second stage can be suppressed to one threshold region, and there is no possibility that the change width changing from the threshold region of the first stage to the threshold region of the second stage intersects.

In summary, the memory controller 2 according to the fourth embodiment causes the nonvolatile memory 3 to execute the first program for writing the data of the first bit, the second bit, and the third bit, and then causes the nonvolatile memory 3 to execute the second program for writing the fourth bit data. More specifically, the memory controller 2 causes the nonvolatile memory 3 to execute the first program and the second program so that the order of changing from the threshold region at the end of the first program to the threshold region at the end of the second program is not changed. For example, the memory controller 2 causes the nonvolatile memory 3 to execute the first program and the second program so that the number of changes in the bit value at the time of writing the first to fourth bit data is 2, 3, 2, 8, 2, 2, 3, 8 or 3, 2, 2, 8 or 1, 3, 3, 8 or 3, 1, 3, 8 or 3, 3, 1, 8 or 1, 2, 4, 8 or 1, 4, 2, 8 or 2, 1, 4, 8 or 2, 4, 1, 8, or 4, 1, 2, 8 or 4, 2, 1, 8 in order. The first bit is the least significant bit, the second bit is the second least significant bit, and the third bit is the second most significant bit.

Figure 101B:
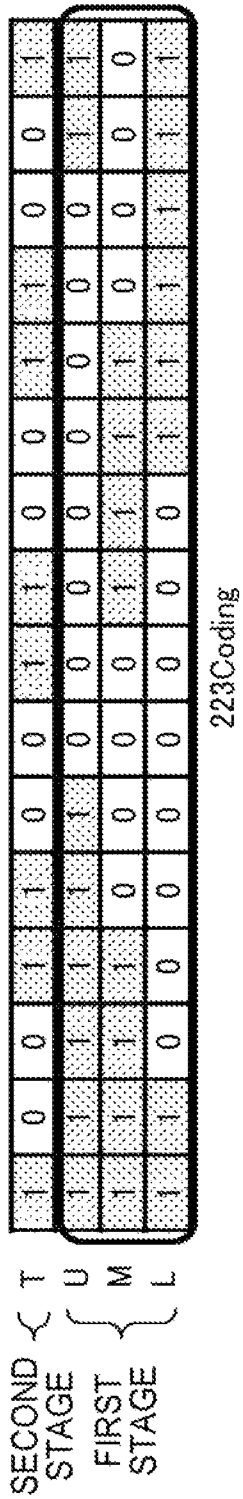

In FIGS. 101B and 102B described above, the boundary position between 1 and 0 of the Lower page, the boundary position between 1 and 0 of the Middle page, the boundary position between 1 and 0 of the Upper page, and the boundary position between 1 and 0 of the Top page can be interchanged between the pages. Further, the boundary position between 1 and 0 of the Lower page and the boundary position between 1 and 0 of the Middle page may be interchanged. Similarly, the boundary position between 1 and 0 of the Upper page and the boundary position between 1 and 0 of the Top page may be interchanged.

As described above, various examples of the QLC in which three pages of program are performed in the first page, and one page of program is performed in the second stage have been described, but other modifications can be considered. FIG. 103 is a diagram illustrating a modification of 1-2-4-8 data coding. Also in FIG. 103, the data coding also can be performed in which the boundary position between 1 and 0 of the Top page, the boundary position between 1 and 0 of the Upper page, the boundary position between 1 and 0 of the Middle page are arbitrarily interchanged between the pages. Further, since writing is completed from the Lower page, the page buffer 24 may be overwritten in the order of L→M→U→T.

In this way, according to the fourth embodiment, the first to third bits are programmed in the first stage and only the fourth bit is programmed in the second stage, and thus, the width of change from the threshold region after the program of the first stage to the threshold region after the program of the second stage is reduced, and the interference between adjacent cells can be suppressed.

In the first to fourth embodiments described above, the case where the nonvolatile memory 3 is configured using the NAND memory 5 has been described. However, other types of nonvolatile memory 3 such as a resistive random access memory (ReRAM6), a magneto-resistive random access memory (MRAM6), a phase change random access memory (PRAM6), and a ferroelectric random access memory (Fe-RAM6) may be used.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A memory system comprising:

a nonvolatile memory including a plurality of memory cells capable of storing 4-bit data of first to fourth bits by sixteen threshold regions including a first threshold region indicating an erased state for erasing data and second to sixteenth threshold regions having higher voltage levels than a voltage level of the first threshold region and indicating a written state for writing data; and a controller configured to send a first command to the nonvolatile memory to execute a first program for writing data of the first bit and the second bit and then send a second command to the nonvolatile memory to execute a second program for writing data of the third bit and the fourth bit, wherein among fifteen boundaries existing between adjacent threshold regions among the first to sixteenth threshold regions, the number of first boundaries used for determining a value of the data of the first bit, the number of second boundaries used for determining a value of the data of the second bit, the number of third boundaries used for determining a value of the data of the third bit, and the number of fourth boundaries used for determining a value of the data of the fourth bit are 1, 4, 5, 5 or 4, 1, 5, 5 in order, the controller is configured to send the first command to the nonvolatile memory to execute the first program such that the threshold region in the memory cell is any threshold region of a seventeenth threshold region indicating an erased state for erasing data and eighteenth to twentieth threshold regions having higher voltage levels than a voltage level of the seventeenth threshold region and indicating a written state for writing data according to the data of the first bit and the second bit, the n-th threshold region has a higher voltage level than the (n−1)-th threshold region (n is a natural number of two or more and sixteen or less), the k-th threshold region has a higher voltage level than the (k−1)-th threshold region (k is a natural number of eighteen or more and twenty or less), the controller is configured to send the second command to the nonvolatile memory to execute the second program such that the threshold region in the memory cell is any threshold region of four threshold regions among the first to sixteenth threshold regions from any threshold region of the seventeenth to twentieth threshold regions according to the data of the third bit and the fourth bit, and the number of threshold regions between a threshold region having a lowest voltage level and a threshold region having a highest voltage level among the four threshold regions is four or less.

2. The memory system according to claim 1, wherein a value of one bit of the first to fourth bits is inverted between adjacent threshold regions of the first to sixteenth threshold regions, and the first bit, the second bit, the third bit, and the fourth bit are different bits among a least significant bit, a second least significant bit, a second most significant bit, and a most significant bit.

3. The memory system according to claim 1, wherein the controller is configured to send the second command to the nonvolatile memory to execute the second program such that the threshold region becomes any threshold region of four twenty-first threshold regions among the first to sixteenth threshold regions in the case where the nonvolatile memory executes the second program such that the seventeenth threshold region becomes any threshold region of the first to sixteenth threshold regions, to send the second command to the nonvolatile memory to execute the second program such that the threshold region becomes any threshold region of four twenty-second threshold regions among the first to sixteenth threshold regions in the case where the nonvolatile memory executes the second program such that the eighteenth threshold region becomes any threshold region of the first to sixteenth threshold regions, to send the second command to the nonvolatile memory to execute the second program such that the threshold region becomes any threshold region of four twenty-third threshold regions among the first to sixteenth threshold regions in the case where the nonvolatile memory executes the second program such that the nineteenth threshold region becomes any threshold region of the first to sixteenth threshold regions, and to send the second command to the nonvolatile memory to execute the second program such that the threshold region becomes any threshold region of four twenty-fourth threshold regions among the first to sixteenth threshold regions in the case where the nonvolatile memory executes the second program such that the twentieth threshold region becomes any threshold region of the first to sixteenth threshold regions, all of the four twenty-third threshold region and the four twenty-fourth threshold region have a higher voltage level than any threshold region of the four twenty-first threshold regions and the four twenty-second threshold regions, and a threshold region having a highest voltage level among the four twenty-first threshold regions has a higher voltage level than a threshold region having a lowest voltage level among the four twenty-second threshold regions, and all of the four twenty-fourth threshold regions have a higher voltage level than any threshold region of the four twenty-third threshold regions, or a threshold region having a highest voltage level among the four twenty-third threshold regions has a higher voltage level than a threshold region having a lowest voltage level among the four twenty-fourth threshold regions, and all of the four twenty-second threshold regions have a higher voltage level than any threshold region of the four twenty-first threshold regions.

4. The memory system according to claim 3, wherein a threshold region having a lowest voltage level among the four twenty-second threshold regions has a higher voltage level than a threshold region having a lowest voltage level among the four twenty-first threshold regions, a threshold region having a highest voltage level among the four twenty-second threshold regions has a higher voltage level than a threshold region having a highest voltage level among the four twenty-first threshold regions, a threshold region having a lowest voltage level among the four twenty-fourth threshold regions has a higher voltage level than a threshold region having a lowest voltage level among the four twenty-third threshold regions, and a threshold region having a highest voltage level among the four twenty-fourth threshold regions has a higher voltage level than a threshold region having a highest voltage level among the four twenty-third threshold regions.

5. The memory system according to claim 3, wherein the eighteenth threshold region has a lower voltage level than a boundary between two threshold regions having different values of the first bit among the first to sixteenth threshold regions at end of the second program, and the twentieth threshold region has a greater voltage level than the boundary.

6. The memory system according to claim 1, wherein the plurality of memory cells in the nonvolatile memory comprise a plurality of first memory cells connected to a first word line and a plurality of second memory cells connected to a second word line adjacent to the first word line, and the controller is configured to perform the first program on the plurality of second memory cells after performing the first program on the plurality of first memory cells, and perform the second program on the plurality of first memory cells after performing the first program on the plurality of second memory cells.

7. The memory system according to claim 1, wherein the nonvolatile memory comprises a control unit that is configured to read data programmed by the first program and determine a threshold voltage in the second program based on the read data.

8. The memory system according to claim 1, wherein the nonvolatile memory comprises the control unit that is configured to read the first bit data and the second bit data programmed by the first program in response to an execution request of the second program from the controller, and perform the second program based on the read data and data of the third bit and fourth bit.

9. A memory system comprising:

a nonvolatile memory including a plurality of memory cells capable of storing 4-bit data of first to fourth bits by sixteen threshold regions including a first threshold region indicating an erased state for erasing data and second to sixteenth threshold regions having higher voltage levels than a voltage level of the first threshold region and indicating a written state for writing data; and a controller configured to send a first command to the nonvolatile memory to execute a first program for writing data of the first bit and the second bit and then send a second command to the nonvolatile memory to execute a second program for writing data of the third bit and the fourth bit, wherein the n-th threshold region has a higher voltage level than the (n−1)-th threshold region (n is a natural number of two or more and sixteen or less), and among fifteen boundaries existing between adjacent threshold regions among the first to sixteenth threshold regions, the number of first boundaries used for determining a value of the data of the first bit, the number of second boundaries used for determining a value of the data of the second bit, the number of third boundaries used for determining a value of the data of the third bit, and the number of fourth boundaries used for determining a value of the data of the fourth bit are 2, 3, 5, 5 or 3, 2, 5, 5 in order.

10. The memory system according to claim 9, wherein the controller is configured to send the first command to the nonvolatile memory to execute the first program such that the threshold region in the memory cell is any threshold region of a seventeenth threshold region indicating an erased state for erasing data and eighteenth to twentieth threshold regions having higher voltage levels than a voltage level of the seventeenth threshold region and indicating a written state for writing data according to the data of the first bit and the second bit, the n-th threshold region has a higher voltage level than the (n−1)-th threshold region (n is a natural number of two or more and sixteen or less), the k-th threshold region has a higher voltage level than the (k−1)-th threshold region (k is a natural number of eighteen or more and twenty or less), the controller is configured to send the second command to the nonvolatile memory to execute the second program such that the threshold region in the memory cell is any threshold region of four threshold regions among the first to sixteenth threshold regions from any threshold region of the seventeenth to twentieth threshold regions according to the data of the third bit and the fourth bit, and the number of threshold regions between a threshold region having a lowest voltage level and a threshold region having a highest voltage level among the four threshold regions is four or less.

11. A memory system comprising:

a nonvolatile memory including a plurality of memory cells capable of storing 4-bit data of first to fourth bits by sixteen threshold regions including a first threshold region indicating an erased state for erasing data and second to sixteenth threshold regions having higher voltage levels than a voltage level of the first threshold region and indicating a written state for writing data; and a controller configured to send a first command to the nonvolatile memory to execute a first program for writing data of the first bit and the second bit and then send a second command to the nonvolatile memory to execute a second program for writing data of the third bit and the fourth bit, wherein the n-th threshold region has a higher voltage level than the (n−1)-th threshold region (n is a natural number of two or more and sixteen or less), and among fifteen boundaries existing between adjacent threshold regions among the first to sixteenth threshold regions, the number of first boundaries used for determining a value of the data of the first bit, the number of second boundaries used for determining a value of the data of the second bit, the number of third boundaries used for determining a value of the data of the third bit, and the number of fourth boundaries used for determining a value of the data of the fourth bit are 4, 3, 4, 4 or 3, 4, 4, 4 or 4, 4, 3, 4 or 4, 4, 4, 3 in order.

12. The memory system according to claim 11, wherein the controller is configured to send the first command to the nonvolatile memory to execute the first program such that the threshold region in the memory cell is any threshold region of a seventeenth threshold region indicating an erased state for erasing data and eighteenth to twentieth threshold regions having higher voltage levels than a voltage level of the seventeenth threshold region and indicating a written state for writing data according to the data of the first bit and the second bit, the controller is configured to second the second command to the nonvolatile memory to execute the second program such that the threshold region in the memory cell is any threshold region of four threshold regions among the first to sixteenth threshold regions from any threshold region of the seventeenth to twentieth threshold regions according to the data of the third bit and the fourth bit, and the number of threshold regions between a threshold region having a lowest voltage level and a threshold region having a highest voltage level among the four threshold regions is six or less.

13. The memory system according to claim 11, wherein a value of one bit of the first to fourth bits is inverted between adjacent threshold regions of the first to sixteenth threshold regions, and the first bit, the second bit, the third bit, and the fourth bit are different bits among a least significant bit, a second least significant bit, a second most significant bit, and a most significant bit.

14. The memory system according to claim 1, wherein the nonvolatile memory comprises at least a first word line and a second word line to which two or more of the memory cells are each connected, and the controller is configured to instruct the nonvolatile memory to execute continuous execution of the first program for the memory cell connected to the first word line and the second program for the memory cell connected to the second word line by inputting continuous commands and data.

* * * * *